United States Patent
Hummert et al.

(10) Patent No.: US 11,711,934 B2
(45) Date of Patent: *Jul. 25, 2023

(54) METAL AMIDES FOR USE AS HIL FOR AN ORGANIC LIGHT-EMITTING DIODE (OLED)

(71) Applicant: Novaled GmbH, Dresden (DE)

(72) Inventors: Markus Hummert, Dresden (DE); Thomas Rosenow, Dresden (DE)

(73) Assignee: Novaled GmbH, Dresden (DE)

( * ) Notice: Subject to any disclaimer, the term of this patent is extended or adjusted under 35 U.S.C. 154(b) by 137 days.

This patent is subject to a terminal disclaimer.

(21) Appl. No.: 17/360,637

(22) Filed: Jun. 28, 2021

(65) Prior Publication Data

US 2022/0407029 A1 Dec. 22, 2022

Related U.S. Application Data

(62) Division of application No. 15/752,696, filed as application No. PCT/EP2016/069638 on Aug. 18, 2016, now Pat. No. 11,075,352.

(30) Foreign Application Priority Data

Aug. 18, 2015 (EP) .................... 15181385

(51) Int. Cl.
*H10K 50/17* (2023.01)
*H10K 50/15* (2023.01)
(Continued)

(52) U.S. Cl.
CPC ........... *H10K 50/17* (2023.02); *H10K 50/157* (2023.02); *H10K 50/167* (2023.02);
(Continued)

(58) Field of Classification Search
CPC ............ H01L 51/5088; H01L 51/0084; H01L 51/5068; H01L 51/5084; H01L 51/005;
(Continued)

(56) References Cited

U.S. PATENT DOCUMENTS 6,878,469 B2 4/2005 Yoon et al.
7,972,541 B2 7/2011 Werner et al.
(Continued)

FOREIGN PATENT DOCUMENTS

CN 101118951 A 2/2008
EP 1209708 A1 5/2002
(Continued)

OTHER PUBLICATIONS

Kim, Y., Han, K., & Ha, C. S. (2002). Synthesis and Characteristics of Poly [N, N'-diphenyl-N, N'-bis (4-aminobiphenyl)-(1, 1'-biphenyl)-4, 4'-diamine pyromellitimide] as a Hole Injecting and Transporting Layer for Hybrid Organic Light-Emitting Device. Macromolecules, 35(23), 8759-8767. (Year: 2002).*

(Continued)

*Primary Examiner* — Dawn L Garrett

(74) *Attorney, Agent, or Firm* — Eversheds Sutherland (US) LLP

(57) ABSTRACT

The present invention relates to metal amides of general Formula Ia and for their use as hole injection layer (HIL) for an Organic light-emitting diode (OLED), and a method of manufacturing Organic light-emitting diode (OLED) comprising an hole injection layer containing a metal amide of general Formula Ia:

(Continued)

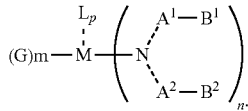

(Ia)

20 Claims, 6 Drawing Sheets

(51) Int. Cl.
*H10K 50/16* (2023.01)
*H10K 85/30* (2023.01)
*H10K 85/60* (2023.01)

(52) U.S. Cl.
CPC ........... *H10K 85/341* (2023.02); *H10K 50/15* (2023.02); *H10K 85/311* (2023.02); *H10K 85/321* (2023.02); *H10K 85/331* (2023.02); *H10K 85/371* (2023.02); *H10K 85/60* (2023.02); *H10K 85/621* (2023.02); *H10K 85/631* (2023.02); *H10K 85/633* (2023.02)

(58) Field of Classification Search
CPC ............. H01L 51/0053; H01L 51/0059; H01L 51/006; H01L 51/0078; H01L 51/0079; H01L 51/0083; H01L 51/0091; H01L 51/5056; H01L 51/0061; H01L 51/0092
See application file for complete search history.

(56) References Cited

U.S. PATENT DOCUMENTS

| | | |
|---|---|---|
| 8,394,511 B2 | 3/2013 | Hwang et al. |
| 9,040,175 B2 | 5/2015 | Fadhel et al. |
| 9,559,321 B2 | 1/2017 | Burschka et al. |
| 9,722,183 B2 | 8/2017 | Fadhel et al. |
| 9,954,182 B2 | 4/2018 | Zoellner |
| 10,026,902 B2 | 7/2018 | Roth et al. |
| 10,998,518 B2* | 5/2021 | Hummert ............ H01L 51/5068 |
| 11,075,352 B2* | 7/2021 | Hummert ............ H01L 51/5088 |
| 2004/0124766 A1 | 7/2004 | Nakagawa |
| 2009/0211640 A1 | 8/2009 | Lee |
| 2013/0240858 A1* | 9/2013 | Nishimura .......... H01L 27/3211 257/40 |
| 2013/0330632 A1 | 12/2013 | Burschka et al. |
| 2014/0048792 A1 | 2/2014 | Chun et al. |
| 2018/0240996 A1 | 8/2018 | Hummert et al. |

FOREIGN PATENT DOCUMENTS

| | | |
|---|---|---|
| JP | 2002063989 B | 2/2002 |
| JP | 2002-246179 A | 8/2002 |
| JP | 4507420 B2 | 5/2010 |
| JP | 2015-143797 A | 8/2015 |
| WO | 2017029370 A1 | 2/2017 |

OTHER PUBLICATIONS

European Search Report of European Application No. 15181385 dated Feb. 19, 2016.
Kathirgamanathan, Poopathy et al., "Electron Transporters Based on Lithium Complexes: Transition from Electron Injecting to Electron Transporting Characteristics," Digest of Technical Papers—Society for Information Display International Symposium, vol. 41, 2010, pp. 465-468.
Shirota, Yasuhiko, et al., "Charge Carrier Transporting Molecular Materials and Their Applications in Devices," Chem. Rev. 2007, 107, 953-1010.
Facchetti, Antonio, "Semiconductors for Organic Transistors," Materials Today, Mar. 2007, vol. 10, No. 3.
Machine translation for JP 2015-143797 A (publication date: Aug. 2015). (Year: 2015).
International Preliminary Report on Patentability for PCT/EP2016/069638, dated Mar. 1, 2018 (10 pages).
PCT International Search Report and Written Opinion for PCT Application No. PCT/EP2016/069638 dated Nov. 3, 2016 (9 pages).
PCT International Search Report and Written Opinion for PCT Application No. PCT/EP2016/069631 dated Nov. 21, 2016 (11 pages).
Abate et al., "Lithium Salts as 'Redox Active' P-Type Dopants for Organic Semiconductors and Their Impact in Solid-State Dye-Sensitized Solar Cells," Phys. Chem. Chem. Phys., 2013, 15:2572-2579.

* cited by examiner

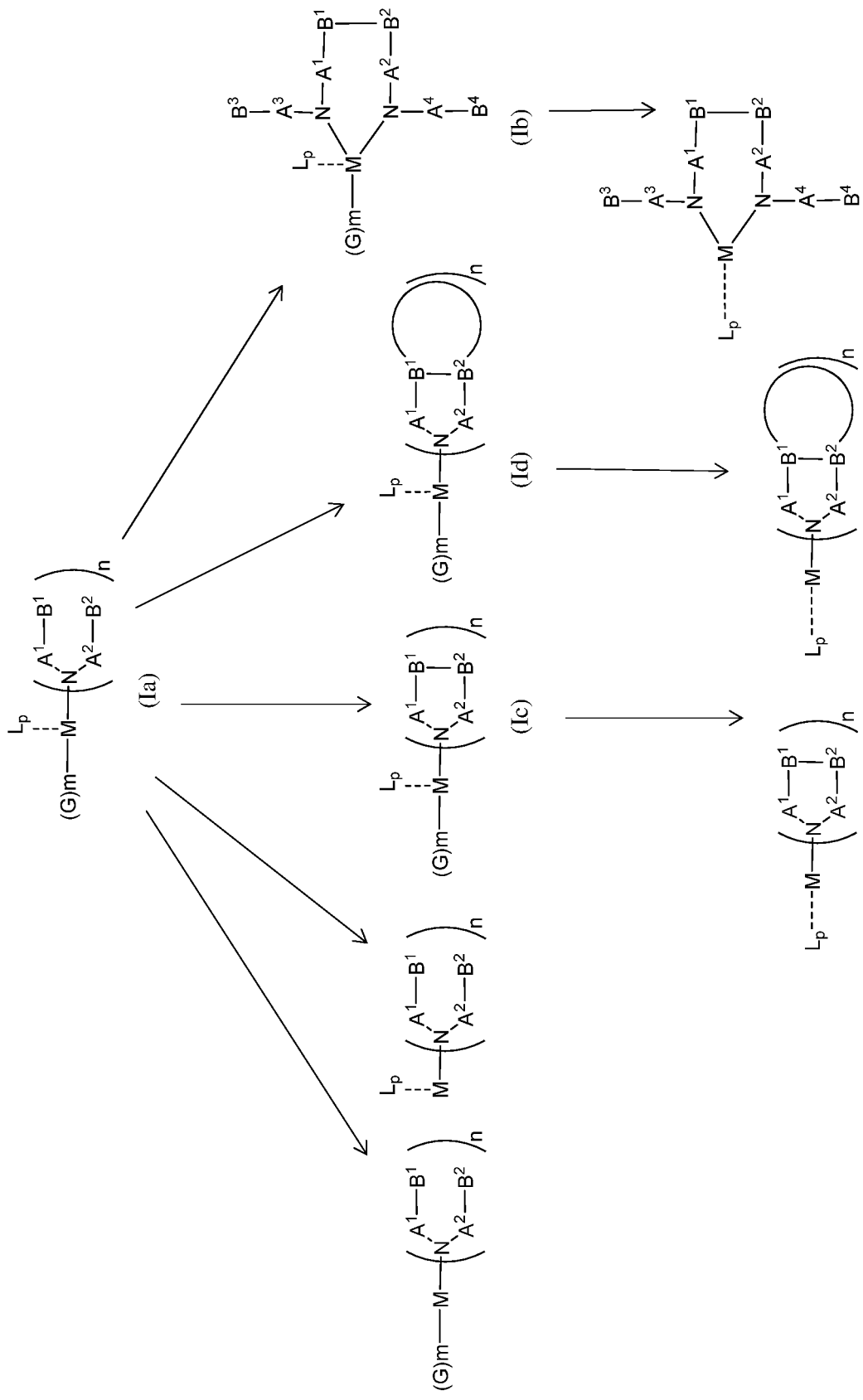
Figure 4 – Metal amides based on general Formula Ia that can be used according to the invention

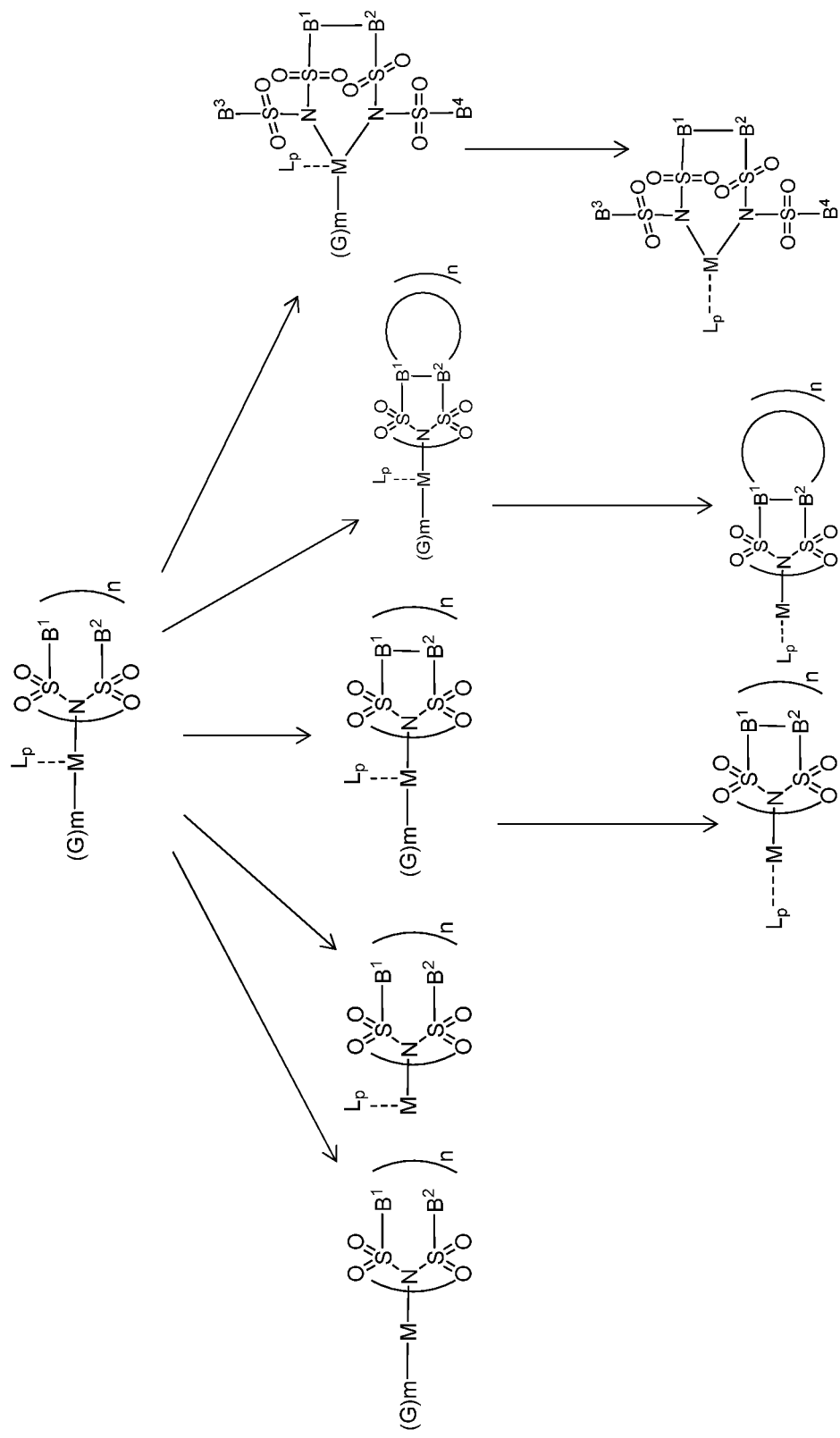
Figure 5 - Metal amides that can be used according to the invention with specific $A^1$ and $A^2$, wherein $A^1$ and $A^2$ are $SO_2$

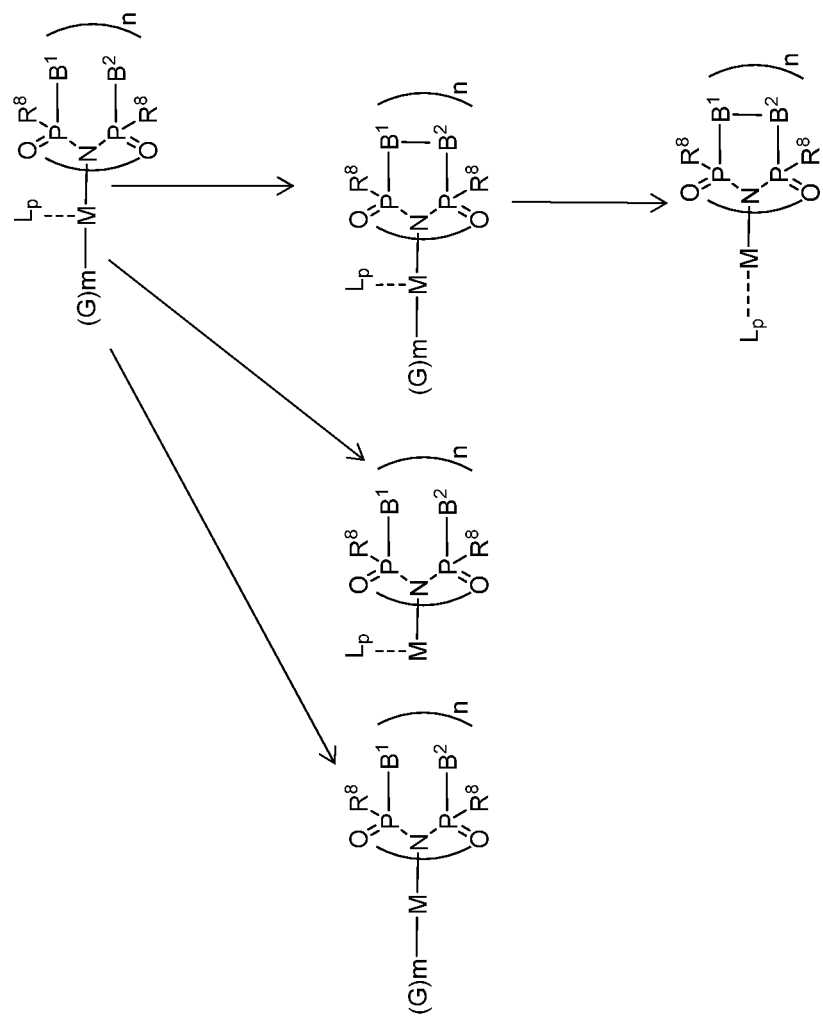
Figure 6 - Metal amides that can be used according to the invention with specific $A^1$ and $A^2$, wherein $A^1$ and $A^2$ are $POR^8$

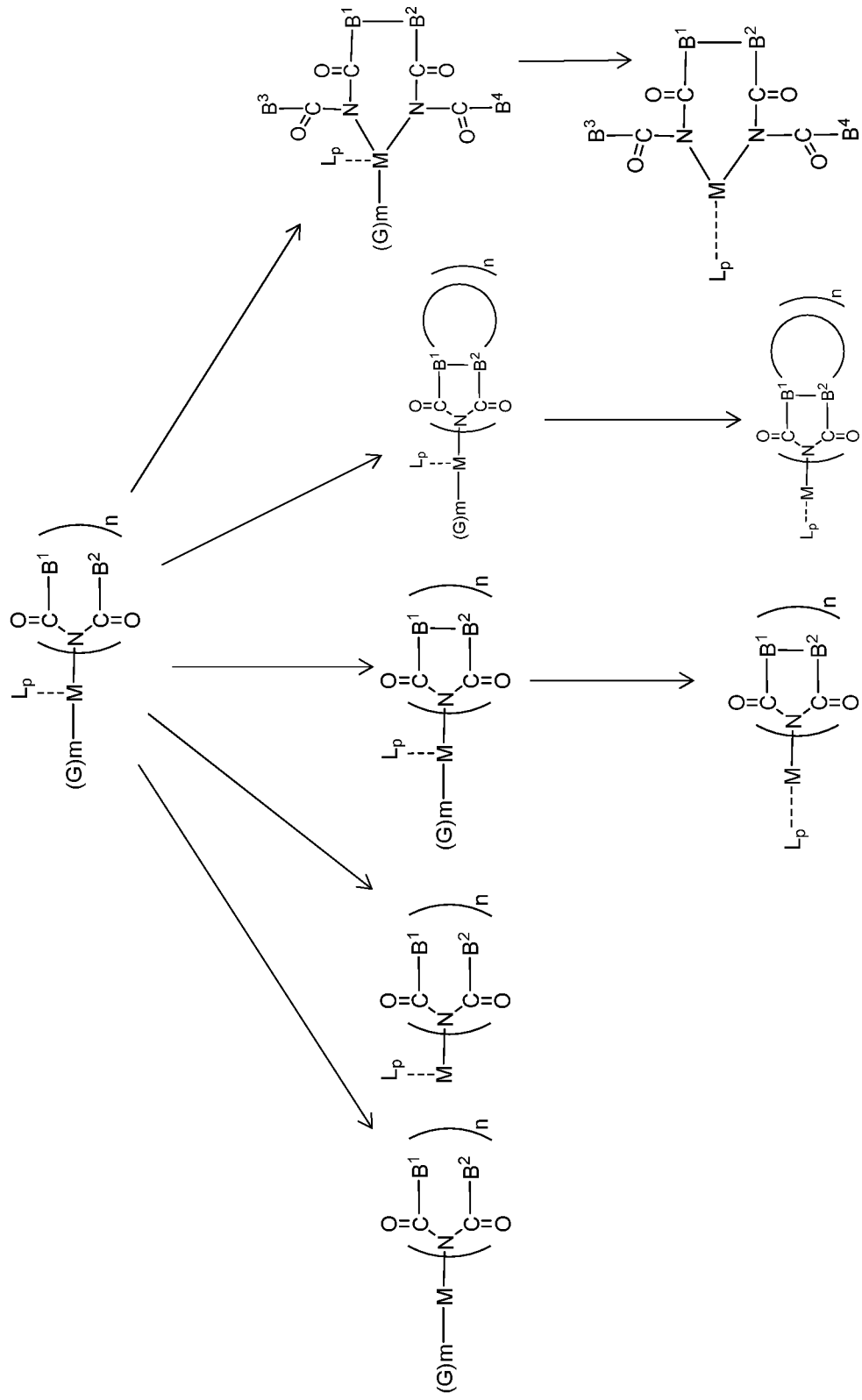
Figure 7 - Metal amides that can be used according to the invention with specific $A^1$ and $A^2$, wherein $A^1$ and $A^2$ are CO

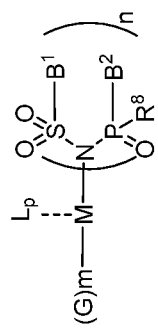
Figure 8 - Metal amides that can be used according to the invention with specific $A^1$ and $A^2$, wherein $A^1$ and $A^2$ are selected different, wherein $A^1$ is $SO_2$ and $A^2$ is $POR^8$

METAL AMIDES FOR USE AS HIL FOR AN ORGANIC LIGHT-EMITTING DIODE (OLED)

CROSS REFERENCE TO RELATED APPLICATIONS

This application is a divisional of U.S. application Ser. No. 15/752,696, filed Feb. 14, 2018, which claims priority to PCT Publication No. PCT/EP2016/069638, filed Aug. 18, 2016, which claims priority to European Application No. 15181385.4, filed Aug. 18, 2015. The content of these applications are hereby incorporated by reference.

DESCRIPTION

The present invention relates to metal amides for use as hole injection layer (HIL) for an Organic light-emitting diode (OLED), and a method of manufacturing Organic light-emitting diode (OLED) comprising the metal amide containing HIL.

DESCRIPTION OF THE RELATED ART

Organic solar cell as disclosed in EP 1 209 708 A1 having the general structure:
substrate+EM/HTM/dye/SOL/EM, or
substrate+EM/SOL/dye/HTM/EM, or
substrate+EM/HTM/SOL/EM,
in which EM is the electrode material that may be a transparent conductive oxide (TCO) or metal, with at least one of the EM layer(s) of the cell being a TCO, HTM is the hole transport material, SOL is a semiconducting oxide layer, "dye" is a suitable dye, and the SOL layer is vapor deposited.

US 2013/0330632 A1 refers to electrochemical devices comprising complexes of cobalt comprising at least one ligand with a 5- or six membered, N-containing heteroring. The complex are useful as p- and n-dopants, as over of electrochemical devices, in particular in organic semiconductors. The complexes are further useful as over-discharge prevention and overvoltage protection agents.

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole injection layer (HIL), a hole transport layer (HTL), an emission layer (EML), an electron transport layer (ETL), and a cathode, which are sequentially stacked on a substrate. In this regard, the HIL, the HTL, the EML, and the ETL are thin films formed from organic compounds.

When a voltage is applied to the anode and the cathode, holes injected from the anode move to the EML, via the HIL and HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency and/or a long lifetime.

Dipyrazino[2,3-f:2',3'-h]quinoxaline-2,3,6,7,10,11-hexacarbonitrile (CNHAT (CAS 105598-27-4)) having the Formula A, which is typically used as hole injection layer has several drawbacks.

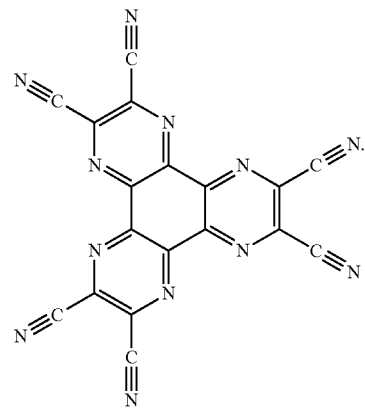

A

For example, if the HOMO level of the hole transport layer of an OLED comprising a CNHAT HIL-layer is further away from the vacuum level, the voltage of the OLED is too high. Further, effective hole injection even into very deep HOMO HTLs, that means the HOMO is further away from vacuum level, is not sufficiently achieved.

Efficient hole injection into very deep HOMO levels enables the use of high efficiency emission layers, in particular phosphorescent blue and green emitters and emission which relies on TADF (thermally activated delayed fluorescence).

Thus, it is still desired to provide a hole injection layer material that more effectively promotes the hole injection over a broader range of HOMO levels to vacuum level from the HIL-layer into the hole transport layer (HTL).

SUMMARY

Aspects of the present invention provide a method of reducing the drive voltage and improving the voltage stability over time, especially for blue emitting OLEDs, and/or the external quantum efficiency EQE, for top and/or bottom emission organic light-emitting diodes (OLED). The invention relates to a hole injection layer (HIL) for use for an Organic light-emitting diode (OLED). The invention relates further to an organic light-emitting diode (OLED) comprising an anode, a hole injection layer (HIL), a hole transport layer (HTL), an emission layer (EML), optional a hole blocking layer (HBL), optional an electron transport layer (ETL), optional an electron injection layer (EIL), and a cathode as well as a method of manufacturing the same.

According to an aspect of the present invention, there is provided a hole injection layer for an OLED comprising a charge neutral metal amide compound, wherein the charge neutral metal amide compound has the Formula Ia:

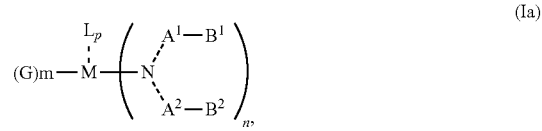

(Ia)

wherein:
G=halide, O, alkoxylate or amine of Formula IIa to IIe:

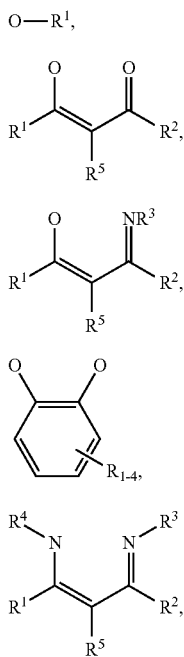

(IIa)

O—$R^1$, (IIb)

(IIc)

(IId)

(IIe)

$R^1$ to $R^5$ are independently selected from the group consisting of H, $C_1$ to $C_{20}$ alkyl, $C_1$ to $C_{20}$ heteroalkyl, unsubstituted or $C_1$ to $C_{12}$ substituted $C_6$ to $C_{20}$ aryl, unsubstituted or $C_1$ to $C_{12}$ substituted heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, and halogenated or perhalogenated heteroaryl with 5 to 20 ring-forming atoms; or at least one $R^1$ and $R^4$ and/or $R^2$ and $R^3$ and/or $R^1$ and $R^5$ are bridged and form a 5 to 20 member ring;
m=0, 1, 2, 3 or 4;
M=a metal selected from the group consisting of alkali metal, alkaline earth metal, Al, Ga, In, transition metal, and rare earth metal;
L=charge neutral ligand which coordinates to the metal M, selected from the group consisting of $H_2O$, $C_2$ to $C_{40}$ mono- or multi-dentate ethers and $C_2$ to $C_{40}$ thioethers, $C_2$ to $C_{40}$ amines, $C_2$ to $C_{40}$ phosphine, $C_2$ to $C_{20}$ alkyl nitrile or $C_2$ to $C_{40}$ aryl nitrile, and a compound according to Formula (III);

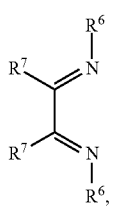

(III)

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline;
p=0, 1, 2 or 3;
$A^1$, $A^2$, $A^3$ and $A^4$ are independently selected from CO, $SO_2$ or $POR^8$;
$R^8$=electron withdrawing group selected from the group consisting of halide, nitrile, halogenated or perhalogenated $C_1$ to $C_{20}$ alkyl, halogenated or perhalogenated $C_6$ to $C_{20}$ aryl, and halogenated or perhalogenated heteroaryl with 5 to 20 ring-forming atoms;
n=1, 2, 3, 4 or 5;
$B^1$, $B^2$, $B^3$ and $B^4$ are same or independently selected from substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, substituted or unsubstituted $C_5$ to $C_{20}$ heteroaryl, or $B^1$ and $B^2$ are bridged;
wherein $B^1$ and $B^2$ are bridged, then:
M, N, $A^1$, $B^1$, $B^2$, $A^2$ and N form a 7 to 10 member ring according to Formula Ib;

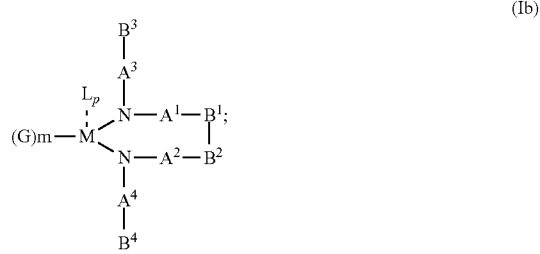

(Ib)

or
N, $A^1$, $B^1$, $B^2$ and $A^2$ form a 5 to 10 member ring according to Formula Ic,

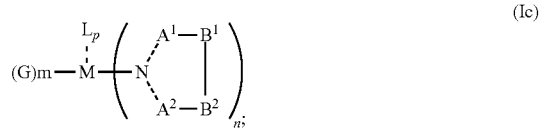

(Ic)

or
N, $A^1$, $B^1$, $B^2$ and $A^2$ form a first 5 to 10 member ring and $B^1$ and $B^2$ form a second 5 to 20 member ring according to Formula Id:

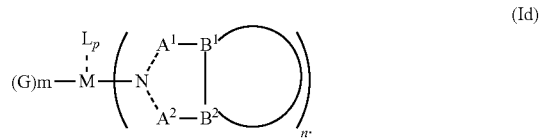

(Id)

According to another aspect of the present invention, there is provided a hole injection layer for an OLED comprising a charge neutral metal amide compound, wherein the charge neutral metal amide compound has the Formula Ia:

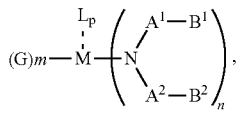

wherein:

G=halide, O, alkoxylate or amine of Formula IIa to IIe:

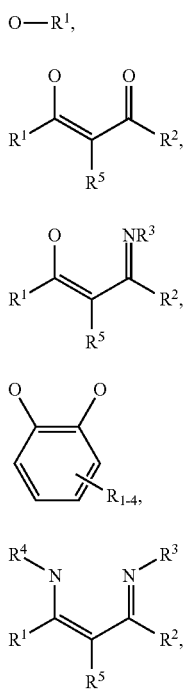

$R^1$ to $R^5$ are independently selected from the group consisting of H, $C_1$ to $C_{20}$ alkyl, $C_1$ to $C_{20}$ heteroalkyl, unsubstituted or $C_1$ to $C_{12}$ substituted $C_6$ to $C_{20}$ aryl, unsubstituted or $C_1$ to $C_{12}$ substituted heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, and halogenated or perhalogenated heteroaryl with 5 to 20 ring-forming atoms; or at least one $R^1$ and $R^4$ and/or $R^2$ and $R^3$ and/or $R^1$ and $R^5$ are bridged and form a 5 to 20 member ring;

m=0, 1, 2, 3 or 4;

M=a metal selected from the group consisting of alkali metal, alkaline earth metal, Al, Ga, In, transition metal and rare earth metal;

L=charge neutral ligand which coordinates to the metal M, selected from the group consisting of $H_2O$, $C_2$ to $C_{40}$ mono- or multi-dentate ethers and $C_2$ to $C_{40}$ thioethers, $C_2$ to $C_{40}$ amines, $C_2$ to $C_{40}$ phosphine, $C_2$ to $C_{20}$ alkyl nitrile or $C_2$ to $C_{40}$ aryl nitrile, and a compound according to Formula (III);

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline;

p=0, 1, 2 or 3;

$A^1$, $A^2$, $A^3$ and $A^4$ are independently selected from CO, $SO_2$ or $POR^8$;

$R^8$=electron withdrawing group selected from the group consisting of halide, nitrile, halogenated or perhalogenated $C_1$ to $C_{20}$ alkyl, halogenated or perhalogenated $C_6$ to $C_{20}$ aryl, and halogenated or perhalogenated heteroaryl with 5 to 20 ring-forming atoms;

n=1, 2, 3, 4 or 5;

$B^1$, $B^2$, $B^3$ and $B^4$ are same or independently selected from substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, substituted or unsubstituted $C_5$ to $C_{20}$ heteroaryl, or $B^1$ and $B^2$ are bridged;

wherein $B^1$ and $B^2$ are bridged, then:

M, N, $A^1$, $B^1$, $B^2$, $A^2$ and N form a 7 to 10 member ring according to Formula Ib;

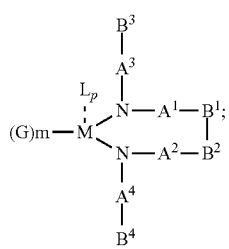

or

N, $A^1$, $B^1$, $B^2$ and $A^2$ form a 5 to 10 member ring according to Formula Ic,

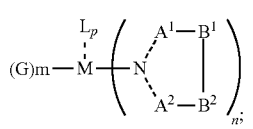

or

N, $A^1$, $B^1$, $B^2$ and $A^2$ form a first 5 to 10 member ring and $B^1$ and $B^2$ form a second 5 to 20 member ring according to Formula Id:

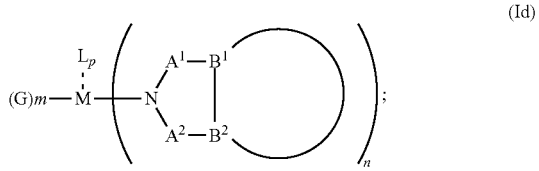

wherein the hole injection layer contains the charge neutral metal amide compound in the range of about ≥50 wt.-% to about ≤100 wt.-%, preferably about ≥60 wt.-% to about ≤100 wt.-%, further preferred about ≥70 wt.-% to about ≤100 wt.-%, in addition preferred about ≥80 wt.-% to about ≤100 wt.-%, or about ≥95 wt.-% to about ≤100 wt.-%, or about ≥98 wt.-% to about ≤100 wt.-%.

According to another aspect of the present invention, there is provided a hole injection layer for an OLED comprising a charge neutral metal amide compound according to Formula Ia, wherein the hole injection layer contains the charge neutral metal amide compound in the range of about ≥95 wt.-% to about ≤100 wt.-%.

According to another aspect of the present invention, there is provided a hole injection layer for an OLED comprising a charge neutral metal amide compound according to Formula Ia, wherein the hole injection layer contains the charge neutral metal amide compound in the range of about ≥98 wt.-% to about ≤100 wt.-%.

According to another aspect of the present invention, there is provided a hole injection layer for an OLED comprising a charge neutral metal amide compound according to Formula Ib, Ic and/or Ic, wherein the hole injection layer contains the charge neutral metal amide compound in the range of about ≥98 wt.-% to about ≤100 wt.-%.

According to another aspect of the present invention, there is provided a hole injection layer for an OLED comprising at least one charge neutral metal amide compound according to Formula C1 to C25, D1 to D24 and/or F1 to F46, wherein the hole injection layer contains the charge neutral metal amide compound in the range of about ≥50 wt.-% to about ≤100 wt.-%, preferably about ≥60 wt.-% to about ≤100 wt.-%, further preferred about ≥70 wt.-% to about ≤100 wt.-%, in addition preferred about ≥80 wt.-% to about ≤100 wt.-%, or about ≥95 wt.-% to about ≤100 wt.-%, or about ≥98 wt.-% to about ≤100 wt.-%.

According to another aspect of the present invention, there is provided a hole injection layer for an OLED comprising at least one charge neutral metal amide compound according to Formula C1, wherein the hole injection layer contains the charge neutral metal amide compound in the range of about ≥50 wt.-% to about ≤100 wt.-%, preferably about ≥60 wt.-% to about ≤100 wt.-%, further preferred about ≥70 wt.-% to about ≤100 wt.-%, in addition preferred about ≥80 wt.-% to about ≤100 wt.-%, or about ≥95 wt.-% to about ≤100 wt.-%, or about ≥98 wt.-% to about ≤100 wt.-%.

It has been surprisingly found that a metal amide layer (HIL) inserted between the anode and the hole transport layer effectively promotes hole injection into the hole transport layer. For example, if the HOMO level of the hole transport layer is further away from vacuum level, the performance of metal amides is superior to CNHAT, in particular the voltage. Furthermore, effective hole injection even into very deep HOMO HTLs (HOMO further away from vacuum level) can be achieved. This cannot be achieved with prior art materials, such as CNHAT, which is typically used as a HIL material. Efficient hole injection into very deep HOMO levels enables the use of high efficiency emission layers, in particular phosphorescent blue and green emitters and emission which relies on TADF (thermally activated delayed fluorescence).

The organic light-emitting diode (OLED) can be a bottom emission OLED or a top emission OLED.

For the following defined terms, these definitions shall be applied, unless a different definition is given in the claims or elsewhere in this specification.

The bond between N and the metal M, as indicated for example in Formula 1a, 1b, 1c, and 1d, can be a covalent bond or N forms a non-covalent interaction to the metal M. Without being bond to a specific theory it is assumed by the inventors that this kind of compounds may form a covalent bond between N and M or N forms a non-covalent interaction to the metal M, as can be seen from the example below:

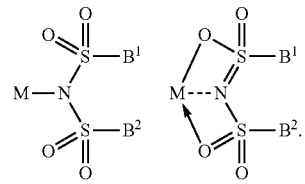

The dotted line and/or an arrow symbolizes a non-covalent interaction. A non-covalent interaction differs from a covalent bond in that it does not involve the sharing of electrons, but rather involves more dispersed variations of electromagnetic interactions between molecules or within a molecule. Non-covalent interactions can be generally classified into four categories, electrostatic, π-effects, van der Waals forces, and hydrophobic effects.

The voltage, also named U, is measured in Volt (V) at 10 milliAmpere per square centimeter ($mA/cm^2$) in bottom emission devices and at 15 $mA/cm^2$ in top emission devices.

The voltage stability over time U(50 h)-U(0 h) is measured in Volt (V) at 15 $mA/cm^2$. To calculate the voltage stability over time, the voltage at the start of the stability test (U(0 h)) is subtracted from the voltage after 50 hours (h) (U(50 h)). The smaller the value U(50 h)-U(0 h) is the better is the voltage stability over time.

The external quantum efficiency, also named EQE, is measured in percent (%). The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The term "OLED" and "organic light-emitting diode" is simultaneously used and having the same meaning.

The term "transition metal" means and includes any element in the d-block of the periodic table, which includes groups 3 to 12 elements on the periodic table.

As used herein, "weight percent", "wt.-%", "percent by weight", "% by weight", and variations thereof refer to a composition, component, substance or agent as the weight of that composition, component, substance or agent of the respective electron transport layer divided by the total weight of the composition thereof and multiplied by 100. It is understood that the total weight percent amount of all components, substances or agents of the respective electron transport layer are selected such that it does not exceed 100 wt.-%.

All numeric values are herein assumed to be modified by the term "about", whether or not explicitly indicated. As used herein, the term "about" refers to variation in the numerical quantity that can occur. Whether or not, modified by the term "about", the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

The term "alkyl" refers to straight-chain or branched alkyl groups.

The term "1 to 20 carbon atoms" as used herein refers to straight-chain or branched alkyl groups having 1 to 20 carbon atoms. The alkyl groups can be selected from the group comprising methyl, ethyl and the isomers of propyl, butyl or pentyl, such as isopropyl, isobutyl, tert.-butyl, sec.-butyl and/or isopentyl. The term "aryl" refers to aromatic groups for example phenyl or naphthyl.

Herein, when a first element is referred to as being formed or disposed "on" a second element, the first element can be disposed directly on the second element or one or more other elements may be disposed there between. When a first element is referred to as being formed or disposed "directly on" a second element, no other elements are disposed there between.

According to another aspect, there is provided a hole injection layer for an OLED comprising a charge neutral metal amide compound, wherein the charge neutral metal amide compound has the Formula Ia:

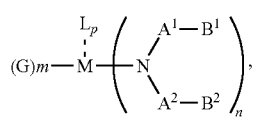
(Ia)

wherein:
G=halide, O, alkoxylate or amine of Formula IIa to IIe:

O—R$^1$,
(IIa)

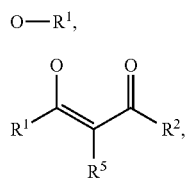
(IIb)

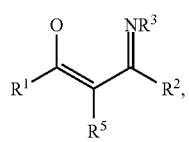
(IIc)

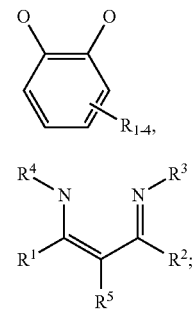
(IId)

(IIe)

$R^1$ to $R^5$ are independently selected from the group comprising H, $C_1$ to $C_{20}$ alkyl, $C_1$ to $C_{20}$ heteroalkyl, unsubstituted or $C_1$ to $C_{12}$ substituted $C_6$ to $C_{20}$ aryl, unsubstituted or $C_1$ to $C_{12}$ substituted heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms; or at least one $R^1$ and $R^4$ and/or $R^2$ and $R^3$ and/or $R^1$ and $R^5$ are bridged and form a 5 to 20 member ring;

m=0, 1, 2, 3 or 4;

M=a metal selected from the group comprising alkali metal, alkaline earth metal, Al, Ga, In, transition metal or rare earth metal;
  wherein the bond between N and the metal M is a covalent bond or N forms a non-covalent interaction to the metal M;

L=charge neutral ligand which coordinates to the metal M, selected from the group comprising $H_2O$, $C_2$ to $C_{40}$ mono- or multi-dentate ethers and $C_2$ to $C_{40}$ thioethers, $C_2$ to $C_{40}$ amines, $C_2$ to $C_{40}$ phosphine, $C_2$ to $C_{20}$ alkyl nitrile or $C_2$ to $C_{40}$ aryl nitrile, or a compound according to Formula (III);

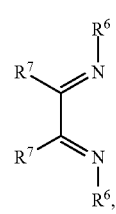
(III)

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline;

p=0, 1, 2 or 3;

$A^1$, $A^2$, $A^3$ and $A^4$ are independently selected from CO, $SO_2$ or $POR^8$;

R[8]=electron withdrawing group selected from the group comprising halide, nitrile, halogenated or perhalogenated $C_1$ to $C_{20}$ alkyl, halogenated or perhalogenated $C_6$ to $C_{20}$ aryl, or halogenated or perhalogenated heteroaryl with 5 to 20 ring-forming atoms;

n=1, 2, 3, 4 or 5;

$B^1$, $B^2$, $B^3$ and $B^4$ are same or independently selected from substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, substituted or unsubstituted $C_5$ to $C_{20}$ heteroaryl.

According to another aspect there is provided a hole injection layer for an OLED comprising a charge neutral metal amide compound, wherein the charge neutral metal amide compound has the Formula Ib, Ic or Id:

wherein:

$B^1$ and $B^2$ are bridged;

$B^3$ and $B^4$ are same or independently selected from substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, substituted or unsubstituted $C_5$ to $C_{20}$ heteroaryl;

M, N, $A^1$, $B^1$, $B^2$, $A^2$ and N form a 7 to 10 member ring according to Formula Ib;

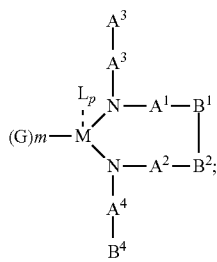
(Ib)

or

N, $A^1$, $B^1$, $B^2$ and $A^2$ form a 5 to 10 member ring according to Formula Ic,

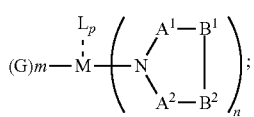
(Ic)

or

N, $A^1$, $B^1$, $B^2$ and $A^2$ form a first 5 to 10 member ring and $B^1$ and $B^2$ form a second 5 to 20 member ring according to Formula Id:

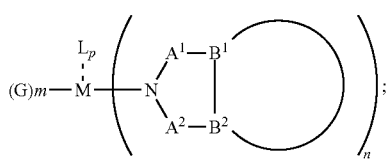
(Id)

wherein:

G=halide, O, alkoxylate or amine of Formula IIa to IIe:

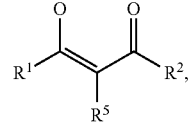
(IIa)

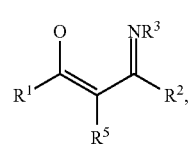
(IIb)

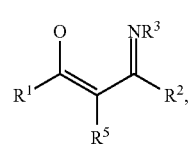
(IIc)

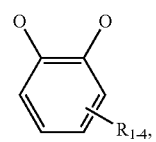
(IId)

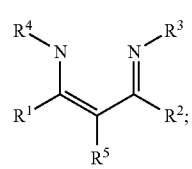
(IIe)

$R^1$ to $R^5$ are independently selected from the group comprising H, $C_1$ to $C_{20}$ alkyl, $C_1$ to $C_{20}$ heteroalkyl, unsubstituted or $C_1$ to $C_{12}$ substituted $C_6$ to $C_{20}$ aryl, unsubstituted or $C_1$ to $C_{12}$ substituted heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms; or at least one $R^1$ and $R^4$ and/or $R^2$ and $R^3$ and/or $R^1$ and $R^5$ are bridged and form a 5 to 20 member ring;

m=0, 1, 2, 3 or 4;

M=a metal selected from the group comprising alkali metal, alkaline earth metal, Al, Ga, In, transition metal or rare earth metal;

wherein the bond between N and the metal M is a covalent bond or N forms a non-covalent interaction to the metal M;

L=charge neutral ligand which coordinates to the metal M, selected from the group comprising $H_2O$, $C_2$ to $C_{40}$ mono- or multi-dentate ethers and $C_2$ to $C_{40}$ thioethers, $C_2$ to $C_{40}$ amines, $C_2$ to $C_{40}$ phosphine, $C_2$ to $C_{20}$ alkyl nitrile or $C_2$ to $C_{40}$ aryl nitrile, or a compound according to Formula (III);

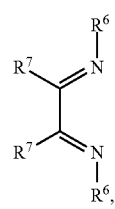
(III)

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline;

p=0, 1, 2 or 3;

$A^1$, $A^2$, $A^3$ and $A^4$ are independently selected from CO, $SO_2$ or $POR^8$;

$R^8$=electron withdrawing group selected from the group comprising halide, nitrile, halogenated or perhalogenated $C_1$ to $C_{20}$ alkyl, halogenated or perhalogenated $C_6$ to $C_{20}$ aryl, or halogenated or perhalogenated heteroaryl with 5 to 20 ring-forming atoms;

n=1, 2, 3, 4 or 5.

According to another aspect there is provided a hole injection layer for an OLED comprising a charge neutral metal amide compound, wherein the charge neutral metal amide compound has the Formula Ib:

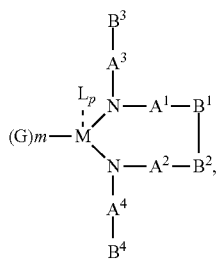

(Ib)

wherein:

$B^1$ and $B^2$ are bridged;

M, N, $A^1$, $B^1$, $B^2$, $A^2$ and N form a 7 to 10 member ring according to Formula Ib;

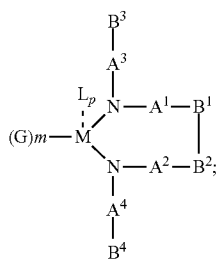

(Ib)

wherein:

G=halide, O, alkoxylate or amine of Formula IIa to IIe:

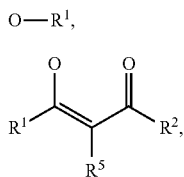

(IIa)

(IIb)

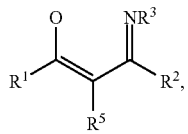

(IIc)

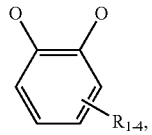

(IId)

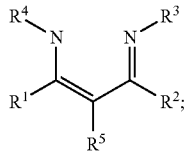

(IIe)

$R^1$ to $R^5$ are independently selected from the group comprising H, $C_1$ to $C_{20}$ alkyl, $C_1$ to $C_{20}$ heteroalkyl, unsubstituted or $C_1$ to $C_{12}$ substituted $C_6$ to $C_{20}$ aryl, unsubstituted or $C_1$ to $C_{12}$ substituted heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms; or at least one $R^1$ and $R^4$ and/or $R^2$ and $R^3$ and/or $R^1$ and $R^5$ are bridged and form a 5 to 20 member ring;

m=0, 1, 2, 3 or 4;

M=a metal selected from the group comprising alkali metal, alkaline earth metal, Al, Ga, In, transition metal or rare earth metal;

wherein the bond between N and the metal M is a covalent bond or N forms a non-covalent interaction to the metal M;

L=charge neutral ligand which coordinates to the metal M, selected from the group comprising $H_2O$, $C_2$ to $C_{40}$ mono- or multi-dentate ethers and $C_2$ to $C_{40}$ thioethers, $C_2$ to $C_{40}$ amines, $C_2$ to $C_{40}$ phosphine, $C_2$ to $C_{20}$ alkyl nitrile or $C_2$ to $C_{40}$ aryl nitrile, or a compound according to Formula (III);

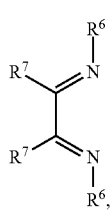

(III)

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline;

p=0, 1, 2 or 3;

$A^1$ and $A^2$ are independently selected from CO, $SO_2$ or $POR^8$;

$R^8$=electron withdrawing group selected from the group comprising halide, nitrile, halogenated or perhalogenated $C_1$ to $C_{20}$ alkyl, halogenated or perhalogenated $C_6$ to $C_{20}$ aryl, or halogenated or perhalogenated heteroaryl with 5 to 20 ring-forming atoms;

n=1, 2, 3, 4 or 5.

According to another aspect for the charge neutral metal amide compound according to the invention $B^1$, $B^2$, $B^3$ and $B^4$ can be independently selected from a substituted $C_1$ to $C_{20}$ alkyl, substituted $C_1$ to $C_{20}$ heteroalkyl, substituted $C_6$ to $C_{20}$ aryl, or substituted $C_5$ to $C_{20}$ heteroaryl; wherein the substituent of the substituted $C_1$ to $C_{20}$ alkyl, substituted $C_1$ to $C_{20}$ heteroalkyl, substituted $C_6$ to $C_{20}$ aryl, or substituted $C_5$ to $C_{20}$ heteroaryl;

wherein the substituent can be an electron withdrawing group selected from the group comprising a halide, nitrile, perhalogenated $C_1$ to $C_{20}$ alkyl, perhalogenated $C_6$ to $C_{20}$ aryl, perhalogenated heteroaryl with 6 to 20 ring-forming atoms, preferably the electron withdrawing group is a fluoride, perfluorinated $C_1$ to $C_{20}$ alkyl, perfluorinated $C_6$ to $C_{20}$ aryl, or perfluorinated heteroaryl with 5 to 20 ring-forming atoms.

In order to increase the vacuum vaporization it can be preferred that according to one embodiment the substituent can be a $C_1$ to $C_6$ alkyl or $C_1$ to $C_6$ heteroalkyl, and more preferred an $C_1$ to $C_4$ alkyl or $C_1$ to $C_4$ heteroalkyl.

In order to improve the solution processing it can be preferred that according to one embodiment the substituent can be a $C_4$ to $C_{20}$ alkyl or $C_4$ to $C_{20}$ heteroalkyl, and more preferred an $C_6$ to $C_{18}$ alkyl or $C_6$ to $C_{18}$ heteroalkyl.

According to another aspect there is provided a hole injection layer for an OLED comprising a charge neutral metal amide compound, wherein the charge neutral metal amide compound has the Formula Ic:

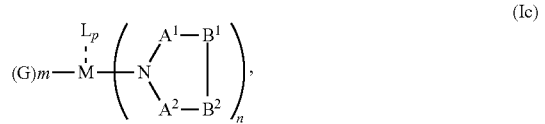
(Ic)

wherein:
$B^1$ and $B^2$ are bridged;
N, $A^1$, $B^1$, $B^2$ and $A^2$ form a 5 to 10 member ring according to Formula Ic,

(Ic)

wherein:
G=halide, O, alkoxylate or amine of Formula IIa to IIe:

(IIa)

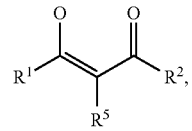
(IIb)

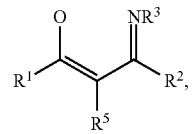
(IIc)

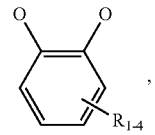
(IId)

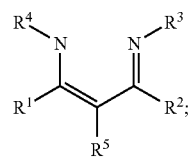
(IIe)

$R^1$ to $R^5$ are independently selected from the group comprising H, $C_1$ to $C_{20}$ alkyl, $C_1$ to $C_{20}$ heteroalkyl, unsubstituted or $C_1$ to $C_{12}$ substituted $C_6$ to $C_{20}$ aryl, unsubstituted or $C_1$ to $C_{12}$ substituted heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms; or at least one $R^1$ and $R^4$ and/or $R^2$ and $R^3$ and/or $R^1$ and $R^5$ are bridged and form a 5 to 20 member ring;

m=0, 1, 2, 3 or 4;

M=a metal selected from the group comprising alkali metal, alkaline earth metal, Al, Ga, In, transition metal or rare earth metal;

wherein the bond between N and the metal M is a covalent bond or N forms a non-covalent interaction to the metal M;

L=charge neutral ligand which coordinates to the metal M, selected from the group comprising $H_2O$, $C_2$ to $C_{40}$ mono- or multi-dentate ethers and $C_2$ to $C_{40}$ thioethers, $C_2$ to $C_{40}$ amines, $C_2$ to $C_{40}$ phosphine, $C_2$ to $C_{20}$ alkyl nitrile or $C_2$ to $C_{40}$ aryl nitrile, or a compound according to Formula (III);

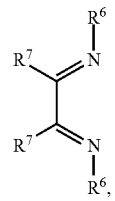
(III)

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline;

p=0, 1, 2 or 3;

$A^1$ and $A^2$ are independently selected from CO, $SO_2$ or $POR^8$;

$R^8$=electron withdrawing group selected from the group comprising halide, nitrile, halogenated or perhalogenated $C_1$ to $C_{20}$ alkyl, halogenated or perhalogenated $C_6$ to $C_{20}$ aryl, or halogenated or perhalogenated heteroaryl with 5 to 20 ring-forming atoms;

n=1, 2, 3, 4 or 5.

According to another aspect there is provided a hole injection layer for an OLED comprising a charge neutral metal amide compound, wherein the charge neutral metal amide compound has the Formula Id:

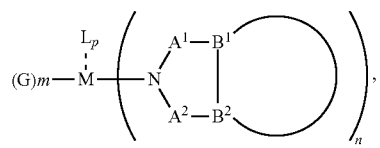

(Id)

wherein:

$B^1$ and $B^2$ are bridged;

N, $A^1$, $B^1$, $B^2$ and $A^2$ form a first 5 to 10 member ring and $B^1$ and $B^2$ form a second 5 to 20 member ring according to Formula Id:

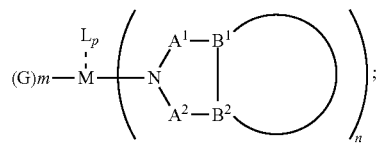

(Id)

wherein:

G=halide, O, alkoxylate or amine of Formula IIa to IIe:

(IIa)

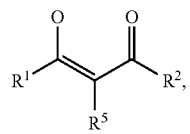

(IIb)

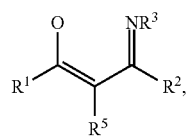

(IIc)

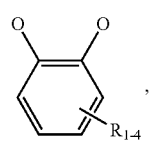

(IId)

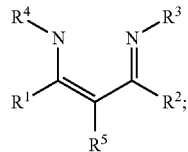

(IIe)

$R^1$ to $R^5$ are independently selected from the group comprising H, $C_1$ to $C_{20}$ alkyl, $C_1$ to $C_{20}$ heteroalkyl, unsubstituted or $C_1$ to $C_{12}$ substituted $C_6$ to $C_{20}$ aryl, unsubstituted or $C_1$ to $C_{12}$ substituted heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms; or at least one $R^1$ and $R^4$ and/or $R^2$ and $R^3$ and/or $R^1$ and $R^5$ are bridged and form a 5 to 20 member ring;

m=0, 1, 2, 3 or 4;

M=a metal selected from the group comprising alkali metal, alkaline earth metal, Al, Ga, In, transition metal or rare earth metal;

wherein the bond between N and the metal M is a covalent bond or N forms a non-covalent interaction to the metal M;

L=charge neutral ligand which coordinates to the metal M, selected from the group comprising $H_2O$, $C_2$ to $C_{40}$ mono- or multi-dentate ethers and $C_2$ to $C_{40}$ thioethers, $C_2$ to $C_{40}$ amines, $C_2$ to $C_{40}$ phosphine, $C_2$ to $C_{20}$ alkyl nitrile or $C_2$ to $C_{40}$ aryl nitrile, or a compound according to Formula (III);

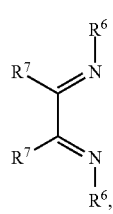

(III)

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline;

p=0, 1, 2 or 3;

$A^1$ and $A^2$ are independently selected from CO, $SO_2$ or $POR^8$;

$R^8$=electron withdrawing group selected from the group comprising halide, nitrile, halogenated or perhalogenated $C_1$ to $C_{20}$ alkyl, halogenated or perhalogenated $C_6$ to $C_{20}$ aryl, or halogenated or perhalogenated heteroaryl with 5 to 20 ring-forming atoms;

n=1, 2, 3, 4 or 5.

According to one aspect, the hole injection layer (HIL) may comprises the charge neutral metal amide compound according to formula Ia to Id in the range of about ≥50 wt.-% to about ≤100 wt.-%, preferably about ≥60 wt.-% to about ≤100 wt.-%, further preferred about ≥70 wt.-% to about ≤100 wt.-%, in addition preferred about ≥80 wt.-% to about ≤100 wt.-%, or about ≥95 wt.-% to about ≤100 wt.-%, or about ≥98 wt.-% to about ≤100 wt.-%, or about ≥99 wt.-% to about ≤100 wt.-%, and more preferred about ≥90 wt.-% to about ≤100 wt.-% or about ≥95 wt.-% to about ≤99 wt.-%.

According to another aspect, the hole injection layer (HIL) may comprises the charge neutral metal amide compound according to formula Ia to Id in the range of about ≥60 wt.-% to about ≤100 wt.-%, further preferred about ≥70 wt.-% to about ≤100 wt.-%, in addition preferred about ≥80 wt.-% to about ≤100 wt.-%, or about ≥95 wt.-% to about ≤100 wt.-%, or about ≥98 wt.-% to about ≤100 wt.-%, or about ≥99 wt.-% to about ≤100 wt.-%, and more preferred about ≥90 wt.-% to about ≤100 wt.-% or about ≥95 wt.-% to about ≤99 wt.-%.

According to another aspect, the hole injection layer (HIL) may comprises the charge neutral metal amide compound according to formula Ia to Id in the range of about ≥70 wt.-% to about ≤100 wt.-%, in addition preferred about ≥80 wt.-% to about ≤100 wt.-%, or about ≥95 wt.-% to about ≤100 wt.-%, or about ≥98 wt.-% to about ≤100 wt.-%, or about ≥99 wt.-% to about ≤100 wt.-%, and more preferred about ≥90 wt.-% to about ≤100 wt.-% or about ≥95 wt.-% to about ≤99 wt.-%.

According to another aspect, the hole injection layer (HIL) may comprises the charge neutral metal amide compound according to formula Ia to Id in the range of about ≥80 wt.-% to about ≤100 wt.-%, or about ≥95 wt.-% to about ≤100 wt.-%, or about ≥98 wt.-% to about ≤100 wt.-%, or about ≥99 wt.-% to about ≤100 wt.-%, and more preferred about ≥90 wt.-% to about ≤100 wt.-% or about ≥95 wt.-% to about ≤99 wt.-%.

According to another aspect, the hole injection layer (HIL) may comprises the charge neutral metal amide compound according to formula Ia to Id in the range of about ≥95 wt.-% to about ≤100 wt.-%, or about ≥98 wt.-% to about ≤100 wt.-%, or about ≥99 wt.-% to about ≤100 wt.-%, and more preferred about ≥90 wt.-% to about ≤100 wt.-% or about ≥95 wt.-% to about ≤99 wt.-%.

According to another aspect, the hole injection layer (HIL) may comprises the charge neutral metal amide compound according to formula Ia to Id in the range of about ≥98 wt.-% to about ≤100 wt.-%, or about ≥99 wt.-% to about ≤100 wt.-%, and more preferred about ≥90 wt.-% to about ≤100 wt.-% or about ≥95 wt.-% to about ≤99 wt.-%.

According to another aspect, the hole injection layer (HIL) may comprises the charge neutral metal amide compound according to formula Ia to Id in the range of about ≥99 wt.-% to about ≤100 wt.-%, and more preferred about ≥90 wt.-% to about ≤100 wt.-% or about ≥95 wt.-% to about ≤99 wt.-%.

According to another aspect, the hole injection layer (HIL) may consist of the charge neutral metal amide compound according to Formula Ia to Id.

According to another aspect, the hole injection layer (HIL) may comprises ≥0 wt.-% to ≤20 wt % of a HTL compound, preferably ≥0.1 wt.-% to ≤15 wt.-% of a HTL compound, and even more preferred ≥0.5 wt.-% to ≤10 wt.-% of a HTL compound, and also preferred ≤2 wt.-%, wherein the HTL compound differs from the HIL neutral metal amide compound according to formula Ia to Id.

According to another aspect, the hole injection layer (HIL) may comprises ≥0 wt.-% to ≤20 wt.-% of a HTL compound, preferably ≥0.1 wt.-% to ≤15 wt.-% of a HTL compound, and even more preferred ≥0.5 wt.-% to ≤10 wt.-% of a HTL compound.

According to an aspect of the present invention, there is provided a hole injection layer for an OLED comprising a charge neutral metal amide compound, wherein the charge neutral metal amide compound has the Formula Ia:

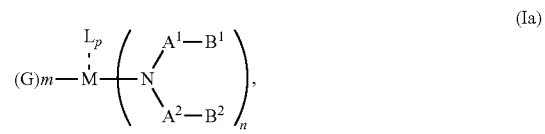

wherein:
G=halide, O, alkoxylate or amine of Formula IIa to IIe:

$R^1$ to $R^5$ are independently selected from the group comprising H, $C_1$ to $C_{20}$ alkyl, $C_1$ to $C_{20}$ heteroalkyl, unsubstituted or $C_1$ to $C_{12}$ substituted $C_6$ to $C_{20}$ aryl, unsubstituted or $C_1$ to $C_{12}$ substituted heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms; or at least one $R^1$ and $R^4$ and/or $R^2$ and $R^3$ and/or $R^1$ and $R^5$ are bridged and form a 5 to 20 member ring;

m=0, 1, 2, 3 or 4;

M=a metal selected from the group comprising alkali metal, alkaline earth metal, Al, Ga, In, transition metal or rare earth metal;
  wherein the bond between N and the metal M is a covalent bond or N forms a non-covalent interaction to the metal M;

L=charge neutral ligand which coordinates to the metal M, selected from the group comprising $H_2O$, $C_2$ to $C_{40}$ mono- or multi-dentate ethers and $C_2$ to $C_{40}$ thioethers, $C_2$ to $C_{40}$ amines, $C_2$ to $C_{40}$ phosphine, $C_2$ to $C_{20}$ alkyl nitrile or $C_2$ to $C_{40}$ aryl nitrile, or a compound according to Formula (III);

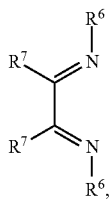
(III)

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline;

p=0, 1, 2 or 3;

$A^1$, $A^2$, $A^3$ and $A^4$ are independently selected from CO, $SO_2$ or $POR^8$;

$R^8$=electron withdrawing group selected from the group comprising halide, nitrile, halogenated or perhalogenated $C_1$ to $C_{20}$ alkyl, halogenated or perhalogenated $C_6$ to $C_{20}$ aryl, or halogenated or perhalogenated heteroaryl with 5 to 20 ring-forming atoms;

n=1, 2, 3, 4 or 5;

$B^3$ and $B^4$ are same or independently selected from substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, substituted or unsubstituted $C_5$ to $C_{20}$ heteroaryl;

$B^1$ and $B^2$ are bridged, wherein:

M, N, $A^1$, $B^1$, $B^2$, $A^2$ and N form a 7 to 10 member ring according to Formula Ib;

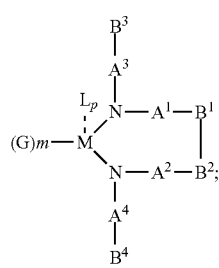
(Ib)

or

N, $A^1$, $B^1$, $B^2$ and $A^2$ form a 5 to 10 member ring according to Formula Ic,

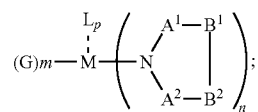
(Ic)

or

N, $A^1$, $B^1$, $B^2$ and $A^2$ form a first 5 to 10 member ring and $B^1$ and $B^2$ form a second 5 to 20 member ring according to Formula Id:

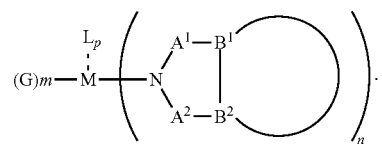
(Id)

According to one aspect the charge neutral ligand L may be selected from the group comprising $C_2$ to $C_{20}$ glycole ethers, $C_2$ to $C_{20}$ ethylendiamine derivatives, and more preferred bis(2-methoxyethyl) ether, tetrahydrofurane, tetrahydrothiophen, $N^1,N^1,N^2,N^2$-tetramethyl-1,2-ethanediamine, N-((E,2E)-2-{[(E)-1,1-dimethylethyl]imino}ethylidene)-2-methyl-2-propanamine, acetonitrile, trisphenylphosphine, trismethylphosphine, tris(cylcohexyl)phosphine, 1,2-bis(diphenylphosphino)ethane, bispyridine, phenanthroline, (2E,3E)-$N^2,N^3$-diphenylbutane-2,3-diimine or (1E,2E)-$N^1,N^2$,1,2-tetraphenylethane-1,2-diimine.

According to one aspect of the charge neutral metal amide compound "m" may be selected that m=0, 1 or 2.

According to one aspect of the charge neutral metal amide compound "M" may be selected from Li(I), Na(I), K(I), Cs(I), Mg(II), Ca(II), Sr(II), Ba(II), Sc(III), Y(III), Ti(IV), V(III-V), Cr(III-VI), Mn(II), Mn(III), Fe(II), Fe(III), Co(II), Co(III), Ni(II), Cu(I), Cu(II), Zn(II), Ag(I), Au(I), Au(III), Al(III), Ga(III), In(III), Sn(II), Sn(IV), or Pb(II); preferably M is selected from Li (I), Mg (II), Mn (II) or Ag (I); and more preferred M is selected from Mg (II) and Li (I).

According to one aspect of the charge neutral metal amide compound, wherein may be $(G)_m$ for m=1, then G is Cl; or may be $(G)_m$ for m=2, then G is O.

According to one aspect of the charge neutral metal amide compound, wherein may be $(G)_m$-M is Cl—Al, Cl—Mg, O=V or $O_2U$.

According to one aspect of the charge neutral metal amide compound, wherein may be for n≥2 then:

N, $A^1$, $B^1$, $A^2$ and $B^2$ form a 5 to 10 member ring; or

M, N, $A^1$, $B^1$, $A^2$ and $B^2$ form a 7 to 10 member ring; or

M, N, $A^1$, $B^1$, $A^2$ and $B^2$ form a 7 to 10 member ring and $A^3$, $B^3$, $A^4$ and $B^4$ form a 5 to 10 member ring.

According to another aspect the charge neutral ligand L may the Formula Ia,

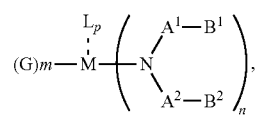
(Ia)

wherein:
A$^1$ and A$^2$ are same or independently selected from CO, POR$^8$ and SO$_2$, preferably A$^1$ and
A$^2$ are selected same from CO, POR$^8$, SO$_2$; or
A$^1$ and A$^2$ are independently selected from CO, POR$^8$, SO$_2$, and
N, A$^1$, B$^1$, A$^2$ and B$^2$ form a 5 to 10 member ring.

According to another aspect the charge neutral metal amide compound of the hole injection layer may be selected from at least one compound according to Formula IIa, IIb, IIc, IId, IIe, IIf, IIg and/or IIh,
wherein for:
p=0, m=1, 2, 3 or 4 and n=1, 2, 3 or 4, the charge neutral metal amide compound has the Formula IIa:

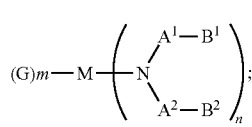
(IIa)

or
p=1, 2 or 3, and n=1, 2, 3 or 4 and m=0, the charge neutral metal amide compound has the Formula IIb:

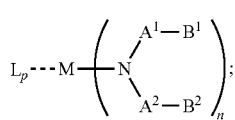
(IIb)

or
p=1, 2 or 3, n=1, 2, 3 or 4, m=1, 2, 3 or 4 and N, A$^1$, B$^1$, B$^2$ and A$^2$ form a 5 to 10 member ring, the charge neutral metal amide compound has the Formula IIc:

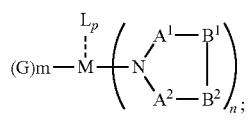
(IIc)

or
p=1, 2 or 3, n=1, 2, 3 or 4, m=1, 2, 3 or 4 and N, A$^1$, B$^1$, B$^2$ and A$^2$ form a first 5 to 10 member ring and B$^1$ and B$^2$ are bridged to form a second 5 to 20 member ring, the charge neutral metal amide compound has the Formula IId:

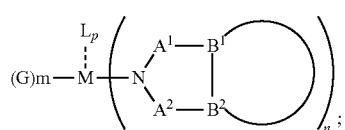
(IId)

or
p=1, 2 or 3, n=1, m=1, 2, 3 or 4, and M, N, A$^1$, B$^1$, A$^2$ and N form a 7 to 10 member ring, the charge neutral metal amide compound has the Formula IIe:

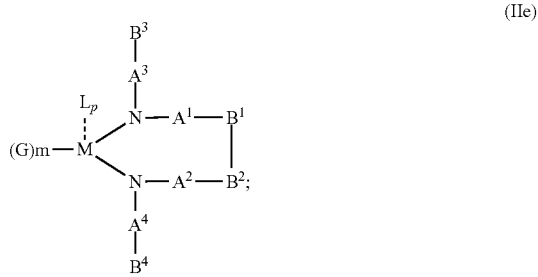
(IIe)

p=1, 2 or 3, n=1, 2, 3 or 4, m=0 and N, A$^1$, B$^1$, B$^2$ and A$^2$ form a 5 to 10 member ring, the charge neutral metal amide compound has the Formula IIf:

(IIf)

p=1, 2 or 3, n=1, 2, 3 or 4, m=0 and N, A$^1$, B$^1$, B$^2$ and A$^2$ form a first 5 to 10 member ring, and B$^1$ and B$^2$ are bridged to form a second 5 to 20 member ring, the charge neutral metal amide compound has the Formula IIg:

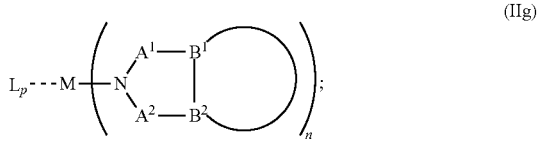
(IIg)

p=1, 2 or 3, n=1, m=0 and M, N, A$^1$, B$^1$, B$^2$, A$^2$ and N form a 7 to 10 member ring, the charge neutral metal amide compound has the Formula IIh:

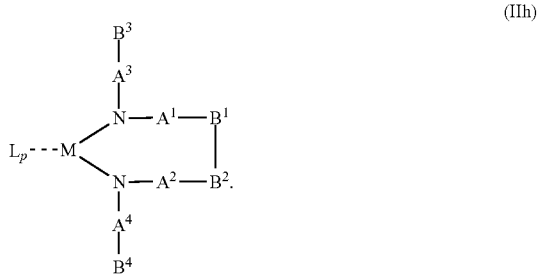
(IIh)

According to another aspect the charge neutral metal amide compound of the hole injection layer may be selected from at least one compound according to Formula IIIa, IIIb, IIIc, IIId, IIIe, IIIf, IIIg, IIIh and/or IIIi,
wherein for A$^1$ and A$^2$ are SO$_2$:
p=1, 2 or 3, n=1, 2, 3 or 4, m=1, 2, 3 or 4, the charge neutral metal amide compound has the Formula IIIa:

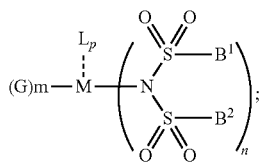
(IIIa)

p=0, n=1, 2, 3 or 4, m=1, 2, 3 or 4, the charge neutral metal amide compound has the Formula IIIb:

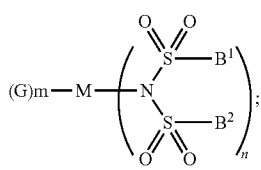
(IIIb)

p=1, 2 or 3, n=1, 2, 3 or 4, m=0, the charge neutral metal amide compound has the Formula IIIc:

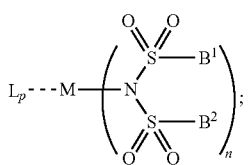
(IIIc)

p=1, 2 or 3, n=1, 2, 3 or 4, m=1, 2, 3 or 4 and N, SO$_2$, B$^1$, B$^2$ and SO$_2$ form a 5 to 10 member ring, the charge neutral metal amide compound has the Formula IIId:

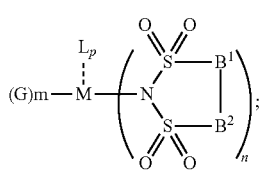
(IIId)

p=1, 2 or 3, n=1, 2, 3 or 4, m=1, 2, 3 or 4 and N, SO$_2$, B$^1$, B$^2$ and SO$_2$ form a first 5 to 10 member ring, and B$^1$ and B$^2$ are bridged to form a second 5 to 20 member ring, the charge neutral metal amide compound has the Formula IIIe:

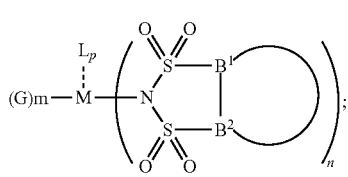
(IIIe)

p=1, 2 or 3, n=1, m=1, 2, 3 or 4 and M, N, SO$_2$, B$^1$, B$^2$, SO$_2$ and N form a 7 to 10 member ring, the charge neutral metal amide compound has the Formula IIIf:

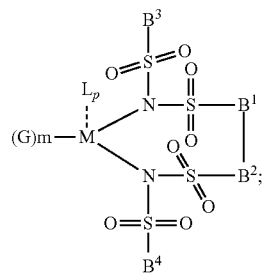
(IIIf)

p=1, 2 or 3, n=1, 2, 3 or 4, m=0 and N, SO$_2$, B$^1$, B$^2$ and SO$_2$ form a 5 to 10 member ring, the charge neutral metal amide compound has the Formula IIIg:

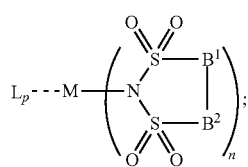
(IIIg)

p=1, 2 or 3, n=1, 2, 3 or 4, m=0 and N, SO$_2$, B$^1$, B$^2$ and SO$_2$ form a first 5 to 10 member ring, and B$^1$ and B$^2$ are bridged to form a second 5 to 20 member ring, the charge neutral metal amide compound has the Formula IIIh:

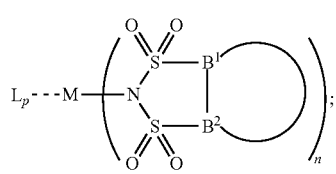
(IIIh)

p=1, 2 or 3, n=1, 2, 3 or 4, m=0 and M, N, SO$_2$, B$^1$, B$^2$, SO$_2$ and N form a 7 to 10 member ring, the charge neutral metal amide compound has the Formula IIIi:

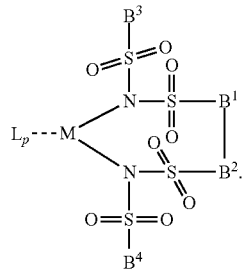
(IIIi)

According to another aspect the charge neutral metal amide compound of the hole injection layer may be selected from at least one compound according to Formula IVa, IVb, IVc, IVd and/or IVe, wherein for A$^1$ and A$^2$ are POR$^8$:

p=1, 2 or 3, m=1, 2, 3 or 4 and n=1, 2, 3 or 4, the charge neutral metal amide compound has the Formula IVa:

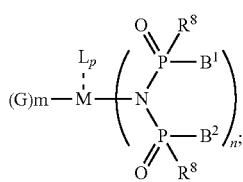

(IVa)

p=0, m=1, 2, 3 or 4 and n=1, 2, 3 or 4, the charge neutral metal amide compound has the Formula IVb:

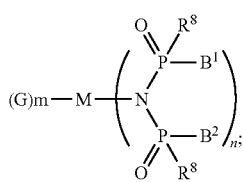

(IVb)

p=1, 2 or 3, m=0 and n=1, 2, 3 or 4, the charge neutral metal amide compound has the Formula IVc:

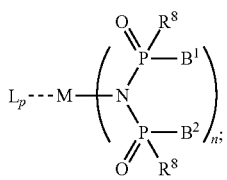

(IVc)

p=1, 2 or 3, n=1, 2, 3 or 4, m=1, 2, 3 or 4 and N, POR$^8$, B$^1$, B$^2$ and POR$^8$ form a 5 to 10 member ring, the charge neutral metal amide compound has the Formula (IVd):

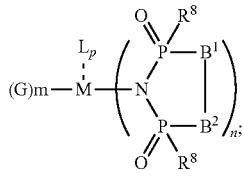

(IVd)

p=1, 2 or 3, n=1, 2, 3 or 4, m=0 and N, POR$^8$, B$^1$, B$^2$ and POR$^8$ form a 5 to 10 member ring, the charge neutral metal amide compound has the Formula (IVe):

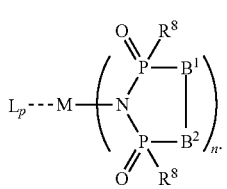

(IVe)

According to another aspect the charge neutral metal amide compound of the hole injection layer may be selected from at least one compound according to Formula Va, Vb, Vc, Vd, Ve, Vf, Vg, Vh and/or Vi, wherein for A$^1$ and A$^2$ are CO:

p=1, 2 or 3, m=1, 2, 3 or 4 and n=1, 2, 3 or 4, the charge neutral metal amide compound has the Formula Va:

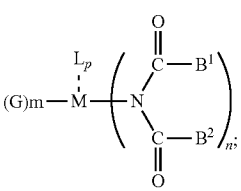

(Va)

p=0, n=1, 2, 3 or 4, m=1, 2, 3 or 4, the charge neutral metal amide compound has the Formula Vb:

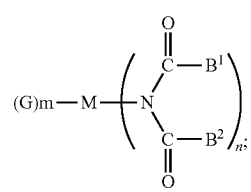

(Vb)

p=1, 2 or 3, n=1, 2, 3 or 4, m=0, the charge neutral metal amide compound has the Formula Vc:

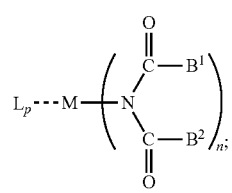

(Vc)

p=1, 2 or 3, n=1, 2, 3 or 4, m=1, 2, 3 or 4 and N, CO, B$^1$, B$^2$ and CO form a 5 to 10 member ring, the charge neutral metal amide compound has the Formula Vd:

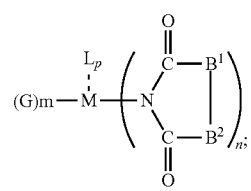

(Vd)

p=1, 2 or 3, n=1, 2, 3 or 4, m=1, 2, 3 or 4 and N, CO, B$^1$, B$^2$ and CO form a first 5 to 10 member ring, and B$^1$ and B$^2$ are bridged to form a second 5 to 20 member ring, the charge neutral metal amide compound has the Formula Ve:

(Ve)

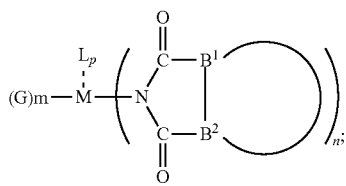

p=1, 2 or 3, n=1, m=1, 2, 3 or 4 and M, N, CO, $B^1$, $B^2$, CO and N form a 7 to 10 member ring, the charge neutral metal amide compound has the Formula Vf:

(Vf)

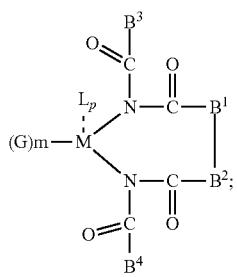

p=1, 2 or 3, n=1, 2, 3 or 4, m=0 and N, CO, $B^1$, $B^2$ and CO form a 5 to 10 member ring, the charge neutral metal amide compound has the Formula (Vg):

(Vg)

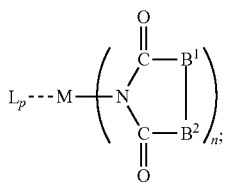

p=1, 2 or 3, n=1, 2, 3 or 4, m=0 and N, CO, $B^1$, $B^2$ and CO form a first 5 to 10 member ring, and $B^1$ and $B^2$ form a second 5 to 20 member ring, the charge neutral metal amide compound has the Formula Vh:

(Vh)

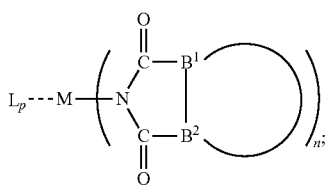

p=1, 2 or 3, n=1, 2, 3 or 4, m=0 and M, N, CO, $B^1$, $B^2$, CO and N form a 7 to 10 member ring, the charge neutral metal amide compound has the Formula (Vi):

(Vi)

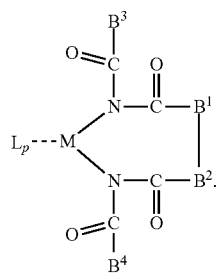

According to another aspect the charge neutral metal amide compound of the hole injection layer may be selected from at least one compound according to Formula VIa, wherein for $A^1$ is $SO_2$ and $A^2$ is $POR^8$:

p=1, 2 or 3, m=1, 2, 3 or 4 and n=1, 2, 3 or 4, the charge neutral metal amide compound has the Formula VIa:

(VIa)

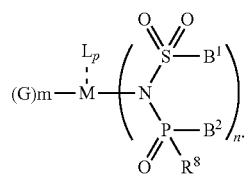

According to another aspect the charge neutral metal amide compound of the hole injection layer may be selected from at least one compound according to Formula Ib:

(Ib)

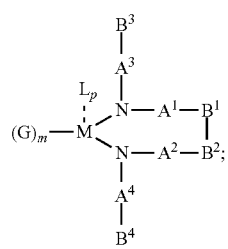

wherein:

$A^3$ and $A^4$ are same or independently selected from CO, $POR^8$ or $SO_2$, preferably $A^3$ and $A^4$ are selected same from CO, $POR^8$ or $SO_2$, $B^3$ and $B^4$ are independently selected from substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, substituted or unsubstituted $C_6$ to $C_{20}$ heteroaryl, preferably $B^3$ and $B^4$ are selected same; and M, N, $A^1$, $B^1$, $A^2$ and $B^2$ form a 7 to 10 member ring.

According to another aspect the charge neutral metal amide compound of the hole injection layer may be selected from at least one compound according to Formula Id, wherein N, $A^1$, $B^1$, $A^2$ and $B^2$ form a first 5 to 10 member ring and $B^1$ and $B^2$ are bridged to form a second ring of a substituted or unsubstituted $C_6$ to $C_{20}$ aryl, or of a substituted or unsubstituted $C_6$ to $C_{20}$ heteroaryl ring:

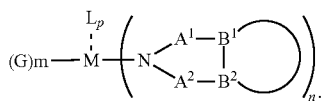
(Id)
According to another aspect the charge neutral metal amide compound of the hole injection layer may be selected from at least one fluorinated compound according to:
Formula C1 to C16, based on general formula Ia, wherein p=0, m=0, n=1, 2, 3 or 4 and $A^1$ and $A^2$ are $SO_2$:
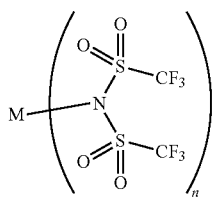
(C1)
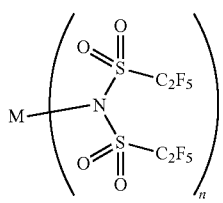
(C2)
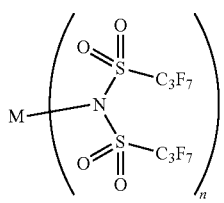
(C3)
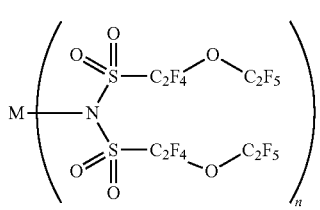
(C5)
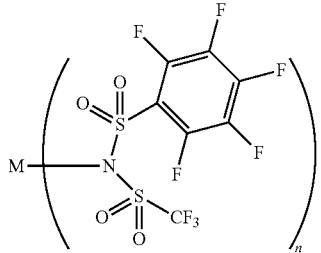
(C6)
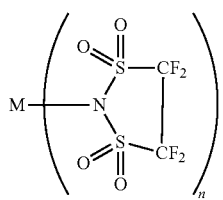
(C7)
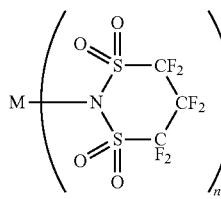
(C8)
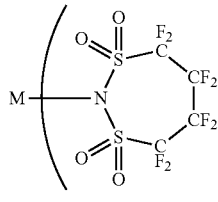
(C9)
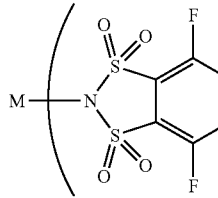
(C10)
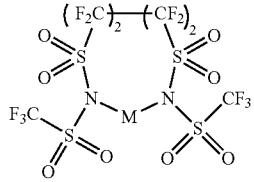
(C11)
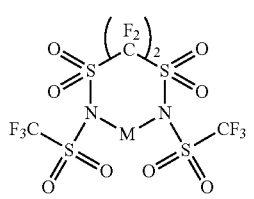
(C12)
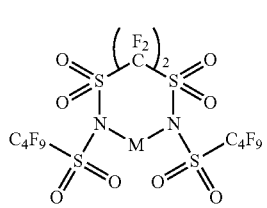
(C13)
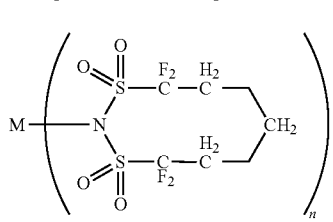
(C14)

(C15)
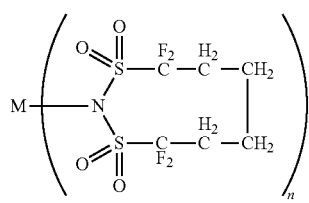

(C16)
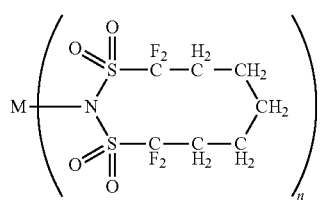

Formula C17 to C23, based on general Formula Ia, wherein n=1, 2, 3 or 4, $A^1$ and $A^2$ are CO:

(C17)
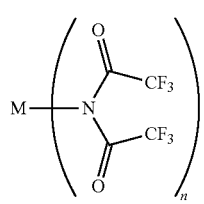

(C18)
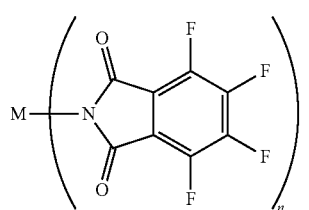

(C19)
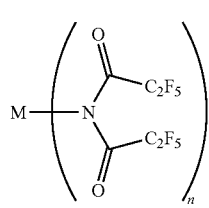

(C20)
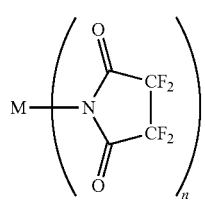

(C21)
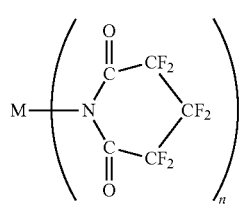

(C22)
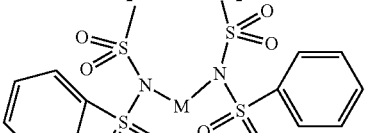

(C23)
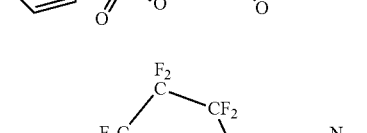

Formula C24 to C25, based on general Formula Ia, wherein n=1, 2, 3 or 4, $A^1$ and $A^2$ are $POR^8$:

(C24)
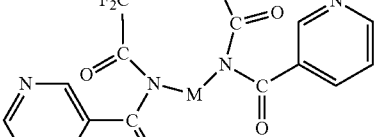

(C25)
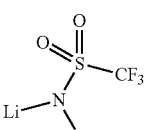

According to another aspect the charge neutral metal amide compound of the hole injection layer may be selected from at least one fluorinated compound, based on general formula Ia, having the Formula D1 to D24:

wherein p=0, m=0, n=1, 2, 3 or 4 and $A^1$ and $A^2$ are $SO_2$:

(D1)
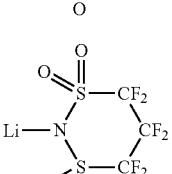

(D2)

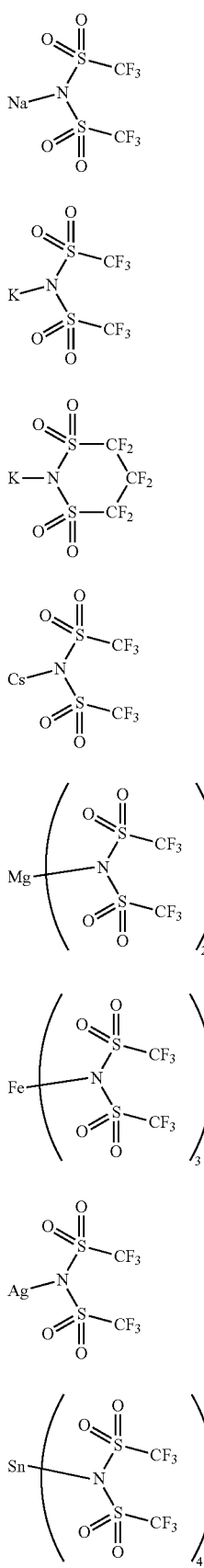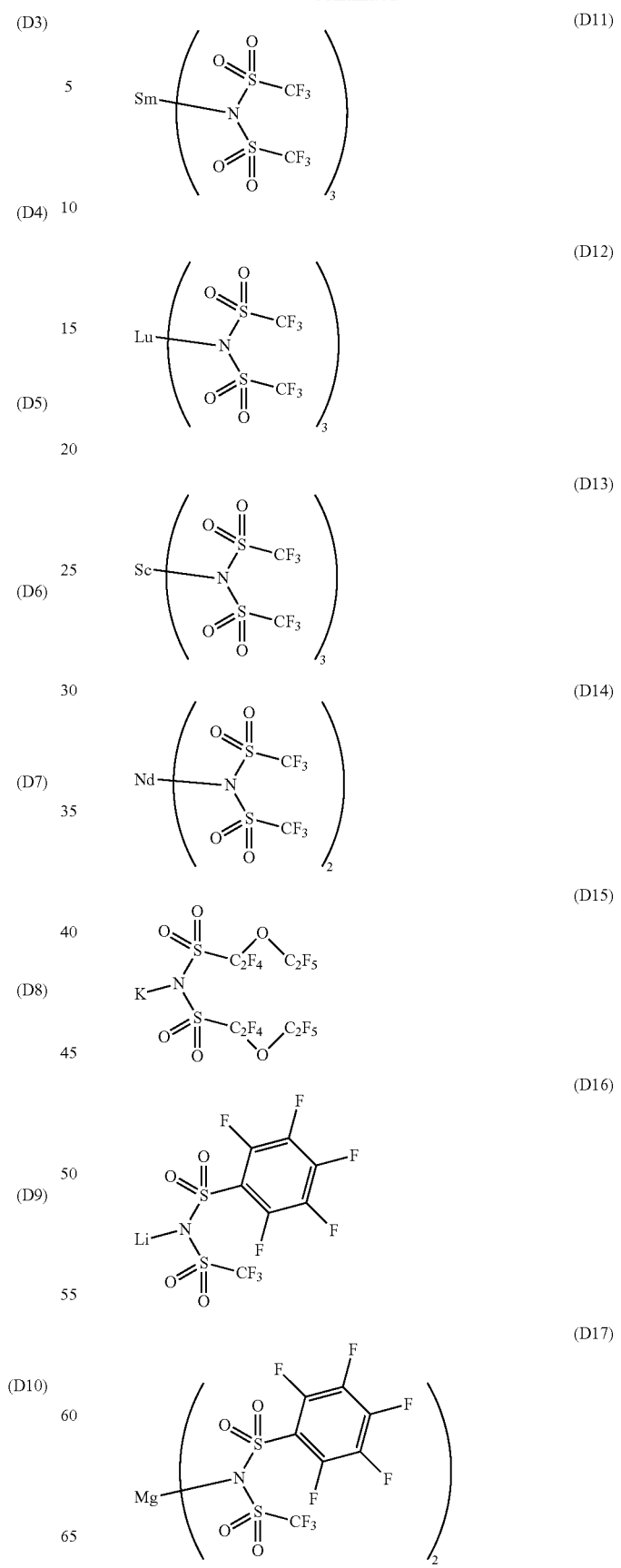

-continued
(D18)
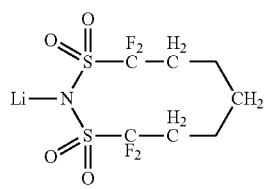
(D19)
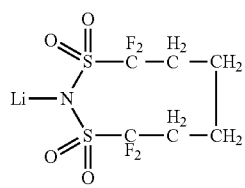
(D20)
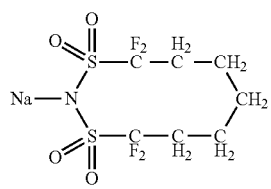
(D21)
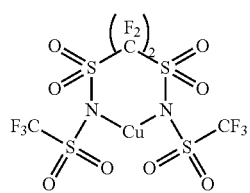
(D22)
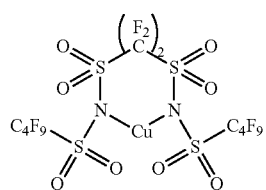
(D23)
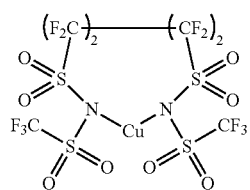
(D24)
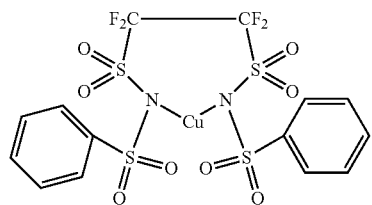
According to another aspect the charge neutral metal amide compound of the hole injection layer may be selected from at least one fluorinated compound, based on general formula Ia, having the Formula F1 to F23:
wherein the charge neutral ligand L coordinates to the metal M:
(F1)
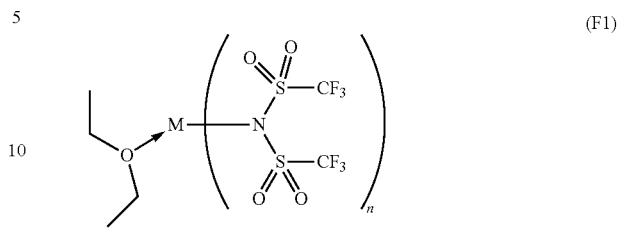
(F2)
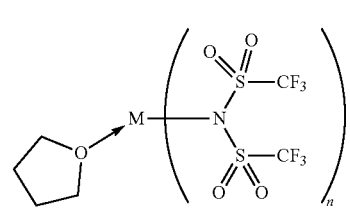
(F3)
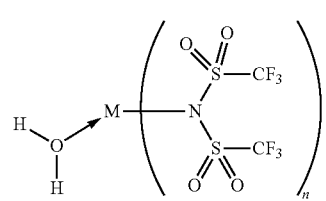
(F4)
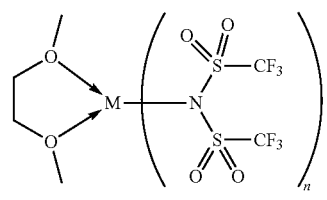
(F5)
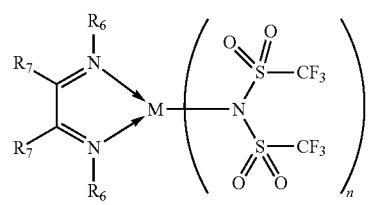
(F6)
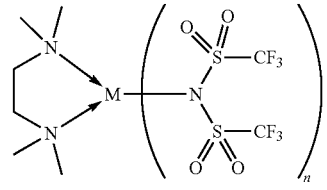
(F7)
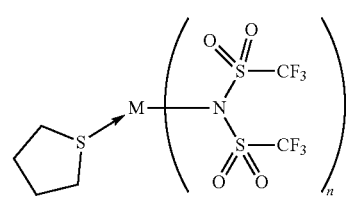

(F8) 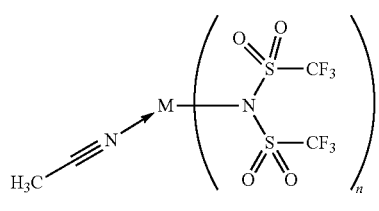

(F9) 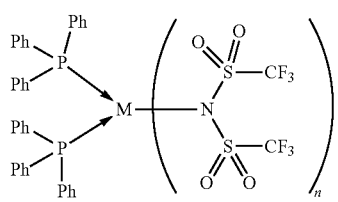

(F10) 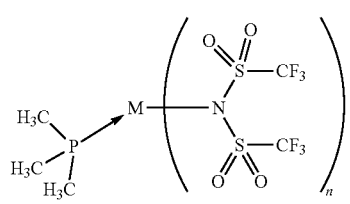

(F11) 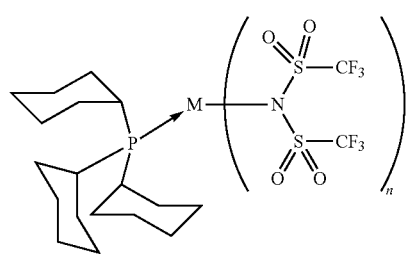

(F12) 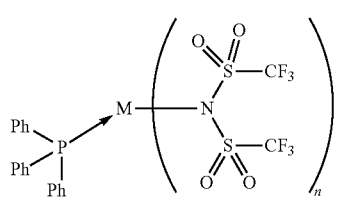

(F13) 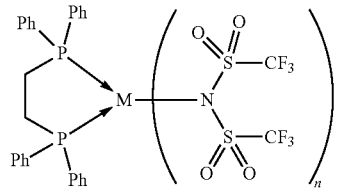

(F14) 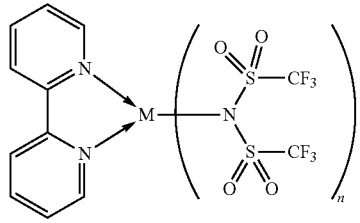

(F15) 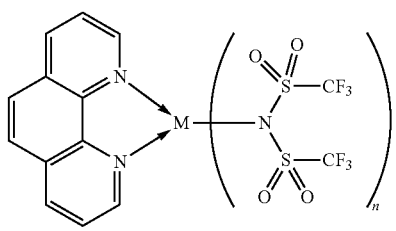

(F16) 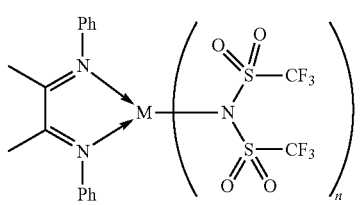

(F17) 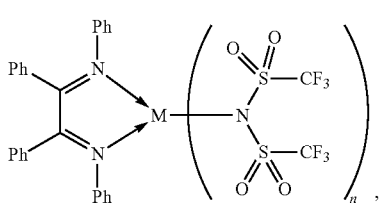

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline.

Charge neutral metal amide compounds which contain a charge-neutral ligand L selected from mono and multidental ethers or amines forming a 5 to 7 membered ring system with the metal, preferably glycole ethers, ethylendiamine derivatives, even more preferred diglyme, and/or N1,N1,N2,N2-tetramethyl-1,2-ethanediamine, N-((E,2E)-2-{[(E)-1,1-dimethylethyl]imino}ethylidene)-2-methyl-2-propanamine can be preferably used as HIL-material.

Examples of charge neutral metal amides compounds with a charge-neutral ligand L selected from mono and/or multidental ethers or amines that can be preferably used as HIL-material having the Formula F1, F2, F3, F4, F5 and/or F6:

(F1)

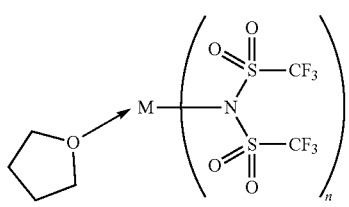 (F2)

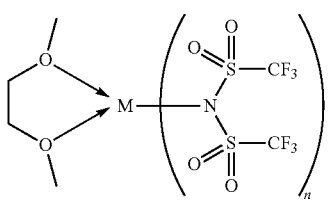 (F4)

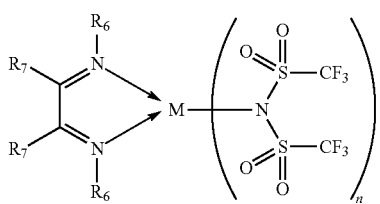 (F5)

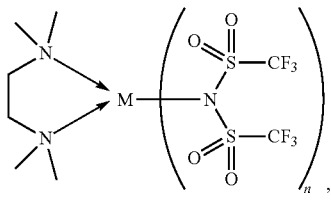 (F6)

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline.

According to another aspect the charge neutral metal amide compound of the hole injection layer may be selected preferably from at least one fluorinated compound, based on general formula Ia, having the Formula F18 to F23:

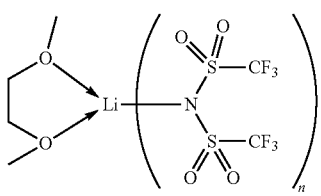 (F18)

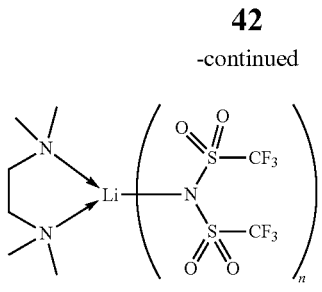 (F19)

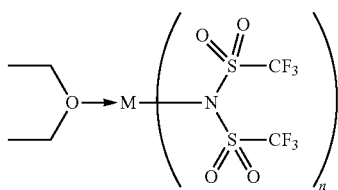 (F20)

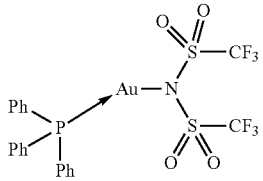 (F21)

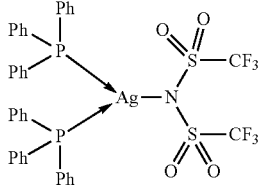 (F22)

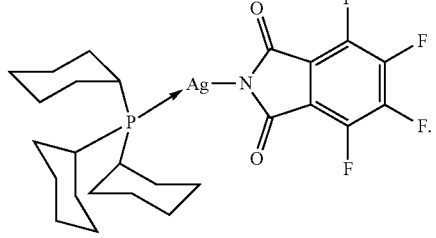 (F23)

According to another aspect the charge neutral metal amide compound of the hole injection layer may be selected preferably from at least one fluorinated compound, based on general formula Ia, having the Formula F24 to F45:

wherein a halide, O, alkoxylate or amine bonds to the metal M:

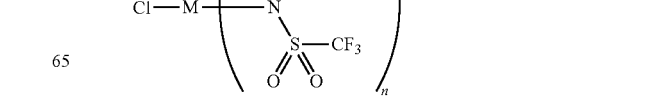 (F24)

-continued

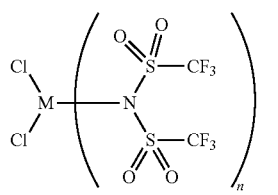 (F25)

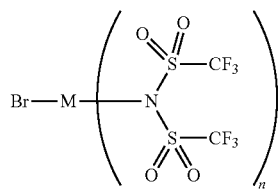 (F26)

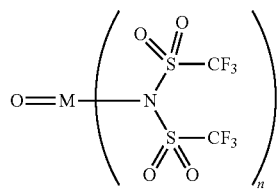 (F27)

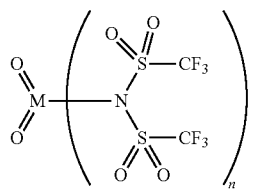 (F28)

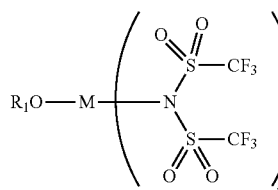 (F29)

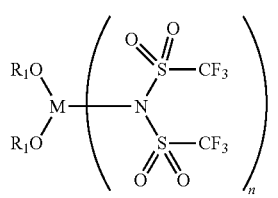 (F30)

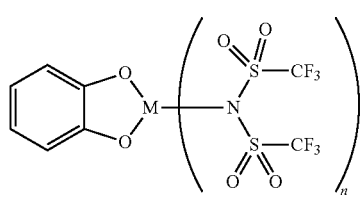 (F31)

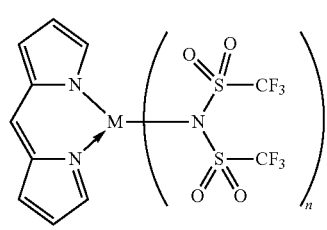 (F32)

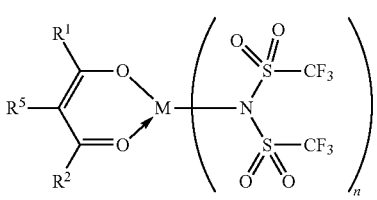 (F33)

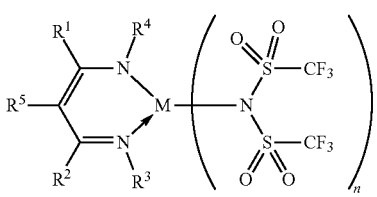 (F34)

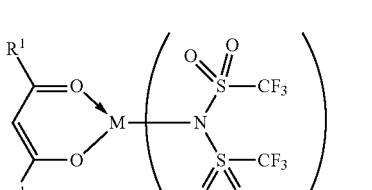 (F35)

wherein $R^1$ to $R^5$ are independently selected from the group comprising H, $C_1$ to $C_{20}$ alkyl, $C_1$ to $C_{20}$ heteroalkyl, unsubstituted or $C_1$ to $C_{12}$ substituted $C_6$ to $C_{20}$ aryl, unsubstituted or $C_1$ to $C_{12}$ substituted heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms; or at least one $R^1$ and $R^4$ and/or $R^2$ and $R^3$ and/or $R^1$ and $R^5$ are bridged and form a 5 to 20 member cyclic ring.

More preferred are compounds which comprise a ligand G. Ligand G is selected from group VII elements, preferably chloride $C_1$. Furthermore preferred are compounds wherein ligand G is selected from an alkoxylate of formula F30, F31 and F35:

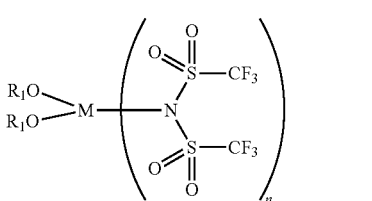 (F30)

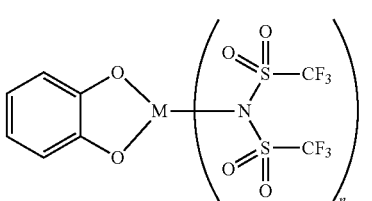 (F31)

(F35)
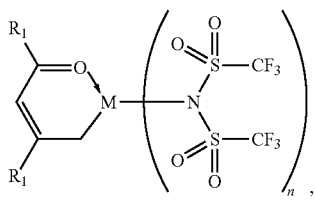

wherein

R¹ is selected from the group comprising H, $C_1$ to $C_{20}$ alkyl, $C_1$ to $C_{20}$ heteroalkyl, unsubstituted or $C_1$ to $C_{12}$ substituted $C_6$ to $C_{20}$ aryl, unsubstituted or $C_1$ to $C_{12}$ substituted heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms.

According to another aspect the charge neutral metal amide compound of the hole injection layer may be selected preferably from at least one fluorinated compound, based on general formula Ia, having the Formula F36 to F46:

(F36)

(F37)

(F38)

(F39)

(F40)

(F41) 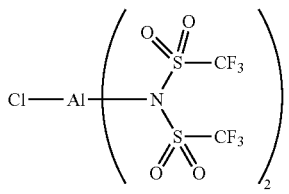

(F42) 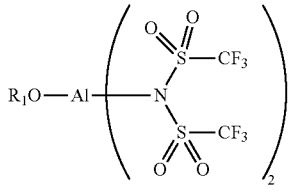

(F43) 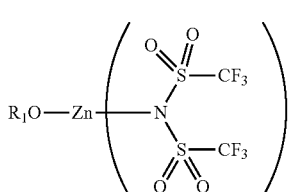

(F44) 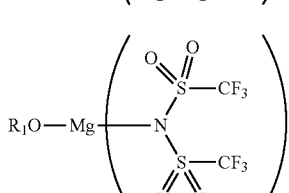

(F45) 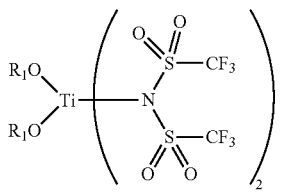

(F46) 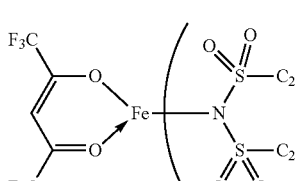

In Table 1 below metal amide compounds according to formula Ia are listed, which can be preferably used as hole injection layer (HIL) material.

TABLE 1

Compounds of formula (Ia) which can be suitable used for an hole injection layer (HIL)

| Metal amide | Structure | CAS number |
| --- | --- | --- |
| Li TFSI | 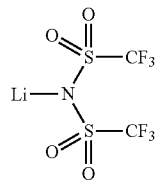 | 90076-65-6 |

TABLE 1-continued

Compounds of formula (Ia) which can be suitable used for an hole injection layer (HIL)

| Metal amide | Structure | CAS number |
|---|---|---|
| Na TFSI | Na-N(SO$_2$CF$_3$)$_2$ | 91742-21-1 |
| K TFSI | K-N(SO$_2$CF$_3$)$_2$ | 90076-67-8 |
| Cs TFSI | Cs-N(SO$_2$CF$_3$)$_2$ | 91742-16-4 |
| Mg (TFSI)$_2$ | Mg[N(SO$_2$CF$_3$)$_2$]$_2$ | 133395-16-1 |
| Fe (TFSI)$_3$ | Fe[N(SO$_2$CF$_3$)$_2$]$_3$ | 207861-59-4 |
| Ag TFSI | Ag-N(SO$_2$CF$_3$)$_2$ | 189114-61-2 |
| Mn (TFSI)$_2$ | Mg[N(SO$_2$CF$_3$)$_2$]$_2$ | 207861-55-0 |
| Sn (TFSI)$_4$ | Sn[N(SO$_2$CF$_3$)$_2$]$_4$ | 1019840-51-7 |
| Sm (TFSI)$_3$ | Sm[N(SO$_2$CF$_3$)$_2$]$_3$ | 222733-67-7 |
| Lu (TFSI)$_3$ | Lu[N(SO$_2$CF$_3$)$_2$]$_3$ | 887949-24-6 |
| Sc (TFSI)$_3$ | Sc[N(SO$_2$CF$_3$)$_2$]$_3$ | 176726-07-1 |
| Nd (TFSI)$_3$ | Nd[N(SO$_2$CF$_3$)$_2$]$_3$ | 207861-67-4 |
| U(O)$_2$ (TFSI)$_2$ | UO$_2$[N(SO$_2$CF$_3$)$_2$]$_2$ | 943217-83-2 |
| V(O) (TFSI)$_3$ | O=V[N(SO$_2$CF$_3$)$_2$]$_3$ | — |

Particularly preferred are metal amide compounds for use as HIL-material listed in Table 2.

TABLE 2
Compounds of formula (Ia) which can be suitable used for an hole injection layer (HIL)
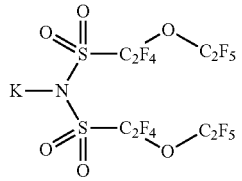
(CAS 1666941-68-9)
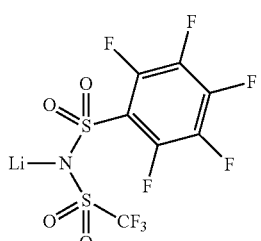
(CAS 201303-23-3)
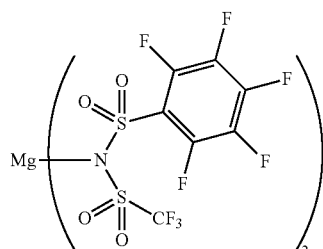
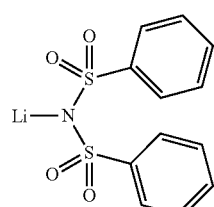
(CAS 149542-03-0)
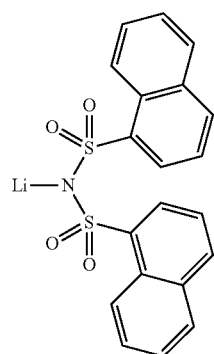
TABLE 2-continued
Compounds of formula (Ia) which can be suitable used for an hole injection layer (HIL)
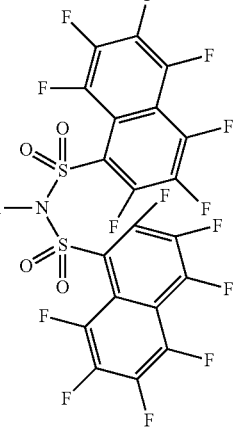
(CAS 1531639-43-69
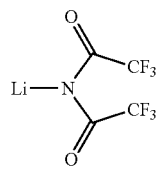
(CAS 90076-63-4)
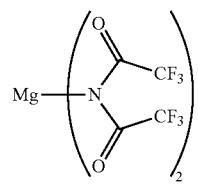
(CAS 151582-16-0)
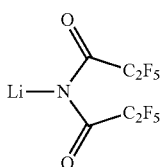
(CAS 132843-42-6)
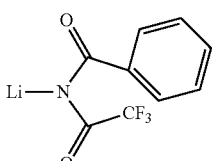
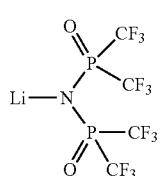
(CAS 1362230-45-2)

TABLE 2-continued
Compounds of formula (Ia) which can be suitable used for an hole injection layer (HIL)
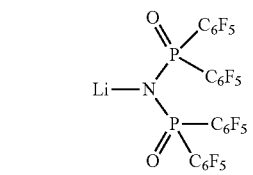
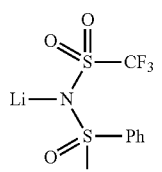
(CAS 452333-40-3)
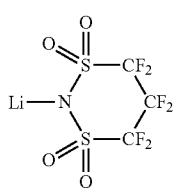
Li (cTFSI)
(CAS 189217-62-7)
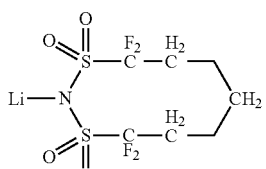
(CAS 952724-91-3)
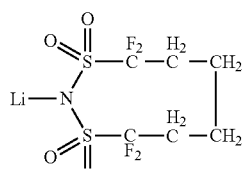
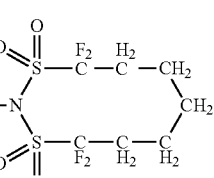
(CAS 1438398-52-7)
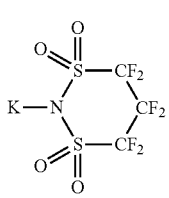
(CAS 588668-97-7)
TABLE 2-continued
Compounds of formula (Ia) which can be suitable used for an hole injection layer (HIL)
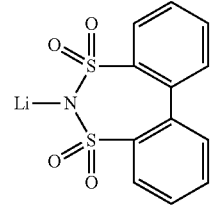
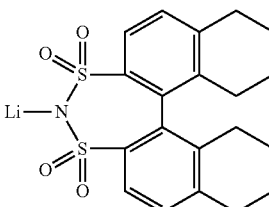
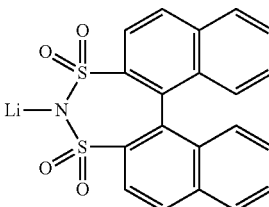
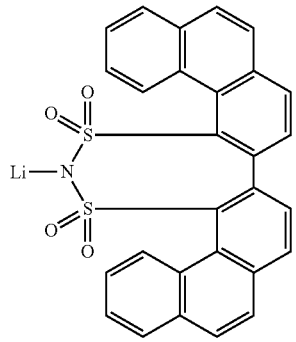
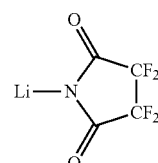
(CAS 950854-45-2)
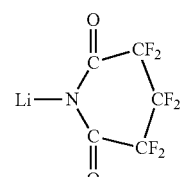
(CAS 912365-07-2)

TABLE 2-continued
Compounds of formula (Ia) which can be suitable used for an hole injection layer (HIL)
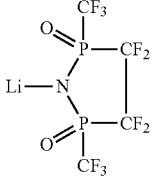
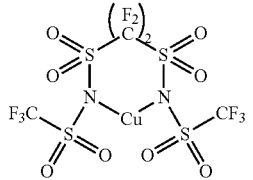
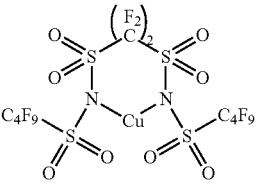
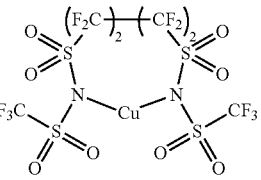
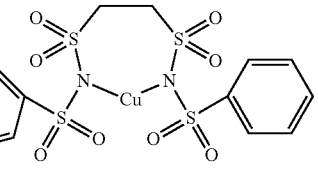
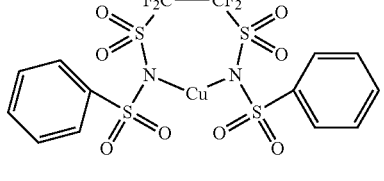
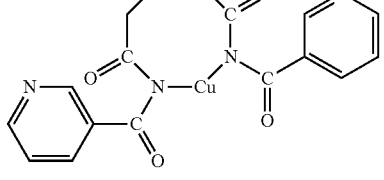
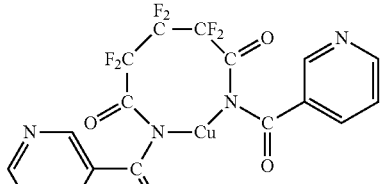
TABLE 2-continued
Compounds of formula (Ia) which can be suitable used for an hole injection layer (HIL)
(CAS 148941-25-7)
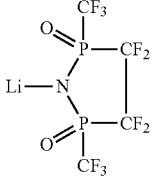
(CAS 1268706-46-2)
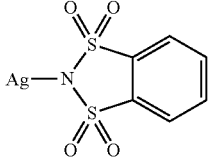
(CAS 1268706-43-9)
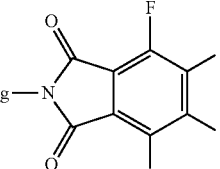
(CAS 583820-23-9)
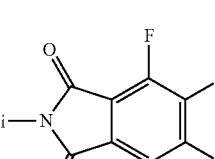
(CAS 388083-20-3)
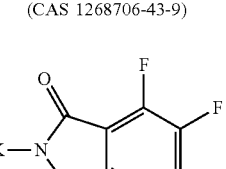
(CAS 420087-16-7)

TABLE 2-continued
Compounds of formula (Ia) which can be suitable used for an hole injection layer (HIL)
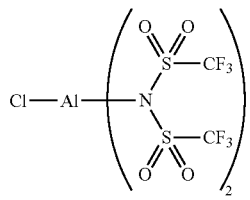
(CAS 1143503-13-2)
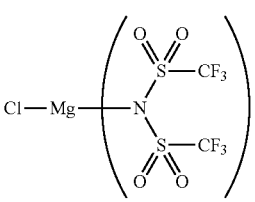
(CAS 1615694-75-1)
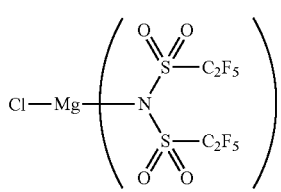
(CAS 1615694-76-2)
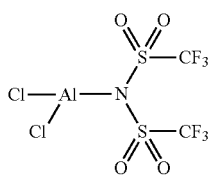
(CAS 1143503-13-2)
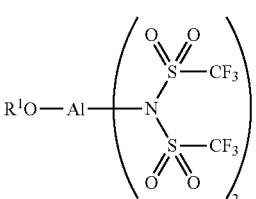
$R^1$ = Me, iso-Pr, Ph $C_6F_5$
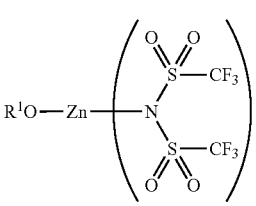
$R^1$ = Me, iso-$C_3H_7$, iso-$C_3F_7$, Ph, $C_6F_5$
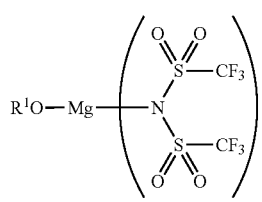
$R^1$ = Me, iso-$C_3H_7$, iso-$C_3F_7$, Ph, $C_6F_5$
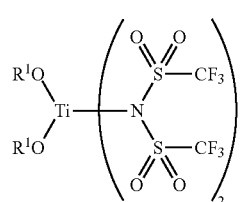
$R^1$ = Me, iso-Pr, Ph, $C_6F_5$
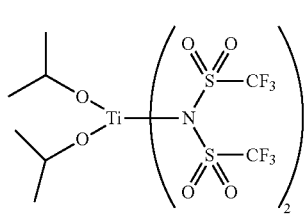
(CAS 1238864-15-7)
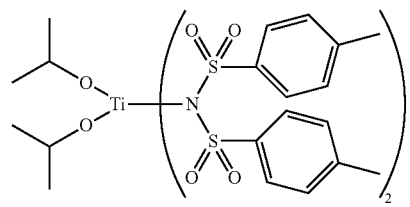
(CAS 1238864-12-4)
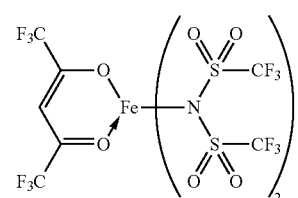
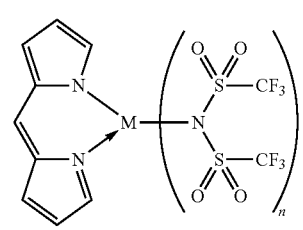

TABLE 2-continued

Compounds of formula (Ia) which can be suitable used for an hole injection layer (HIL)

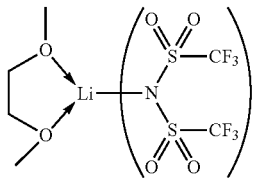

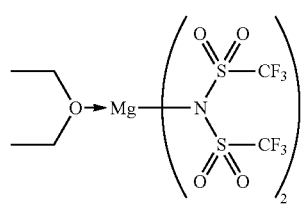

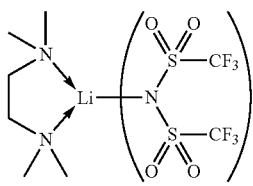

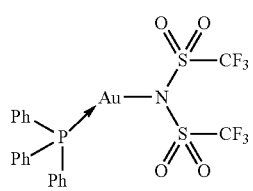

(CAS 1267726-07-7)

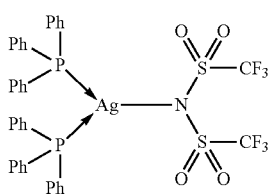

(CAS 1352150-27-6)

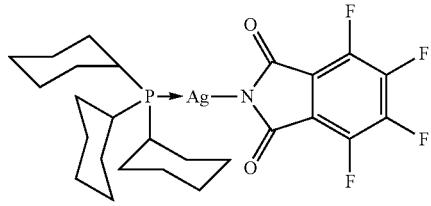

(CAS 1268706-53-1)

Compounds Used in the Hole Transport Layer (HTL)

The HTL may be formed of any compound that is commonly used to form a HTL. Compound that can be suitably used is disclosed for example in Y. Shirota and H. Kageyama, Chem. Rev. 2007, 107, 953-1010 an incorporated by reference. Examples of the compound that may be used to form the HTL 140 are: a carbazole derivative, such as N-phenylcarbazole or polyvinylcarbazole; an amine derivative having an aromatic condensation ring, such as N,N'-bis(3-methylphenyl)-N,N'-diphenyl-[1,1-biphenyl]-4, 4'-diamine (T-1), or N,N'-di(naphthalene-1-yl)-N,N'-diphenyl benzydine (alpha-NPD); and a triphenylamine-based compound, such as 4,4',4"-tris(N-carbazolyl)triphenylamine (T-10). Among these compounds, T-10 can transport holes and inhibit excitons from being diffused into the EML.

According to a preferred aspect, the hole transport layer may comprises in addition a triarylamine compound having the Formula VIIa:

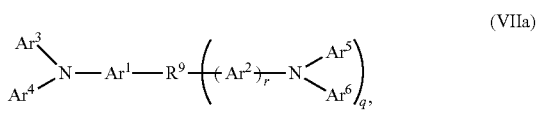

wherein:
  $Ar^1$ and $Ar^2$=independently selected from substituted or unsubstituted $C_6$ to $C_{20}$ arylene;
  $Ar^3$ and $Ar^4$=independently selected from substituted or unsubstituted $C_6$ to $C_{20}$ aryl;
  $Ar^3$ and $Ar^4$=independently selected from substituted or unsubstituted $C_6$ to $C_{20}$ aryl or $C_5$ to $C_{40}$ heteroaryl;
  $R^9$=a single chemical bond, a unsubstituted or substituted $C_1$ to $C_6$ alkyl and unsubstituted or substituted $C_1$ to $C_5$ heteroalkyl;
  q=0, 1 or 2;
  r=0 or 1;
wherein
  the substituents for $Ar^1$ to $Ar^6$ are independently selected from $C_1$ to $C_{20}$ alkyl, $C_1$ to $C_{20}$ heteroalkyl, or halide; and
  the substitutents for $R^9$ are independently selected from $C_1$ to $C_6$ alkyl, $C_1$ to $C_5$ heteroalkyl, $C_6$ to $C_{20}$ aryl and $C_5$ to $C_{20}$ heteroaryl.

According to a further preferred aspect, the hole transport layer may comprises a triarylamine compound of Formula VIIa, wherein $Ar^1$ and $Ar^2$ are Ph; $Ar^3$ to $Ar^6$ are selected from phenyl, tolyl, xylyl, mesityl, biphenyl, 1-naphthyl, 2-napthyl, 2-(9,9-dialkyl-fluorenyl), 2-(9-alkyl-9'-aryl-fluorenyl) and 2-(9,9-diaryl-fluorenyl); $R^9$=single bond; r=1 and q=1.

According to a further preferred aspect, the hole transport layer may comprises a triarylamine compound of Formula VIIa, wherein $Ar^1$ and $Ar^2$ are independently selected from phenyl and biphenyl; $Ar^3$ to $Ar^6$ are selected from phenyl, tolyl, xylyl, mesityl, biphenyl, 1-naphthyl, 2-napthyl, 2-(9, 9-dialkyl-fluorenyl), 2-(9-alkyl-9'-aryl-fluorenyl) and 2-(9,9-diaryl-fluorenyl); $R^9$=single bond; r=1 and q=1.

According to a further preferred aspect, the hole transport layer may comprises a triarylamine compound of Formula VIIa, wherein $Ar^1$ and $Ar^2$ are phenyl; $Ar^3$ to $Ar^6$ are selected from phenyl, tolyl, xylyl, mesityl, biphenyl, 1-naphthyl, 2-napthyl, 2-(9,9-dialkyl-fluorenyl), 2-(9-alkyl-9'-aryl-fluorenyl) and 2-(9,9-diaryl-fluorenyl); $R^9$=9,9'-fluorenyl; r=1 and q=1.

According to a further preferred aspect, the hole transport layer may comprises a triarylamine compound of Formula VIIa, wherein $Ar^1$ is phenyl; $Ar^3$ to $Ar^6$ are selected from phenyl, tolyl, xylyl, mesityl, biphenyl, 1-naphthyl, 2-napthyl, 2-(9,9-dialkyl-fluorenyl), 2-(9-alkyl-9'-aryl-fluorenyl) and 2-(9,9-diaryl-fluorenyl); $R^9$=single bond; r=0 and q=1. The substituent on $Ar^1$ is selected from phenyl, biphenyl, 2-(9,9-dialkyl-fluorenyl), 2-(9-alkyl-9'-aryl-fluorenyl) and 2-(9,9-diaryl-fluorenyl).

According to a further preferred aspect, the hole transport layer may comprises a triarylamine compound of Formula VIIa, wherein N, $Ar^1$ and $Ar^3$ form a carbazole ring; $Ar^2$ is phenyl or biphenyl; $Ar^3$ to $Ar^6$ are selected from phenyl, tolyl, xylyl, mesityl, biphenyl, 1-naphthyl, 2-napthyl, 2-(9,9-dialkyl-fluorenyl), 2-(9-alkyl-9'-aryl-fluorenyl) and 2-(9,9-diaryl-fluorenyl); $R^9$=single bond; r=1 and q=1.

Preferably in Formula VIIa the q may be selected from 1 or 2.

Compounds of formula VIIa that can be suitable used as HTL-material may have an molecular weight suitable for thermal vacuum deposition and HOMO levels that provides a good hole transport performance into the emission layer.

According to a more preferred embodiment the $Ar^1$ and $Ar^2$ of Formula VIIa may be independently selected from phenylene, biphenylene, naphthylene, anthranylene, carbazolylene, or fluorenylene, preferably from phenylene or biphenylene.

According to a more preferred embodiment the $Ar^3$ to $Ar^6$ of Formula VIIa may be independently selected from phenyl, biphenyl, terphenyl, quartphenyl, fluorenyl, napthyl, anthranyl, phenanthryl, thiophenyl, fluorenyl, or carbazolyl.

Even more preferred, $Ar^3$ to $Ar^6$ of Formula VIIa may be independently selected from phenyl, biphenyl, fluorenyl, napthyl, thiopheneyl, fluorenyl, or carbazolyl.

At least two of $Ar^1$ to $Ar^6$ of Formula VIIa may form a cyclic structure, for example $Ar^1$ and $Ar^3$; or $Ar^1$ and $Ar^4$; or $Ar^2$ and $Ar^y$; or $Ar^2$ and $Ar^6$; may be a carbazole, phenazoline or phenoxazine ring.

Further preferred, at least one of $Ar^1$ to $Ar^6$ of Formula VIIa may be unsubstituted, even more preferred at least two of $Ar^1$ to $Ar^6$ of Formula VII may be unsubstituted. Compounds of formula VIIa, wherein not all $Ar^1$ to $Ar^6$ are substituted are particularly suited for vacuum thermal deposition.

Preferably, the hole transport layer comprises a triarylamine compound of formula VIIa I, wherein the substituents on $Ar^3$ to $Ar^6$ are independently selected from $C_1$ to $C_{12}$ alkyl, $C_1$ to $C_{12}$ alkoxy or halide, preferably from $C_1$ to $C_8$ alkyl, $C_1$ to $C_8$ heteroalkyl or fluoride, even more preferred from $C_1$ to $C_5$ alkyl, $C_1$ to $C_5$ heteroalkyl or fluoride.

Preferably, the hole transport layer comprises a triarylamine compound of formula VIIa, wherein the substituents on $Ar^3$ to $Ar^6$ are independently selected from $C_1$ to $C_{12}$ alkyl or halide, preferably from $C_1$ to $C_8$ alkyl, even more preferred from $C_1$ to $C_5$ alkyl. When the substituents are selected from alkyl groups, the HOMO level of the hole transport layer may have a HOMO level suitable for good hole transport into the emission layer, in particular of phosphorescent blue and green emitters and emission which relies on TADF (thermally activated delayed fluorescence) and the OLED may have low voltage, high efficiency and good stability.

Examples of particularly preferred compounds of Formula VIIa are shown in Table 3.

TABLE 3

Triarylamine compounds of formula VIIa

| Name | Structure | HOMO (eV) |
|---|---|---|
| N,N,N',N'-Tetrakis(4-methylphenyl)-benzidine (T-1) | 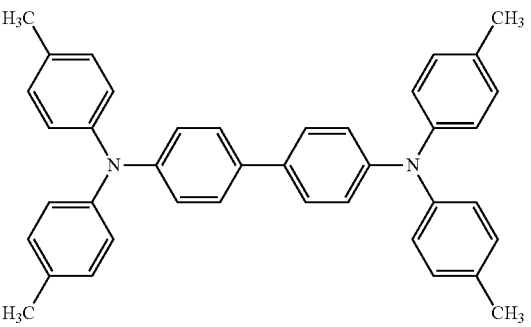 [SMILES: Cc1ccc(N(c2ccc(C)cc2)c2ccc(-c3ccc(N(c4ccc(C)cc4)c4ccc(C)cc4)cc3)cc2)cc1] | −4.99 |

TABLE 3-continued
Triarylamine compounds of formula VIIa
| Name | Structure | HOMO (eV) |
|---|---|---|
| N4,N4,N4',N4'-tetra(biphenyl-4-yl)biphenyl-4,4'-diamine (T-2) | 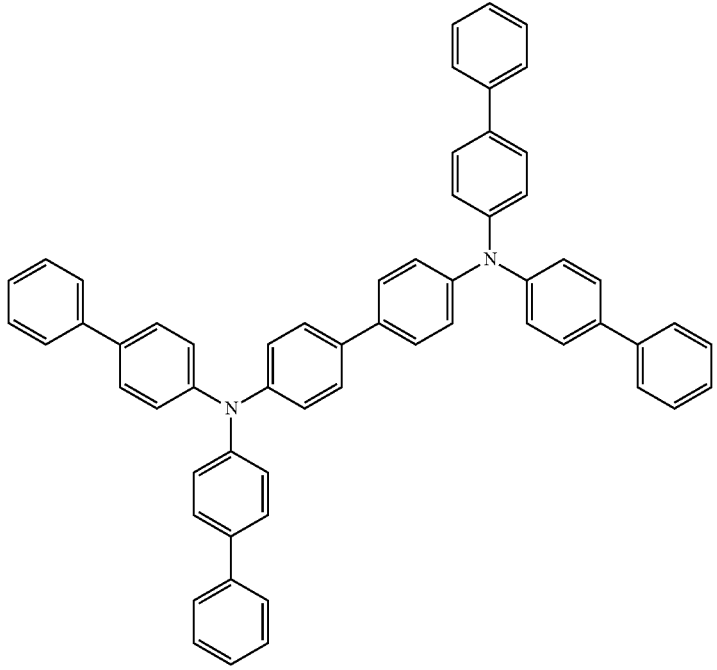 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | −5.08 |
| Biphenyl-4-yl(9,9-diphenyl-9H-fluoren-2-yl)-[4-(9-phenyl-9H-carbazol-3-yl)phenyl]-amine (T-3) | 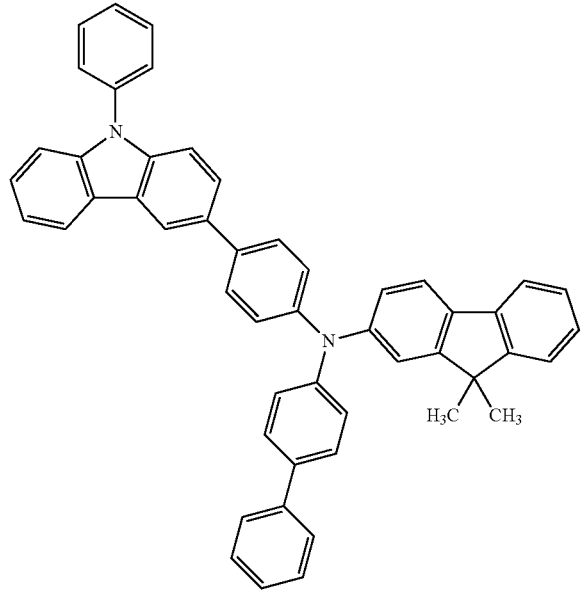 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] | −5.10 |
| N,N'-Bis(naphthalen-1-yl)-N,N'-bis(phenyl)-benzidine (T-4) | 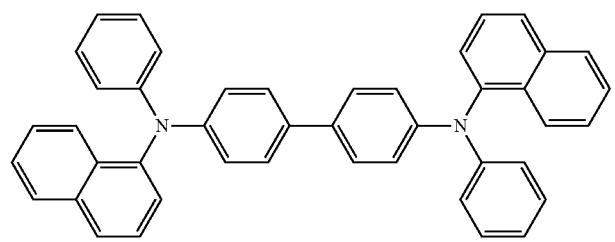 [SMILES: c1ccc(N(c2ccc(-c3ccc(N(c4ccccc4)c4cccc5ccccc45)cc3)cc2)c2cccc3ccccc23)cc1] | −5.11 |

TABLE 3-continued

Triarylamine compounds of formula VIIa

| Name | Structure | HOMO (eV) |
|---|---|---|
| N1,N3-di([1,1'-biphenyl]-4-yl)-5-(9,9-dimethyl-9H-fluoren-2-yl)-N1,N3-bis(3,5-dimethylphenyl)benzene-1,3-diamine (T-5) | | −5.18 |
| N1,N3-di([1,1'-biphenyl]-4-yl)-5-(9,9-dimethyl-9H-fluoren-2-yl)-N1,N3-dimesitylbenzene-1,3-diamine (T-6) | | −5.22 |

TABLE 3-continued

Triarylamine compounds of formula VIIa

| Name | Structure | HOMO (eV) |
|---|---|---|
| N,N'-((9H-fluorene-9,9-diyl)bis(4,1-phenylene))bis(N-([1,1'-biphenyl]-4-yl)-[1,1'-biphenyl]-4-amine) (T-7) | | −5.24 |
| N4,N4''-di(naphthalen-1-yl)-N4,N4''-diphenyl-[1,1':4',1''-terphenyl]-4,4''-diamine (CAS 139255-16-6) (T-8) | | −5.25 |
| 4,4'-Bis-(N-(1-naphthyl)-N-phenyl-amino)-quaterphenyl (CAS 650609-47-5) (T-9) | | −5.33 |
| 4,4',4''-Tris(carbazol-9-yl)-triphenylamine (T-10) | | −5.7 |

According to another aspect, the hole injection layer (HIL) may comprises about ≤2 wt.-% of a triarylamine compound, wherein the triarylamine compound differs from the charge neutral metal amide compound according to formula Ia to Id.

According to another aspect, the hole injection layer (HIL) may comprises about ≤2 wt.-% of a triarylamine compound according to the general Formula VIIa.

According to another aspect, the hole injection layer (HIL) may be free of a triarylamine compound according to the general Formula VIIa.

More preferred the hole injection layer (HIL) may be free of a triarylamine compound.

Other examples of the compounds that may be used for forming the HTL 140 are oligothiophenes and phthalocyanines disclosed for example in Yasuhiko Shirota and Hiroshi Kageyama, Chem. Rev. 2007, 107, 953-1010 and in Facchetti, Materials Today 10, 2007, 28 and incorporated by reference.

Compounds Used in the Electron Transport Layer (ETL)

The OLED according to the present invention may not contain an electron transport layer (ETL). However, the OLED according to the present invention may optional contain an electron transport layer (ETL).

According to various embodiments the OLED may comprises an electron transport layer or an electron transport layer stack comprising at least a first electron transport layer and at least a second electron transport layer.

According to various embodiments of the OLED of the present invention the electron transport layer may comprises at least one matrix compound.

According to various embodiments of the OLED the matrix compound may be selected from:
- an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole and/or N4,N4''-di(naphthalen-1-yl)-N4,N4''-diphenyl-[1,1': 4',1''-terphenyl]-4,4''-diamine;
- a phosphine oxide based compound, preferably (3-(dibenzo[c,h]acridin-7-yl)phenyl)diphenylphosphine oxide and/or phenyl bis(3-(pyren-1-yl)phenyl)phosphine oxide and/or 3-Phenyl-3H-benzo[b]dinaphtho[2,1-d:1',2'-f]phosphepine-3-oxide; or
- a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline.

According to various embodiments of the OLED the matrix compound of the electron transport layer may be preferably selected from:
- a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide; or
- a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline.

According to various embodiments of the OLED the matrix compound of the electron transport layer may be more preferred selected from:
- a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide.

According to various embodiments of the OLED of the present invention the thicknesses of the electron transport layer may be in the range of about ≥0.5 nm to about ≤95 nm, preferably of about ≥3 nm to about ≤80 nm, further preferred of about ≥5 nm to about ≤60 nm, also preferred of about ≥6 nm to about ≤40 nm, in addition preferred about ≥8 nm to about ≤20 nm and more preferred of about ≥10 nm to about ≤18 nm.

According to various embodiments of the OLED of the present invention the thicknesses of the electron transport layer stack can be in the range of about ≥25 nm to about ≤100 nm, preferably of about ≥30 nm to about ≤80 nm, further preferred of about ≥35 nm to about ≤60 nm, and more preferred of about ≥36 nm to about ≤40 nm.

According to various embodiments of the OLED of the present invention the electron transport layer may comprises:
a) about ≥10 wt.-% to about ≤70 wt.-%, preferably about ≥20 wt.-% to about ≤65 wt.-% and also preferred about ≥50 wt.-% to about ≤60 wt.-% of a lithium halide or an lithium organic complex of a lithium quinolate, a lithium borate, a lithium phenolate and/or a lithium Schiff base, preferably of a lithium quinolate complex has the formula I, II or III:

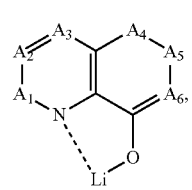

(I)

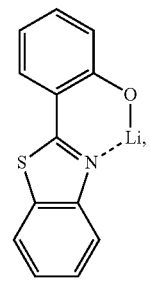

(II)

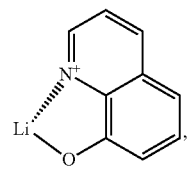

(III)

wherein
A1 to A6 are same or independently selected from CH, CR, N, O,
R is same or independently selected from hydrogen, halogen, alkyl or aryl or heteroaryl with 1 to 20 carbon atoms, and more preferred of a lithium 8-hydroxyquinolate;
b) about ≤90 wt.-% to about ≥30 wt.-%, preferably about ≤80 wt.-% to about ≥35 wt.-% and also preferred about ≤50 wt.-% to about ≥40 wt.-% of a matrix compound of:
an anthracene based compound or a hetero substituted anthracene based compound, preferably 2-(4-(9,10-di (naphthalen-2-yl)anthracene-2-yl)phenyl)-1-phenyl-1H-benzo[d]imidazole and/or N4,N4"-di(naphthalen-1-yl)-N4,N4"-diphenyl-[1,1': 4',1"-terphenyl]-4,4"-diamine; or a phosphine oxide based compound, preferably (3-(dibenzo[c,h]acridin-7-yl)phenyl)diphenylphosphine oxide and/or phenyl bis(3-(pyren-1-yl)phenyl)phosphine oxide and/or 3-Phenyl-3H-benzo[b]dinaphtho[2,1-d:1',2'-f]phosphepine-3-oxide; or a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline; whereby more preferred is a phosphine oxide based compound and most preferred is (3-(dibenzo[c,h]acridin-7-yl)phenyl) diphenylphosphine oxide;

based on the total weight of the electron transport layer.

According to one embodiment of the OLED, the electron transport layer comprises of about ≥50 wt.-% to about ≤60 wt.-% of a first lithium halide or a first lithium organic complex and about ≤50 wt.-% to about ≥40 wt.-% of a matrix compound of:

a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl) phenyl)phosphine oxide; or a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline.

The light-emitting diode (OLED) may comprises at least two electrodes, an anode electrode and a second cathode electrode.

The electron transport layer/s or electron transport layer stack is not an electrode. The electron transport layer/s or electron transport layer are sandwiched between two electrodes, namely sandwiched between an anode and a second cathode.

The ETL may be formed optional on an EML or on the HBL if the HBL is formed. The ETL includes a first layer including a first lithium halide or a first lithium organic complex; and optional a second electron transport layer including a second lithium halide or a second lithium organic complex, wherein optional the first lithium organic complex is not the same as the second lithium organic complex and wherein the first lithium halide is not the same as the second lithium halide.

The ETL includes a first layer comprising a first matrix compound and a lithium halide or a lithium organic complex; and optional a second electron transport layer comprising a second matrix compound and a metal dopant selected from a group comprising alkali, alkaline earth and rare earth metals.

The ETL includes a first layer comprising a first matrix compound and a lithium halide or a lithium organic complex; and optional a second electron transport layer comprising a second matrix compound and is free of dopant.

The ETL may have a stacked structure, preferably of two ETL-layers, so that injection and transport of electrons may be balanced and holes may be efficiently blocked. In a conventional OLED, since the amounts of electrons and holes vary with time, after driving is initiated, the number of excitons generated in an emission area may be reduced. As a result, a carrier balance may not be maintained, so as to reduce the lifetime of the OLED.

However, in the ETL, the first layer and the second layer may have similar or identical energy levels, so that the carrier balance may be uniformly maintained, while controlling the electron-transfer rate.

Matrix compound for the electron layer that can be suitable used are selected from the group comprising anthracen compounds, preferably 2-(4-(9,10-di(naphthalen-2-yl) anthracen-2-yl)phenyl)-1-phenyl-1H-benzo[d]imidazole Anthracene compounds that can be used as matrix materials are disclosed in U.S. Pat. No. 6,878,469 B and incorporated by reference.

Other matrix compounds that can be used are diphenylphosphine oxide, preferably (3-(dibenzo[c,h]acridin-7-yl)phenyl)diphenylphosphine oxide, phenylbis(3-(pyren-1-yl)phenyl)phosphine oxide, 3-phenyl-3H-benzo[b]dinaphtho[2,1-d:1 ', 2'-f]phosphepine-3-oxide, phenyldi (pyren-1-yl)phosphine oxide.

Diphenylphosphine oxide compounds that can be used as matrix materials are disclosed in EP 2395571 A1, WO2013079217 A1, EP 13187905, EP13199361 and JP2002063989 A1, incorporated by reference.

Other suitable matrix compounds that can be used are phenanthroline compounds, preferably selected from the group comprising of 2,4,7,9-tetraphenyl-1,10-phenanthroline, 4,7-diphenyl-2,9-di-p-tolyl-1,10-phenanthroline, and 2,9-di(biphenyl-4-yl)-4,7-diphenyl-1,10-phenanthroline. Phenanthroline compounds that can be used as matrix materials are disclosed in EP 1786050 A1 and incorporated by reference.

The matrix compound of the electron transport layer may be a compound that efficiently transports electrons, such as an anthracene-based compound, diphenylphosphine oxide based compound, or a phenanthroline based compound, preferably a matrix compound mentioned in Table 4. For example, the matrix compound of the electron transport layer may be selected from the group consisting of Compound 5, a compound represented by Formula 2, and a compound represented by Formula 3 below:

Compound 5

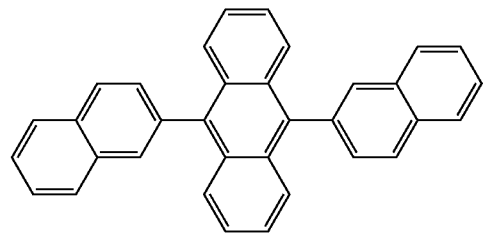

Formula 2

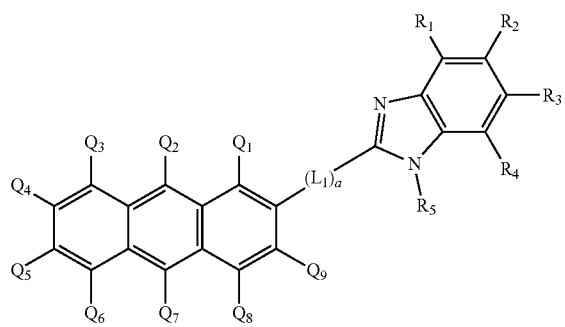

Formula 3

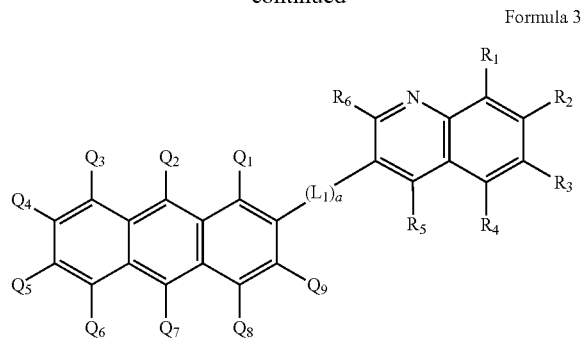

In Formulae 2 and 3, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group. At least two adjacent $R_1$ to $R_6$ groups are optionally bonded to each other, to form a saturated or unsaturated ring. Li is a bond, a substituted or unsubstituted $C_1$-$C_{30}$ alkylene group, a substituted or unsubstituted $C_6$-$C_{30}$ arylene group, or a substituted or unsubstituted $C_3$-$C_{30}$ hetero arylene group. $Q_1$ through $Q_9$ are each independently a hydrogen atom, a substituted or unsubstituted $C_6$-$C_{30}$ aryl group, or a substituted or unsubstituted $C_3$-$C_{30}$ hetero aryl group, and "a" is an integer from 1 to 10.

For example, $R_1$ to $R_6$ may be each independently selected from the group consisting of a hydrogen atom, a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group.

In particular, in Formula 2 and/or 3, $R_1$ to $R_4$ may each be a hydrogen atom, $R_5$ may be selected from the group consisting of a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group. In addition, in Formula 3, $R_1$ to $R_6$ may each be a hydrogen atom.

For example, in Formula 2 and/or 3, $Q_1$ to $Q_9$ are each independently a hydrogen atom, a phenyl group, a naphthyl group, an anthryl group, a pyridinyl group, and a pyrazinyl group. In particular, in Formulae 2 and/or 3, $Q_1$, $Q_3$-$Q_6$, $Q_8$ and $Q_9$ are hydrogen atoms, and $Q_2$ and $Q_7$ may be each independently selected from the group consisting of a phenyl group, a naphthyl group, an anthryl group, a pyridinyl group, and a pyrazinyl group.

For example, $L_1$, in Formula 2 and/or 3, may be selected from the group consisting of a phenylene group, a naphthylene group, an anthrylene group, a pyridinylene group, and a pyrazinylene group. In particular, Li may be a phenylene group or a pyridinylene group. For example, "a" may be 1, 2, or 3.

The matrix compound for the ETL-layer may be further selected from Compound 5, 6, or 7 below:

Compound 6

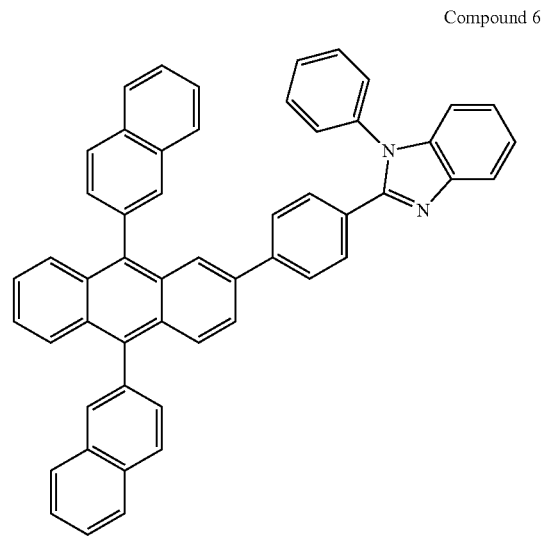

Compound 7

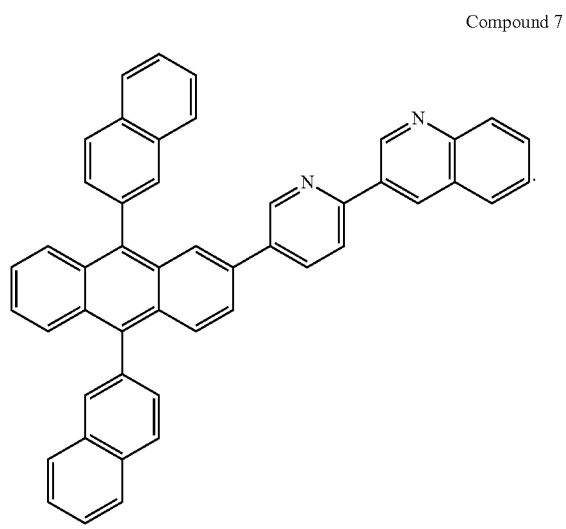

TABLE 4

Chemical structures of matrix materials that can be suitable used for ETL-layer

| Internal name | IUPAC name | Structure | Reference |
|---|---|---|---|
| MX 1 | 2-(4-(9,10-di(naphthalen-2-yl)anthracen-2-yl)phenyl)-1-phenyl-1H-benzo[d]imidazole | | U.S. Pat. No. 6,878,469 B2. |
| MX 2 | (3-(dibenzo[c,h]acridin-7-yl)phenyl)diphenylphosphine oxide | | EP 2395571B1, WO2013079217A1 |
| MX 3 | Phenylbis(3-(pyren-1-yl)phenyl)phosphine oxide | | EP13187905.8 |

TABLE 4-continued

Chemical structures of matrix materials that can be suitable used for ETL-layer

| Internal name | IUPAC name | Structure | Reference |
|---|---|---|---|
| MX 4 | 3-Phenyl-3H-benzo[b]dinaphtho[2,1-d:1',2'-f]phosphepine-3-oxide | | EP13199361.0 |
| MX 5 | Phenyldi(pyren-1-yl)phosphine oxide | | JP4876333 |
| MX 6 | 2,4,7,9-tetraphenyl-1,10-phenanthroline | | EP1786050 |
| MX 8 | 2,9-di(biphenyl-4-yl)-4,7-diphenyl-1,10-phenanthroline | | EP1786050 |

TABLE 4-continued

Chemical structures of matrix materials that can be suitable used for ETL-layer

| Internal name | IUPAC name | Structure | Reference |
|---|---|---|---|
| MX 9 | 4,7-diphenyl-2,9-di-p-tolyl-1,10-phenanthroline | (structure) | EP1786050 |

The electron transport layer may comprises a lithium halide or a lithium organic complex.

Suitable organic ligands to form a lithium organic complex that can be used for the electron transport layer are disclosed, and incorporated by reference, for example in US 2014/0048792 and Kathirgamanathan, Poopathy; Arkley, Vincent; Surendrakumar, Sivagnanasundram; Chan, Yun F.; Ravichandran, Seenivasagam; Ganeshamurugan, Subramaniam; Kumaraverl, Muttulingam; Antipan-Lara, Juan; Paramaswara, Gnanamolly; Reddy, Vanga R., Digest of Technical Papers—Society for Information Display International Symposium (2010), 41(Bk. 1), 465-468.

TABLE 5

Lithium organic complex that can be suitable used for the ETL-layer

| | IUPAC name | Structure | Reference |
|---|---|---|---|
| LiQ | lithium 8-hydroxyquinolate | (structure) | WO 2013079217 A1 |
| Li-1 | lithium tetra(1H-pyrazol-1-yl)borate | (structure) | WO 2013079676 A1 |
| Li-2 | lithium 2-(diphenyl-phosphoryl)phenolate | (structure) | WO 2013079678A1 |
| Li-3 | lithium 2-(pyridin-2-yl)phenolate | (structure) | JP2 008195623 |

TABLE 5-continued

Lithium organic complex that can be suitable used for the ETL-layer

| | IUPAC name | Structure | Reference |
|---|---|---|---|
| Li-4 | lithium 2-(1-phenyl-1H-benzo[d]imidazol-2-yl)phenolate | | JP 2001291593, |
| Li-5 | lithium 2-(benzo[d]oxazol-2-yl)phenolate | | US 20030165711 |
| Li-6 | lithium 2-(diphenyl-phosphoryl)pyridin-3-olate | | EP 2724388 |

The organic ligand of the lithium organic complex of the electron transport layer may be selected from the group comprising a quinolate, a borate, a phenolate, a pyridinolate or a Schiff base ligand, or Table 5;

preferably the lithium quinolate complex has the formula I:

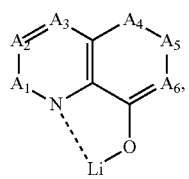

(I)

wherein

A1 to A6 are same or independently selected from CH, CR, N, O;

R is same or independently selected from hydrogen, halogen, alkyl or aryl or heteroaryl with 1 to 20 carbon atoms; and more preferred A1 to A6 are CH;

preferably the borate based organic ligand is a tetra(1H-pyrazol-1-yl)borate;

preferably the phenolate is a 2-(pyridin-2-yl)phenolate or a 2-(diphenylphosphoryl)phenolate;

preferably the lithium Schiff base has the structure 100, 101, 102 or 103:

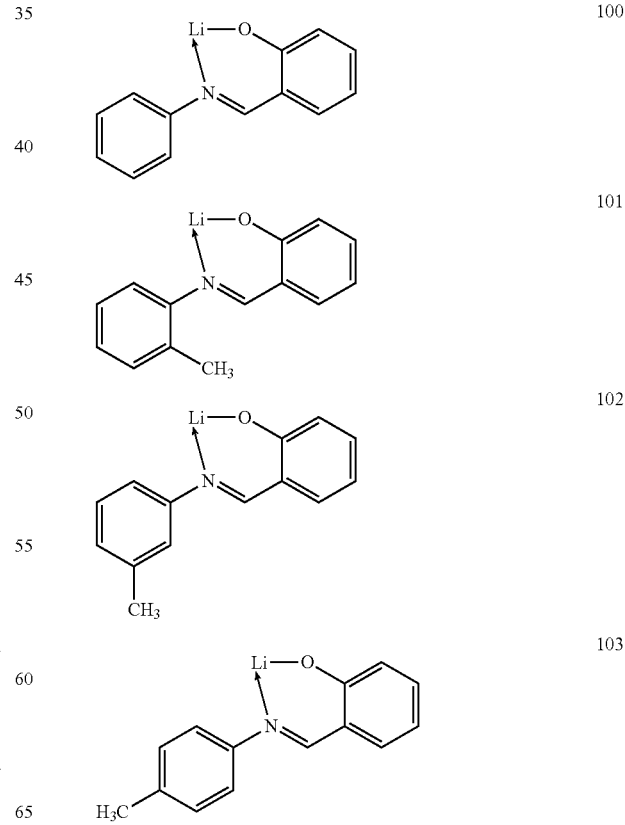

more preferred the lithium organic complex is selected from a compound of Table 2X. The lithium halide of the electron transport layer may be selected from the group comprising a LiF, LiCl, LiBr or LiJ, and preferably LiF.

The ETL may be formed on the EML by vacuum deposition, spin coating, slot-die coating, printing, casting, or the like. When the ETL is formed by vacuum deposition or spin coating, the deposition and coating conditions may be similar to those for formation of the HIL 130. However, the deposition and coating conditions may vary, according to a compound that is used to form the ETL.

Substrate

The substrate may be any substrate that is commonly used in manufacturing of organic light-emitting diodes. If light is emitted through the substrate, the substrate may be a transparent material, for example a glass substrate or a transparent plastic substrate, having excellent mechanical strength, thermal stability, transparency, surface smoothness, ease of handling, and waterproofness. If light is emitted through the top surface, the substrate may be a transparent or non-transparent material, for example a glass substrate, a plastic substrate, a metal substrate or a silicon substrate.

Anode Electrode

The anode electrode may be formed by depositing or sputtering a compound that is used to form the anode electrode. The compound used to form the anode electrode may be a high work-function compound, so as to facilitate hole injection. The anode material may also be selected from a low work function material (i.e. Aluminum). The anode electrode may be a transparent or reflective electrode. Transparent conductive compounds, such as indium tin oxide (ITO), indium zinc oxide (IZO), tin-dioxide ($SnO_2$), and zinc oxide (ZnO), may be used to form the anode electrode 120. The anode electrode 120 may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

The HIL may be formed on the anode electrode by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of $10^{-8}$ to $10^{-3}$ torr (1 torr equals 133.322 Pa), and a deposition rate of 0.1 to 10 nm/sec..

HIL—Forming Conditions

When the HIL is formed using spin coating or printing, coating conditions may vary according to a compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

HTL—Forming Conditions

The hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

Emission Layer (EML)

The EML may be formed on the HTL by vacuum deposition, spin coating, slot-die coating, printing, casting, LB, or the like. When the EML is formed using vacuum deposition or spin coating, the conditions for deposition and coating may be similar to those for the formation of the HIL. However, the conditions for deposition and coating may vary, according to the compound that is used to form the EML.

The emission layer (EML) may be formed of a combination of a host and a dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TB ADN), distyrylarylene (DSA), Bis(2-(2-hydroxyphenyl)benzo-thiazolate)zinc (Zn(BTZ) 2), E3 below, AND, Compound 1 below, and Compound 2 below.

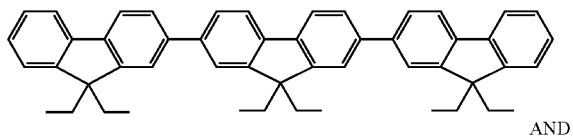

E3

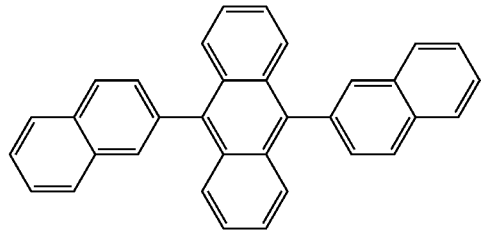

AND

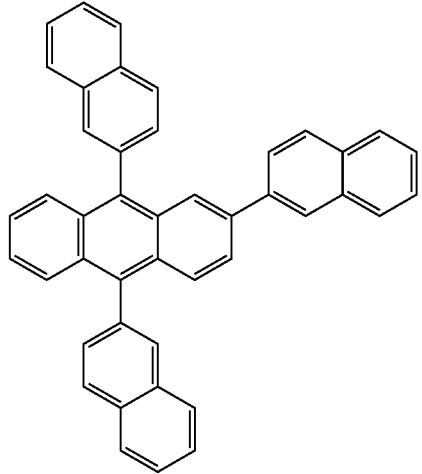

Compound 1

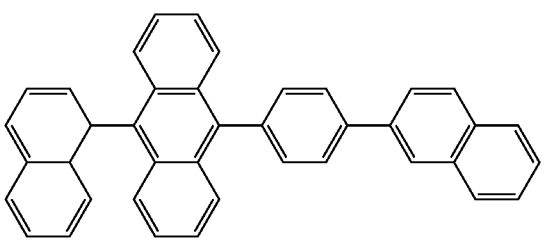

Compound 2

The dopant may be a phosphorescent or fluorescent emitter. Phosphorescent emitters are preferred due to their higher efficiency Examples of a red dopant are PtOEP, Ir(piq) 3, and Btp 21r(acac), but are not limited thereto. These compounds are phosphorescent emitters, however, fluorescent red dopants could also be used.

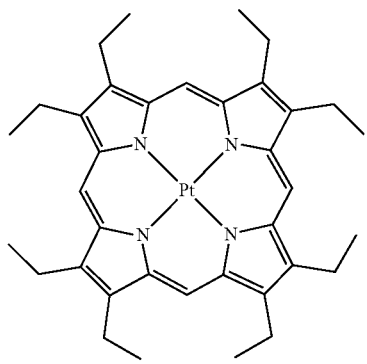

PtOEP

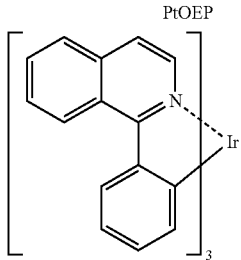

Ir(piq)₃

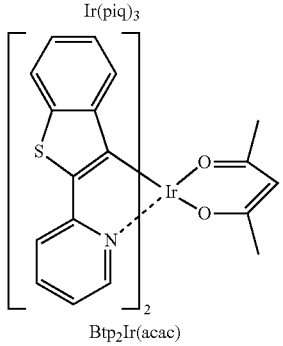

Btp₂Ir(acac)

Examples of a phosphorescent green dopant are Ir(ppy) 3 (ppy=phenylpyridine), Ir(ppy) 2(acac), Ir(mpyp) 3 are shown below. Compound 3 is an example of a fluorescent green emitter and the structure is shown below.

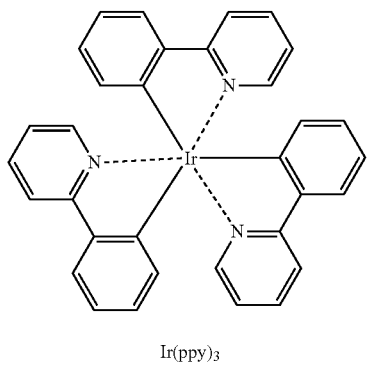

Ir(ppy)₃

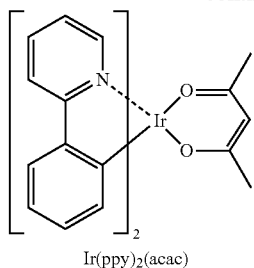

Ir(ppy)₂(acac)

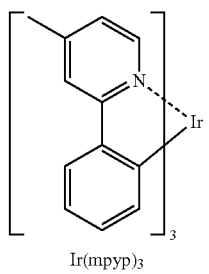

Ir(mpyp)₃

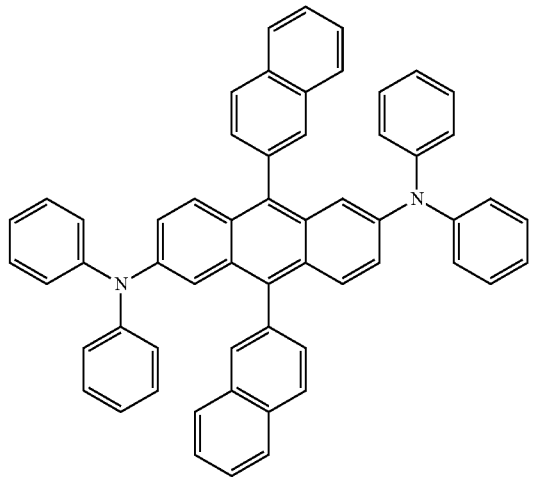

Compound 3

Examples of a phosphorescent blue dopant are F2Irpic, (F₂ppy)₂Ir(tmd) and Ir(dfppz) 3, ter-fluorene, the structures are shown below. 4,4'-bis(4-diphenyl amiostyryl)biphenyl (DPAVBi), 2,5,8,11-tetra-tert-butyl perylene (TBPe), and Compound 4 below are examples of fluorescent blue dopants.

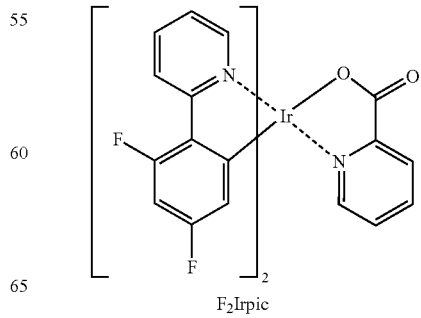

F₂Irpic

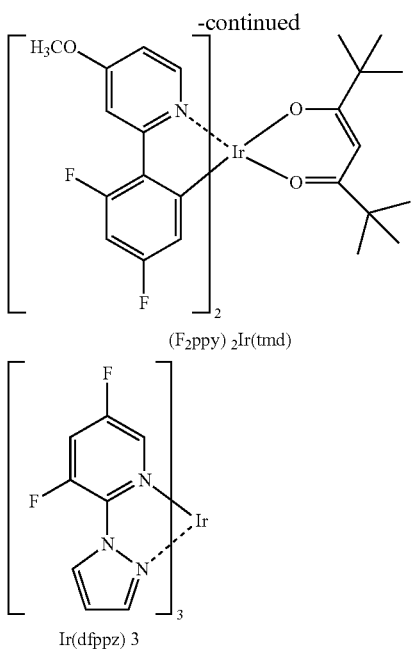

(F$_2$ppy)$_2$Ir(tmd)

Ir(dfppz)$_3$

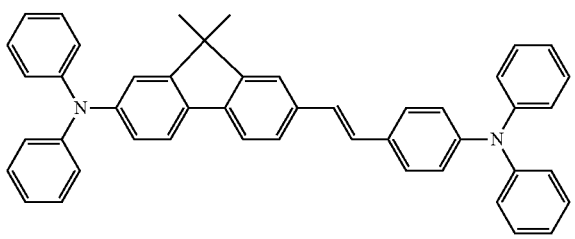

Compound 4

The amount of the dopant may be in the range of about 0.01 to about 50 parts by weight, based on 100 parts by weight of the host. The EML may have a thickness of about 10 nm to about 100 nm, for example, about 20 nm to about 60 nm. When the thickness of the EML is within this range, the EML may have excellent light emission, without a substantial increase in driving voltage.

Hole Blocking Layer (HBL)

When the EML comprises a phosphorescent dopant, a hole blocking layer (HBL) may be formed on the EML, by using vacuum deposition, spin coating, slot-die coating, printing, casting, LB deposition, or the like, in order to prevent the diffusion of triplet excitons or holes into the ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include an oxadiazole derivative, a triazole derivative, and a phenanthroline derivative.

The HBL may have a thickness of about 5 nm to about 100 nm, for example, about 10 nm to about 30 nm. When the thickness of the HBL is within this range, the HBL may have excellent hole-blocking properties, without a substantial increase in driving voltage.

Electron Injection Layer (EIL)

The optional EIL, which may facilitates injection of electrons from the cathode, may be formed on the ETL, preferably directly on the electron transport layer. Examples of materials for forming the EIL include LiF, NaCl, CsF, Li2O, BaO, Ca, Ba, Yb, Mg which are known in the art. Deposition and coating conditions for forming the EIL are similar to those for formation of the HIL, although the deposition and coating conditions may vary, according to a material that is used to form the EIL.

The thickness of the EIL may be in the range of about 0.1 nm to 10 nm, for example, in the range of 0.5 nm to 9 nm. When the thickness of the EIL is within this range, the EIL may have satisfactory electron-injecting properties, without a substantial increase in driving voltage.

Cathode Electrode

The cathode electrode is formed on the EIL if present. The cathode electrode may be a cathode, which is an electron-injecting electrode. The cathode electrode may be formed of a metal, an alloy, an electrically conductive compound, or a mixture thereof. The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. In addition, the cathode electrode may be formed of a transparent conductive material, such as ITO or IZO.

The thickness of the cathode electrode may be in the range of about 5 nm to 1000 nm, for example, in the range of 10 nm to 100 nm. When the cathode electrode is in the range of 5 nm to 50 nm, the electrode will transparent even if a metal or metal alloy is used.

Since the layers of the ETL have similar or identical energy levels, the injection and transport of the electrons may be controlled, and the holes may be efficiently blocked. Thus, the OLED may have long lifetime.

Light-Emitting Diode (OLED)

According to another aspect of the present invention, there is provided an organic light-emitting diode (OLED) comprising: a substrate; a anode electrode formed on the substrate; a hole injection layer comprising a metal amide according to the invention, a hole transport layer, an emission layer, and a cathode electrode.

According to another aspect of the present invention, there is provided an organic light-emitting diode (OLED) comprising a hole injection layer according to the invention and an emission layer.

According to another aspect of the present invention, there is provided an organic light-emitting diode (OLED) comprising:
  an anode, a hole injection layer according to the invention and an emission layer, wherein the hole injection layer is direct arranged on the anode and the emission layer is direct arranged on the hole injection layer; or
  an anode, a hole injection layer according to the invention, a hole transport layer and an emission layer, wherein the composition of the hole injection layer is different to the composition of the hole transport layer.

According to another aspect of the present invention, there is provided an organic light-emitting diode (OLED) comprising:
  an anode, a hole injection layer according to the invention and an emission layer, wherein the hole injection layer is direct arranged on the anode and the emission layer is direct arranged on the hole injection layer; or
  an anode, a hole injection layer according to the invention, a hole transport layer and an emission layer, wherein the composition of the hole injection layer is different to the composition of the hole transport layer;

wherein the hole injection layer comprises the charge neutral metal amide compound in the range of about ≥50 wt.-% to about ≤100 wt.-%, preferably about ≥60 wt.-% to about ≤100 wt.-%, further preferred about ≥70 wt.-% to about ≤100 wt.-%, in addition preferred about ≥80 wt.-% to about ≤100 wt.-%, or about ≥95 wt.-% to about ≤100 wt.-%, or about ≥98 wt.-% to about ≤100 wt.-%, or about ≥99 wt.-% to about ≤100 wt.-%, and more preferred about ≥90 wt.-% to about ≤100 wt.-% or about ≥95 wt.-% to about ≤99 wt.-%; or consist of a charge neutral metal amide compound according to the invention.

According to another aspect of the present invention, there is provided an organic light-emitting diode (OLED) comprising: a substrate; a anode electrode formed on the substrate; a hole injection layer comprising a metal amide according to the invention, a hole transport layer, an emission layer, hole blocking layer and a cathode electrode.

According to another aspect of the present invention, there is provided an organic light-emitting diode (OLED) comprising: a substrate; a anode electrode formed on the substrate; a hole injection layer comprising a charge neutral metal amide according to the invention, a hole transport layer, an emission layer, hole blocking layer, electron transport layer, and a cathode electrode.

According to another aspect of the present invention, there is provided an organic light-emitting diode (OLED) comprising: a substrate; a anode electrode formed on the substrate; a hole injection layer comprising a charge neutral metal amide according to the invention, a hole transport layer, an emission layer, hole blocking layer, electron transport layer, an electron injection layer, and a cathode electrode.

According to another aspect, there is provided an organic light-emitting diode (OLED) comprising: at least one layer selected from the group consisting of a hole injection layer, a hole transport layer, an emission layer, a hole blocking layer, an electron transport layer, exactly in that order between the anode electrode and the cathode electrode.

According to various embodiments of the present invention, there is provided an organic light-emitting diode (OLED) further comprising an electron injection layer formed between the electron transport layer and the cathode electrode.

According to various embodiments of the OLED of the present invention, the OLED may not comprises an electron injection layer.

According to various embodiments of the OLED of the present invention, the OLED may not comprises an electron transport layer.

According to various embodiments of the OLED of the present invention, the OLED may not comprises an electron transport layer and an electron injection layer.

According to another aspect of the present invention, there is provided a method of manufacturing an organic light-emitting diode (OLED), the method using:
  at least one deposition source, preferably two deposition sources and more preferred at least three deposition sources; and/or
  deposition via vacuum thermal evaporation; and/or
  deposition via solution processing, preferably the processing is selected from spin-coating, printing, casting and/or slot-die coating.

Method of Manufacture

According to various embodiments of the present invention, the method may further include forming on the anode electrode an hole injection layer, an hole transport layer, an emission layer and a cathode electrode, exactly in that order.

According to various embodiments of the present invention, the method may further include forming on the anode electrode an hole injection layer, an hole transport layer, an emission layer, an electron transport layer, and a cathode electrode, exactly in that order.

According to various embodiments of the present invention, the method may further include forming on the anode electrode an hole injection layer, an hole transport layer, hole blocking layer, an emission layer, an electron transport layer, and a cathode electrode, exactly in that order.

According to various embodiments of the present invention, the method may further include the steps for forming an organic light-emitting diode (OLED), wherein
  on a substrate a anode electrode is formed,
  on the anode electrode an hole injection layer is formed,
  on the hole injection layer an hole transport layer is formed,
  optional on the hole transport layer a hole blocking layer is formed,
  than an emission layer is formed thereon,
  on the emission layer optional an electron transport layer is formed, preferably an electron transport layer stack,
  finally a cathode electrode is formed thereon,
  optional an electron injection layer is formed between the electron transport layer and the cathode electrode.

The method of manufacturing the OLED may comprising the steps:
  the hole injection layer according to the invention is deposited on an anode layer, an optional hole transport layer is deposited on the hole injection layer, an emission layer is deposited on the hole transport layer, an optional hole blocking layer is deposited on the emission layer, an optional electron transport layer is deposited on the hole blocking layer, an optional electron injection layer is deposited on the electron transport layer and a cathode is deposited on the electron injection layer, wherein the layers are arranged in that order and sandwiched between the anode and the cathode.

However, according to one aspect the layers are deposited the other way around, starting with the cathode, and sandwiched between the cathode and the anode.

For example, starting with the cathode layer, optional electron injection layer, electron transport layer, optional hole blocking layer, emission layer, hole transport layer, hole injection layer, anode electrode, exactly in this order.

The anode electrode and/or the cathode electrode can be deposit on a substrate. Preferably the anode is deposit on a substrate.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which:

FIG. 4 is an overview of metal amides based on general Formula Ia that can be used according to the invention.

FIG. 5 is an overview of metal amides that can be used according to the invention with specific A1 and A2, wherein A1 and A2 are $SO_2$.

FIG. 6 is an overview of metal amides that can be used according to the invention with specific A1 and A2, wherein A1 and A2 are POR8.

FIG. 7 is an overview of metal amides that can be used according to the invention with specific A1 and A2, wherein A1 and A2 are CO.

FIG. 8 is an overview of metal amides that can be used according to the invention with specific A1 and A2, wherein A1 and A2 are selected different, wherein A1 is $SO_2$ and A2 is POR8.

DETAILED DESCRIPTION

Figure 1:
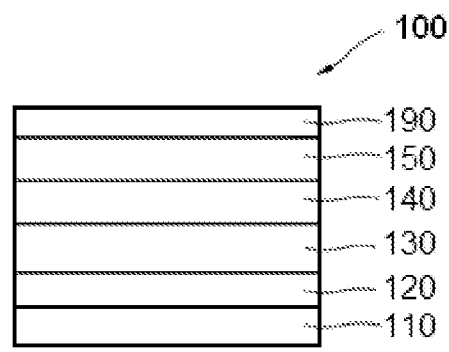
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode (OLED) 100, according to an exemplary embodiment of the present invention. The OLED 100 includes a substrate 110. On the substrate 110 an anode 120 is disposed. On the anode 120 a hole injection layer 130 containing or consisting of a metal amide compound according to the invention is disposed and thereon a hole transport layer 140. Onto the hole transport layer 140 an emission layer 150 and an cathode electrode 190, exactly in this order, are disposed.

Figure 2:
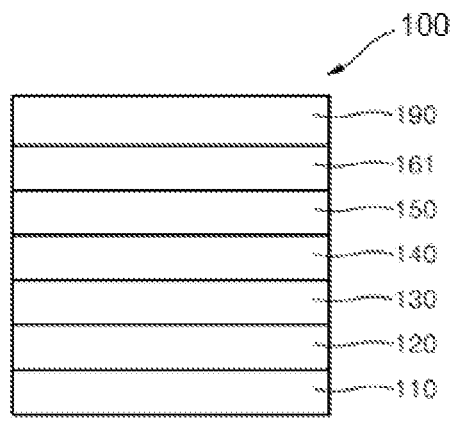
FIG. 2 is a schematic sectional view of an OLED, according to an exemplary embodiment of the present invention.

FIG. 2 is a schematic sectional view of an organic light-emitting diode (OLED) 100, according to an exemplary embodiment of the present invention. The OLED 100 includes a substrate 110, a first electrode 120, a hole injection layer (HIL) 130, a hole transport layer (HTL) 140, an emission layer (EML) 150, an electron transport layer (ETL) 161. The electron transport layer (ETL) 161 is formed directly on the EML 150. Onto the electron transport layer (ETL) 161 a cathode electrode 190 is disposed.

Instead of a single electron transport layer 161, optional an electron transport layer stack (ETL) can be used.

Figure 3:
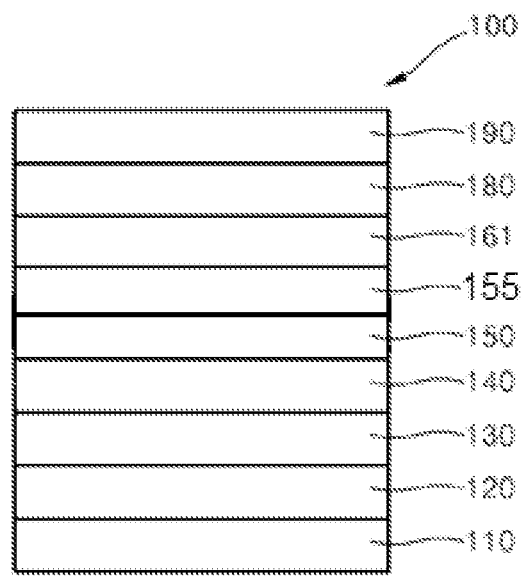
FIG. 3 is a schematic sectional view of an OLED, according to an exemplary embodiment of the present invention.

FIG. 3 is a schematic sectional view of an OLED 100, according to another exemplary embodiment of the present invention. FIG. 3 differs from FIG. 2 in that the OLED 100 of FIG. 3 comprises a hole blocking layer (HBL) 155 and an electron injection layer (ETL) 180.

Referring to FIG. 3 the OLED 100 includes a substrate 110, an anode electrode 120, a hole injection layer (HIL) 130, a hole transport layer (HTL) 140, an emission layer (EML) 150, a hole blocking layer (HBL) 155, an electron transport layer (ETL) 161, an electron injection layer (ETL) 180 and a cathode electrode 190. The layers are disposed exactly in the order as mentioned before.

In the description above the method of manufacture an OLED of the present invention is started with a substrate 110 onto which an anode electrode 120 is formed, on the anode electrode 120, an hole injection layer 130, hole transport layer 140, an emission layer 150, optional a hole blocking layer 155, optional at least one electron transport layer 161, optional at least one electron injection layer 180, and a cathode electrode 190 are formed, exactly in that order or exactly the other way around.

While not shown in FIG. 1, FIG. 2 and FIG. 3, a sealing layer may further be formed on the cathode electrodes 190, in order to seal the OLEDs 100. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

Examples

General Procedure

For bottom emission devices, a 15 $\Omega/cm^2$ glass substrate (available from Corning Co.) with 100 nm ITO was cut to a size of 50 mm×50 mm×0.7 mm, ultrasonically washed with isopropyl alcohol for 5 minutes and then with pure water for 5 minutes, and washed again with UV ozone for 30 minutes, to prepare a first electrode. For top emission devices, the anode electrode was formed from 100 nm silver on glass which was prepared by the same methods as described above.

Then, the hole injection layer according to the examples of Table 6 was vacuum deposited on the ITO electrode, to form a HIL having a thickness according to the examples of table 6. Then the corresponding hole injection layer according to the examples of table 6 was vacuum deposited on the HIL, to form a HTL having a thickness as mentioned in table 6, respectively.

The wt.-% of the HIL-material and HTL can be taken from Tables 6 below, whereby the wt.-% amount of the HIL-material is 100 wt.-% and of the HTL-material is 100 wt.-%, if no not indicated otherwise indicated in Table 6, respectively. That means that the HIL according to examples 1 to 8 consist of the metal amide compound according to the invention. Further the HIL according to examples 1 to 8 consist of one compound only, as mentioned in Table 6. However, the hole injection layer may comprises traces of the compound of the hole transport layer, due to the process of manufacture. For example, the HIL may form islands, in other words not a continuous layer. Therefore, when the HTL is deposited on top, HTL may be deposited in the same plane as the HIL. In reverse engineering, this layer may appear like a mixed layer, even though one compound was deposited after the other.

The comparative example 4 the hole injection layer comprises a mixture of a triarylamine T-3: Li TFSI in a ratio of 98:2 wt.-%.

97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 20 nm.

Then the ETL-layer of matrix compound of 50 wt.-% MX 1 and 50 wt.-% LiQ (50 wt.-%:50 wt.-%) having a thickness of 36 nm is formed by deposing the matrix compound from a first deposition source and the lithium organic complex or lithium halide from a second deposition source directly on the EML.

For the comparative examples 1 to 6 and examples 1 to 8 only one electron transport layer is formed.

The cathode was evaporated at ultra-high vacuum of 10 −7 bar. Therefore, a thermal single co-evaporation of one or several metals was performed with a rate of 0, 1 to 10 nm/s (0.01 to 1 Å/s) in order to generate a homogeneous cathode with a thickness of 5 to 1000 nm. For top emission devices, the cathode electrode was formed from 13 nm magnesium (90 vol.-%)-silver (10 vol.-%) alloy. For bottom emission devices, the cathode electrode was formed from 100 nm aluminum.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured under ambient conditions (20° C.). Current voltage measurements are performed using a Keithley 2400 sourcemeter, and recorded in V. At 10 mA/cm² for bottom emission and 15 mA/cm² for top emission devices, a calibrated spectrometer CAS140 from Instrument Systems is used for measurement of CIE coordinates and brightness in Candela. Lifetime LT of the device is measured at ambient conditions (20° C.) and 15 mA/cm², using a Keithley 2400 sourcemeter, and recorded in hours. The brightness of the device is measured using a calibrated photo diode. The lifetime LT is defined as the time till the brightness of the device is reduced to 97% of its initial value.

In bottom emission devices, the emission is predominately Lambertian and quantified in percent external quantum efficiency (EQE). To determine the efficiency EQE in % the light output of the device is measured using a calibrated photodiode at 10 mA/cm².

In top emission devices, the emission is forward directed, non-Lambertian and also highly dependent on the mircocavity. Therefore, the efficiency EQE will be higher compared to bottom emission devices. To determine the efficiency EQE in % the light output of the device is measured using a calibrated photodiode at 15 mA/cm².

Technical Effect of the Invention

Bottom Emission Devices

Effect of the Metal Cation on Device Performance

In Table 6 are shown device data for bottom emission devices. In comparative example 1, no hole injection layer is used. The voltage is high and rises rapidly during stability test, therefore lifetime has not been determined.

In comparative examples 2 and 3, the compound CNHAT has been used as hole injection layer. Two thicknesses have been tested, 3 nm and 10 nm. At 3 nm, the voltage is high and the device show a large voltage rise during lifetime test due to degradation. At 10 nm of dipyrazino[2,3-f:2',3'-h]quinoxaline-2,3,6,7,10,11-hexacarbonitrile (CNHAT (CAS 105598-27-4)) having the Formula A, which is typically used as hole injection layer, the voltage is reduced to 5.4 V, the EQE is 5%, and the voltage increase during degradation is within the range suitable for commercial applications. A voltage increase of no more than 0.2 V over 50 h at 15 mA/cm² is considered acceptable.

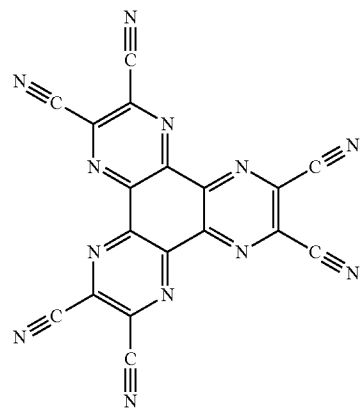

(A)

In comparative example 4, a 10 nm layer of triarylamine T-3, doped with 2 wt.-% Li TFSI is tested. The voltage is lower compared to comparative examples 1 to 3 and the efficiency EQE is comparable. However, the voltage stability is very poor. The voltage increases by 0.56 V after 50 h driving at 15 mA/cm².

In Example 1 to 10, various metal amide compounds have been tested at 3 nm and 10 nm thickness. 3 nm Li TFSI offers the highest EQE at the lowest voltage, see example 1. The voltage is lower compared to comparative example 3, while the EQE is comparable. Similarly low voltages are achieved for 3 nm Mg (TFSI)₂, 3 nm Mn (TFSI)₂, 3 nm Li (cTFSI) and 10 nm Ag TFSI. In general, 3 nm metal amide gives better performance than 10 nm.

Effect of the HOMO Level of the Hole Transport Layer on Device Performance

In order to achieve light output in different colours, a large variety of materials is available for application in the emission layer of OLEDs. Each emission layer composition comes with different demands on the HTL (for example band-gap or triplet level). Therefore, the HTL materials of different OLEDs may differ in their HOMO level. Consequently, a good hole injection layer enables hole injection in to a large variety of HTL materials.

In a second step, triarylamine compounds with various HOMO levels are tested in the hole transport layer. HTLs which show low performance with the fluorescent blue EML used here may show unique performance with a different EML composition, for example phosphorescent blue or green EML, or for TADF (thermally activated delayed fluorescence) emitters. In the following examples, the hole injection performance is evaluated relative to CNHAT which is not suitable for injection into deep HOMO HTLs. For ease of comparison, 3 nm metal amide is used throughout. In the comparative examples, 10 nm CNHAT is used as hole injection layer.

For the shallowest HOMO triarylamine, T-3, 5.1 V and 4.6% EQE are achieved with Mg (TFSI)2 (Example 3). With deeper HOMO amines T-8 and T-9, the voltage remains constant at 5 V, while the efficiency varies between 3.8 and 5.2%. In particular for deeper HOMO triarylamines T-8 and T-9, much lower voltages are achieved with Mg (TFSI)₂ compared to CNHAT, see Examples 9 and 10 and comparative examples 5 and 6. The efficiency EQE remains in an acceptable range, independent of HOMO level of the hole transport layer.

The voltage stability of all examples is at an acceptable level, for example less than 0.35V over 50 hours stability test at 15 mA/cm².

TABLE 6

Efficiency EQE dependency with respect to the variation of HOMO level of the hole transport layer

| | Hole injection layer | Layer thickness d (nm) | HTL matrix compound | V at 15 mA/cm$^2$ (V) | EQE at 15 mA/cm$^2$ (%) | U(50 h)-U(0 h) at 15 mA/cm$^2$ [V] | LT [h] |
|---|---|---|---|---|---|---|---|
| Comparative example 1 | — | 0 | T-3 | 6 | 6 | >4.00 | — |
| Comparative example 3 | CNHAT | 3 | T-3 | 6.5 | 5.2 | 0.57 | — |
| Comparative example 3 | CNHAT | 10 | T-3 | 5.4 | 5 | 0.05 | 320 |
| Comparative example 4 | T-3: Li TFSI (98:2 wt.-%) | 10 | T-3 | 5.2 | 5.1 | 0.56 | — |
| Example 1 | Li TFSI | 3 | T-3 | 5.1 | 5.1 | 0.12 | 84 |
| Example 2 | Li TFSI | 10 | T-3 | >10.0 | — | — | — |
| Example 3 | Mg (TFSI)$_2$ | 3 | T-3 | 5.1 | 4.6 | 0.05 | 480 |
| Example 4 | Mg (TFSI)$_2$ | 10 | T-3 | 5.6 | 4.7 | 0.04 | 470 |
| Example 5 | Ag TFSI | 3 | T-3 | 5 | 4.7 | 0.03 | 149 |
| Example 6 | Ag TFSI | 10 | T-3 | 5.3 | 5.1 | 0.09 | 30 |
| Example 7 | Mn (TFSI)$_2$ | 3 | T-3 | 4.9 | 4.5 | 0.07 | 320 |
| Example 8 | Li (TFSI) | 3 | T-3 | 5.0 | 4.8 | 0.04 | 198 |
| Comparative example 5 | CNHAT | 10 | T-8 | 5.9 | 5.3 | — | — |
| Example 9 | Mg (TFSI)$_2$ | 3 | T-8 | 5 | 4.8 | 0.07 | 190 |
| Comparative example 6 | CNHAT | 10 | T-9 | 8.7 | 5.9 | — | — |
| Example 10 | Mg (TFSI)$_2$ | 3 | T-9 | 4.9 | 5.2 | 0.15 | — |

Another aspect is directed to an organic light-emitting diode (OLED) comprising more than one emission layer (EML) 150, for example two, three or four emission layers may be present. An organic light-emitting diode (OLED) comprising more than one emission layer is also described as a tandem OLED or stacked OLED.

Another aspect is directed to a device comprising at least one organic light-emitting diode (OLED). A device comprising organic light-emitting diodes (OLED) is for example a display or a lighting panel.

From the foregoing detailed description and examples, it will be evident that modifications and variations can be made to the compositions and methods of the invention without departing from the spirit and scope of the invention. Therefore, it is intended that all modifications made to the invention without departing from the spirit and scope of the invention come within the scope of the appended claims.

The invention claimed is:

1. An OLED comprising:
an anode, a hole injection layer, and a hole transport layer, wherein the hole injection layer is in direct contact with the anode and the hole transport layer is in direct contact with the hole injection layer; and the hole injection layer has a composition that is different than a composition of the hole transport layer, wherein the hole injection layer comprises a charge neutral metal amide compound, wherein the charge neutral metal amide compound has the Formula Ia:

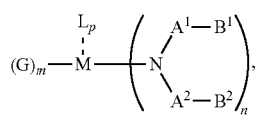

(Ia)

wherein:

G=halide, O, alkoxylate or amine of Formula IIa to IIe:

(IIa)

(IIb)

(IIc)

(IId)

(IIe)

$R^1$ to $R^5$ are independently selected from the group consisting of H, $C_1$ to $C_{20}$ alkyl, $C_1$ to $C_{20}$ heteroalkyl, unsubstituted or $C_1$ to $C_{12}$ substituted $C_6$ to $C_{20}$ aryl, unsubstituted or $C_1$ to $C_{12}$ substituted heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, and halogenated or perhalogenated heteroaryl with 5 to 20 ring-forming atoms; or at least one $R^1$ and $R^4$ and/or $R^2$ and $R^3$ and/or $R^1$ and $R^5$ are bridged and form a 5 to 20 member ring;

m=0, 1, 2, 3 or 4;

M=a metal selected from the group consisting of alkali metal, alkaline earth metal, Al, Ga, In, Sn(II), Sn(IV), Pb(II), transition metal, and rare earth metal;

wherein the bond between N and the metal M is a covalent bond or N forms a non-covalent interaction to the metal M;

L=charge neutral ligand which coordinates to the metal M, selected from the group consisting of $H_2O$, $C_2$ to $C_{40}$ mono- or multi-dentate ethers and $C_2$ to $C_{40}$ thioethers, $C_2$ to $C_{40}$ amines, $C_2$ to $C_{40}$ phosphine, $C_2$ to $C_{20}$ alkyl nitrile or $C_2$ to $C_{40}$ aryl nitrile, and a compound according to Formula (III);

(III)

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline;

p=0, 1, 2 or 3;

$A^1$, $A^2$, $A^3$ and $A^4$ are independently selected from CO, $SO_2$ or $POR^8$;

$R^8$=electron withdrawing group selected from the group consisting of halide, nitrile, halogenated or perhalogenated $C_1$ to $C_{20}$ alkyl, halogenated or perhalogenated $C_6$ to $C_{20}$ aryl, and halogenated or perhalogenated heteroaryl with 5 to 20 ring-forming atoms;

n=1, 2, 3, 4 or 5;

$B^1$, $B^2$, $B^3$ and $B^4$ are same or independently selected from substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, substituted or unsubstituted $C_5$ to $C_{20}$ heteroaryl, or $B^1$ and $B^2$ are bridged;

wherein $B^1$ and $B^2$ are bridged, then:

M, N, $A^1$, $B^1$, $B^2$, $A^2$ and N form a 7 to 10 member ring according to Formula Ib;

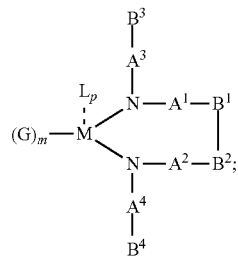

(Ib)

or

N, $A^1$, $B^1$, $B^2$ and $A^2$ form a 5 to 10 member ring according to Formula Ic,

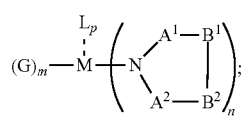

(Ic)

or

N, $A^1$, $B^1$, $B^2$ and $A^2$ form a first 5 to 10 member ring and $B^1$ and $B^2$ form a second 5 to 20 member ring according to Formula Id:

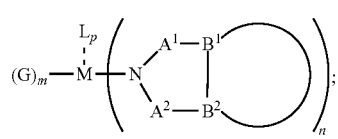

(Id)

and optionally the hole transport layer further comprises a triarylamine compound having the Formula VIIa:

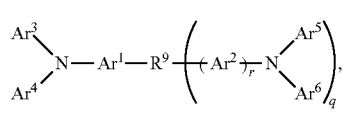

(VIIa)

wherein:

$Ar^1$ and $Ar^2$=independently selected from substituted or unsubstituted $C_6$ to $C_{20}$ arylene;

$Ar^3$ and $Ar^4$=independently selected from substituted or unsubstituted $C_6$ to $C_{20}$ aryl;

$Ar^3$ and $Ar^4$=independently selected from substituted or unsubstituted $C_6$ to $C_{20}$ aryl or $C_5$ to $C_{40}$ heteroaryl;

$R^9$=a single chemical bond, an unsubstituted or substituted $C_1$ to $C_6$ alkyl and unsubstituted or substituted $C_1$ to $C_5$ heteroalkyl;

q=0, 1 or 2;

r=0 or 1;

wherein the substituents for $Ar^1$ to $Ar^6$ are independently selected from $C_1$ to $C_{20}$ alkyl, $C_1$ to $C_{20}$ heteroalkyl, or halide; and the substitutents for $R^9$ are independently selected from $C_1$ to $C_6$ alkyl, $C_1$ to $C_5$ heteroalkyl, $C_6$ to $C_{20}$ aryl and $C_5$ to $C_{20}$ heteroaryl.

2. The OLED according to claim 1, wherein the charge neutral metal amide compound has the Formula Ia,

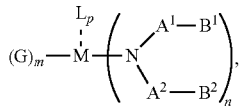
(Ia)

wherein:
$A^1$ and $A^2$ are the same or independently selected from CO, POR$^8$, or SO$_2$; or
$A^1$ and $A^2$ are independently selected from CO, POR$^8$, or SO$_2$, and
N, $A^1$, $B^1$, $A^2$ and $B^2$ form a 5 to 10 member ring.

3. The OLED according to claim 1,
wherein for:
p=0, m=1, 2, 3 or 4 and n=1, 2, 3 or 4, the charge neutral metal amide compound has the Formula IIa:

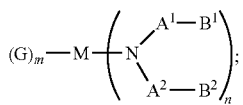
(IIa)

or
p=1, 2 or 3, and n=1, 2, 3 or 4 and m=0, the charge neutral metal amide compound has the Formula IIb:

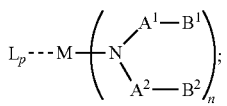
(IIb)

or
p=1, 2 or 3, n=1, 2, 3 or 4, m=1, 2, 3 or 4 and N, $A^1$, $B^1$, $B^2$ and $A^2$ form a 5 to 10 member ring, the charge neutral metal amide compound has the Formula IIc:

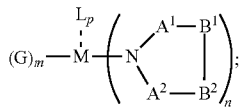
(IIc)

or
p=1, 2 or 3, n=1, 2, 3 or 4, m=1, 2, 3 or 4 and N, $A^1$, $B^1$, $B^2$ and $A^2$ form a first 5 to 10 member ring and $B^1$ and $B^2$ are bridged to form a second 5 to 20 member ring, the charge neutral metal amide compound has the Formula IId:

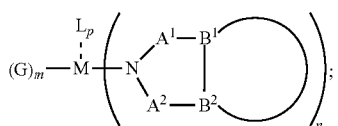
(IId)

or
p=1, 2 or 3, n=2, m=1, 2, 3 or 4, and M, N, $A^1$, $B^1$, $B^2$, $A^2$ and N form a 7 to 10 member ring, the charge neutral metal amide compound has the Formula IIe:

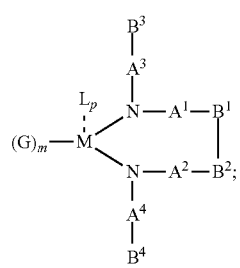
(IIe)

or
p=1, 2 or 3, n=1, 2, 3 or 4, m=0 and N, $A^1$, $B^1$, $B^2$ and $A^2$ form a 5 to 10 member ring, the charge neutral metal amide compound has the Formula IIf:

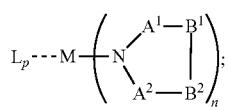
(IIf)

p=1, 2 or 3, n=1, 2, 3 or 4, m=0 and N, $A^1$, $B^1$, $B^2$ and $A^2$ form a first 5 to 10 member ring, and $B^1$ and $B^2$ are bridged to form a second 5 to 20 member ring, the charge neutral metal amide compound has the Formula IIg:

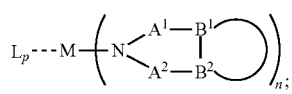
(IIg)

p=1, 2 or 3, n=2, m=0 and M, N, $A^1$, $B^1$, $B^2$, $A^2$ and N form a 7 to 10 member ring, the charge neutral metal amide compound has the Formula IIh:

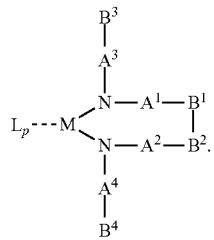
(IIh)

4. The OLED according to claim 1,
wherein for $A^1$ and $A^2$ are SO$_2$:
p=1, 2 or 3, n=1, 2, 3 or 4, m=1, 2, 3 or 4, the charge neutral metal amide compound has the Formula IIIa:

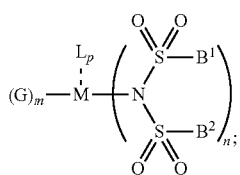
(IIIa)

or p=0, n=1, 2, 3 or 4, m=1, 2, 3 or 4, the charge neutral metal amide compound has the Formula IIIb:

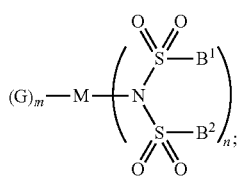
(IIIb)

or p=1, 2 or 3, n=1, 2, 3 or 4, m=0, the charge neutral metal amide compound has the Formula IIIc:

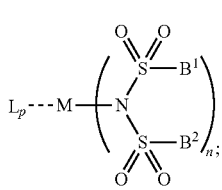
(IIIc)

or p=1, 2 or 3, n=1, 2, 3 or 4, m=1, 2, 3 or 4 and N, $SO_2$, $B^1$, $B^2$ and $SO_2$ form a 5 to 10 member ring, the charge neutral metal amide compound has the Formula IIId:

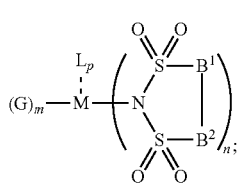
(IIId)

or p=1, 2 or 3, n=1, 2, 3 or 4, m=1, 2, 3 or 4 and N, $SO_2$, $B^1$, $B^2$ and $SO_2$ form a first 5 to 10 member ring, and $B^1$ and $B^2$ are bridged to form a second 5 to 20 member ring, the charge neutral metal amide compound has the Formula IIIe:

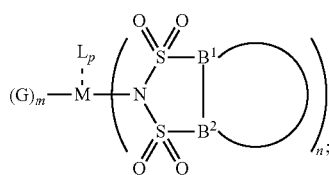
(IIIe)

or p=1, 2 or 3, n=2, m=1, 2, 3 or 4 and M, N, $SO_2$, $B^1$, $B^2$, $SO_2$ and N form a 7 to 10 member ring, the charge neutral metal amide compound has the Formula IIIf:

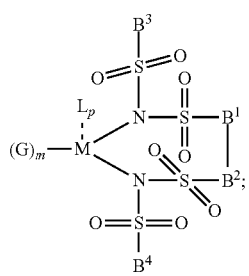
(IIIf)

or p=1, 2 or 3, n=1, 2, 3 or 4, m=0 and N, $SO_2$, $B^1$, $B^2$ and $SO_2$ form a 5 to 10 member ring, the charge neutral metal amide compound has the Formula IIIg:

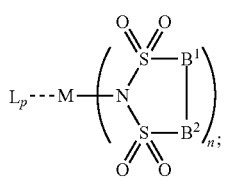
(IIIg)

or p=1, 2 or 3, n=1, 2, 3 or 4, m=0 and N, $SO_2$, $B^1$, $B^2$ and $SO_2$ form a first 5 to 10 member ring, and $B^1$ and $B^2$ are bridged to form a second 5 to 20 member ring, the charge neutral metal amide compound has the Formula IIIh:

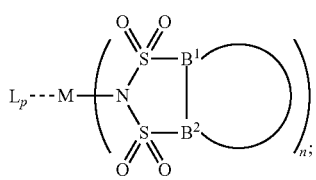
(IIIh)

or p=1, 2 or 3, n=2, m=0 and M, N, $SO_2$, $B^1$, $B^2$, $SO_2$ and N form a 7 to 10 member ring, the charge neutral metal amide compound has the Formula IIIi:

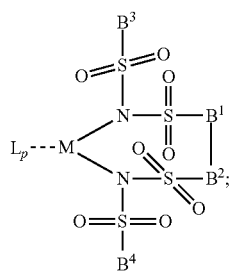
(IIIi)

wherein for $A^1$ and $A^2$ are $POR^8$;

p=1, 2 or 3, m=1, 2, 3 or 4 and n=1, 2, 3 or 4, the charge neutral metal amide compound has the Formula IVa:

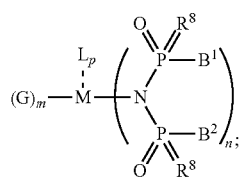
(IVa)

or p=0, m=1, 2, 3 or 4 and n=1, 2, 3 or 4, the charge neutral metal amide compound has the Formula IVb:

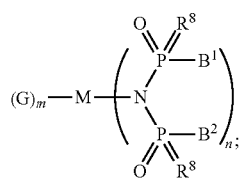
(IVb)

or p=1, 2 or 3, m=0 and n=1, 2, 3 or 4, the charge neutral metal amide compound has the Formula IVc:

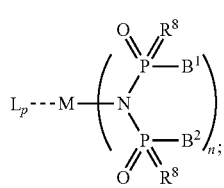
(IVc)

or p=1, 2 or 3, n=1, 2, 3 or 4, m=1, 2, 3 or 4 and N, $POR^8$, $B^1$, $B^2$ and $POR^8$ form a 5 to 10 member ring, the charge neutral metal amide compound has the Formula (IVd):

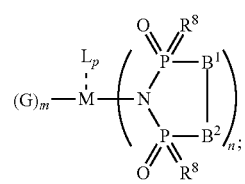
(IVd)

or p=1, 2 or 3, n=1, 2, 3 or 4, m=0 and N, $POR^8$, $B^1$, $B^2$ and $POR^8$ form a 5 to 10 member ring, the charge neutral metal amide compound has the Formula (IVe):

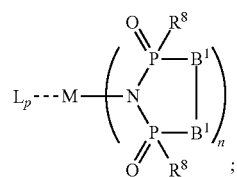
(IVe)

or wherein for $A^1$ and $A^2$ are CO:

p=1, 2 or 3, m=1, 2, 3 or 4 and n=1, 2, 3 or 4, the charge neutral metal amide compound has the Formula Va:

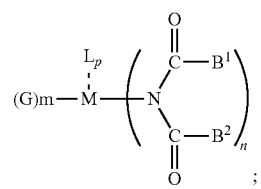
(Va)

or p=0, n=1, 2, 3 or 4, m=1, 2, 3 or 4, the charge neutral metal amide compound has the Formula Vb:

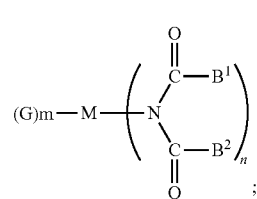
(Vb)

or p=1, 2 or 3, n=1, 2, 3 or 4, m=0, the charge neutral metal amide compound has the Formula Vc:

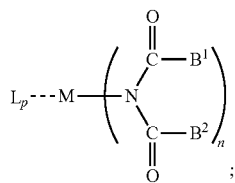

(Vc)

or p=1, 2 or 3, n=1, 2, 3 or 4, m=1, 2, 3 or 4 and N, CO, $B^1$, $B^2$ and CO form a 5 to 10 member ring, the charge neutral metal amide compound has the Formula Vd:

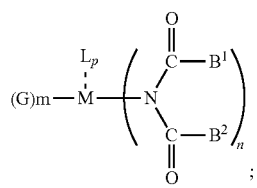

(Vd)

or p=1, 2 or 3, n=1, 2, 3 or 4, m=1, 2, 3 or 4 and N, CO, $B^1$, $B^2$ and CO form a first 5 to 10 member ring, and Bl and $B^2$ are bridged to form a second 5 to 20 member ring, the charge neutral metal amide compound has the Formula Ve:

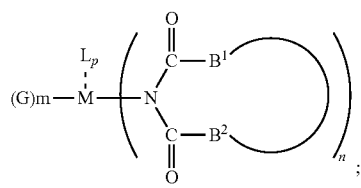

(Ve)

or p=1, 2 or 3, n=2, m=1, 2, 3 or 4 and M, N, CO, $B^1$, $B^2$, CO and N form a 7 to 10 member ring, the charge neutral metal amide compound has the Formula Vf:

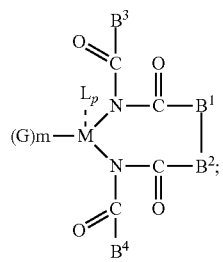

(Vf)

or p=1, 2 or 3, n=1, 2, 3 or 4, m=0 and N, CO, $B^1$, $B^2$ and CO form a 5 to 10 member ring, the charge neutral metal amide compound has the Formula (Vg):

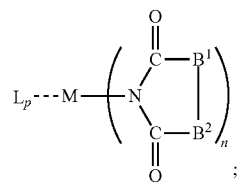

(Vg)

or p=1, 2 or 3, n=1, 2, 3 or 4, m=0 and N, CO, $B^1$, $B^2$ and CO form a first 5 to 10 member ring, and $B^1$ and $B^2$ form a second 5 to 20 member ring, the charge neutral metal amide compound has the Formula Vh:

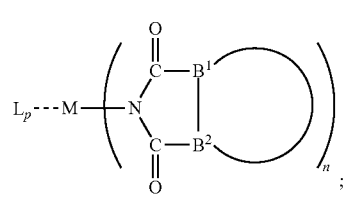

(Vh)

or p=1, 2 or 3, n=2, m=0 and M, N, CO, $B^1$, $B^2$, CO and N form a 7 to 10 member ring, the charge neutral metal amide compound has the Formula (Vi):

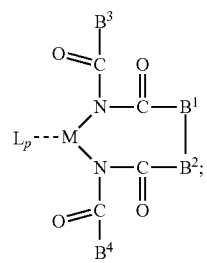

(Vi)

or wherein for $A^1$ is $SO_2$ and $A^2$ is $POR^8$:

p=1, 2 or 3, m=1, 2, 3 or 4 and n=1, 2, 3 or 4, the charge neutral metal amide compound has the Formula VIa:

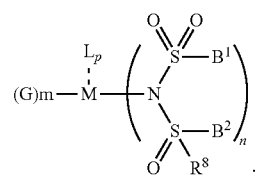

(VIa)

5. The OLED according to claim 1, wherein
$B^1$, $B^2$, $B^3$ and $B^4$ are independently selected from a substituted $C_1$ to $C_{20}$ alkyl, substituted $C_1$ to $C_{20}$ heteroalkyl, substituted $C_6$ to $C_{20}$ aryl, or substituted $C_5$ to $C_{20}$ heteroaryl;
wherein
the substituent is an electron withdrawing group selected from the group consisting of a halide, nitrile, perhalogenated $C_1$ to $C_{20}$ alkyl, perhalogenated $C_6$ to $C_{20}$ aryl, and perhalogenated heteroaryl with 6 to 20 ring-forming atoms.

6. The OLED according to claim 1, wherein m=0, 1 or 2.

7. The OLED according to claim 1, wherein M is selected from Li(I), Na(I), K(I), Cs(I), Mg(II), Ca(II), Sr(II), Ba(II), Sc(III), Y(III), Ti(IV), V(III-V), Cr(III-VI), Mn(II), Mn(III), Fe(II), Fe(III), Co(II), Co(III), Ni(II), Cu(I), Cu(II), Zn(II), Ag(I), Au(I), Au(III), Al(III), Ga(III), In(III), Sn(II), Sn(IV), or Pb(II).

8. The OLED according to claim 1, wherein the charge neutral metal amide compound has the Formula Ib:

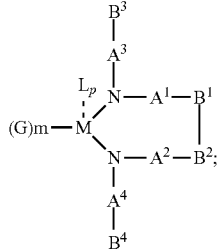
(Ib)

wherein
$A^3$ and $A^4$ are same or independently selected from CO, $POR^8$, or $SO_2$;
$B^3$ and $B^4$ are independently selected from substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, or substituted or unsubstituted $C_6$ to $C_{20}$ heteroaryl; and
M, N, $A^1$, $B^1$, $A^2$ and $B^2$ form a 7 to 10 member ring.

9. The OLED according to claim 1, wherein N, $A^1$, $B^1$, $A^2$ and $B^2$ form a first 5 to 10 member ring and $B^1$ and $B^2$ according to Formula Id:

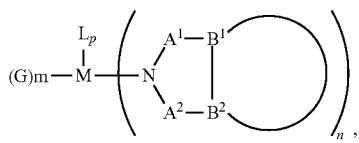
(Id)

are bridged to form a second ring of a substituted or unsubstituted $C_6$ to $C_{20}$ aryl, or of a substituted or unsubstituted $C_6$ to $C_{20}$ heteroaryl ring.

10. The OLED according to claim 1, wherein the charge neutral metal amide compound is selected from at least one of the fluorinated compounds according to Formula C1 to C25:
wherein
Formula C1 to C16, wherein p=0, m=0, n=1, 2, 3 or 4 and $A^1$ and $A^2$ are $SO_2$:

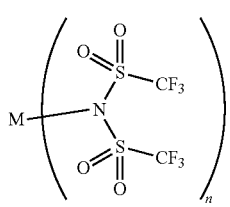
(C1)

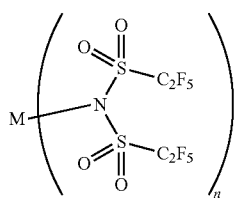
(C2)

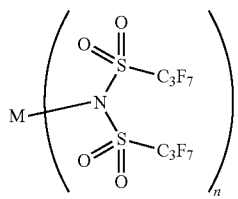
(C3)

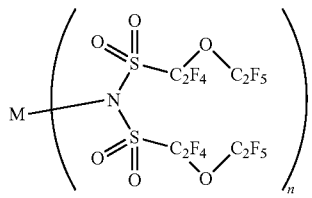
(C5)

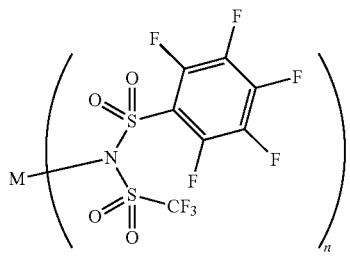
(C6)

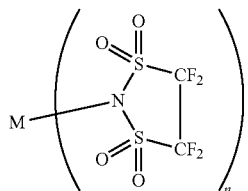
(C7)

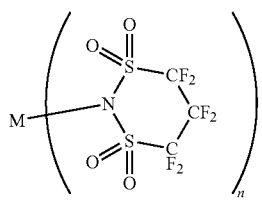
(C8)

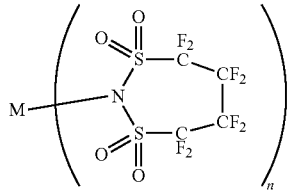
(C9)

-continued
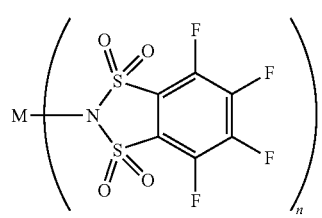
(C10)
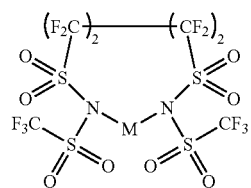
(C11)
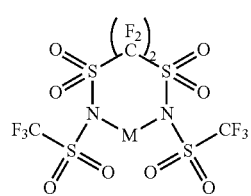
(C12)
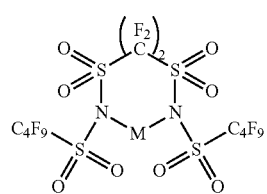
(C13)
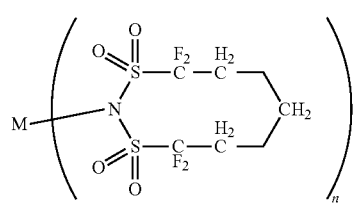
(C14)
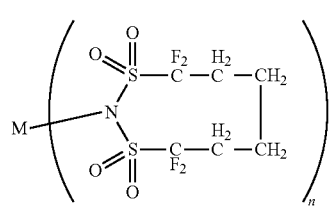
(15)
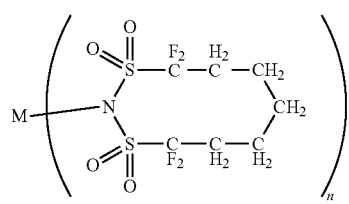
(C16)
Formula C17 to C23, wherein n=1, 2, 3 or 4, $A^1$ and $A^2$ are CO:
(C17)
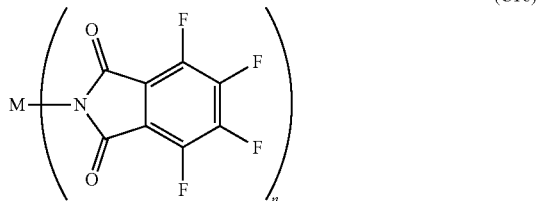
(C18)
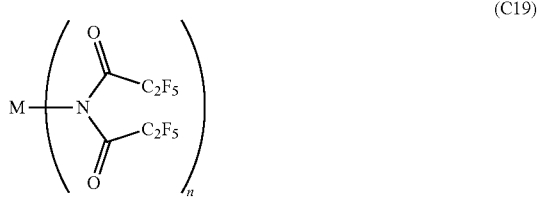
(C19)
(C20)
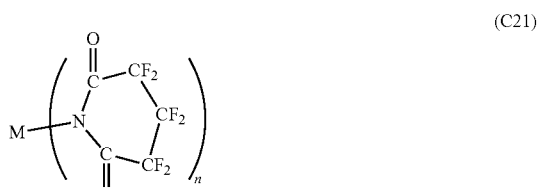
(C21)
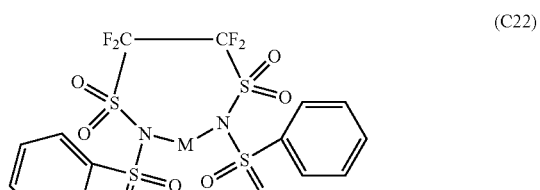
(C22)
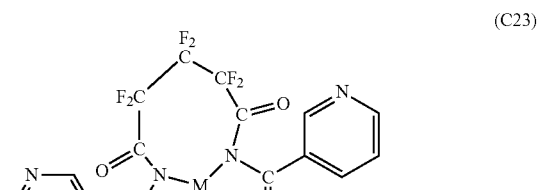
(C23)

Formula C24 to C25, wherein n=1, 2, 3 or 4, $A^1$ and $A^2$ are $POR^8$:
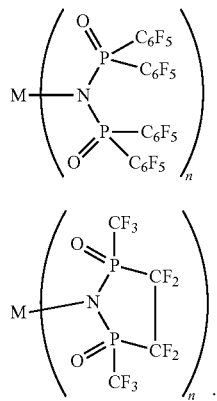
(C24)
(C25)
11. The OLED according to claim 1, wherein the charge neutral metal amide compound is selected from at least one fluorinated compound according to Formula D1 to D24:
wherein p=0, m=0, n=1, 2, 3 or 4 and $A^1$ and $A^2$ are $SO_2$:
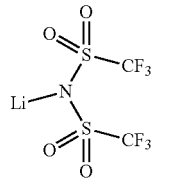
(D1)
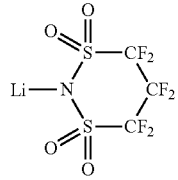
(D2)
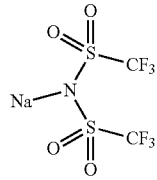
(D3)
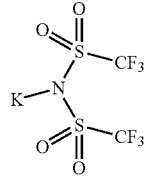
(D4)
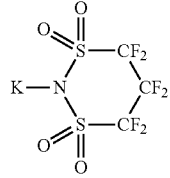
(D5)
-continued
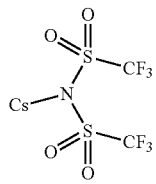
(D6)
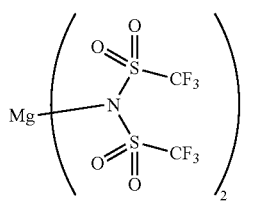
(D7)
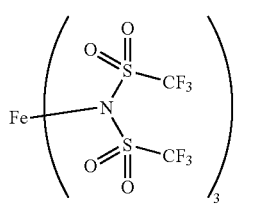
(D8)
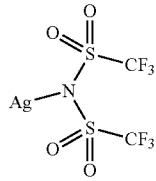
(D9)
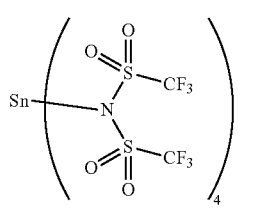
(D10)
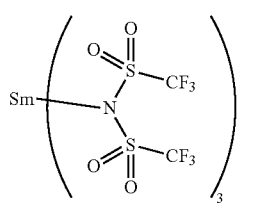
(D11)
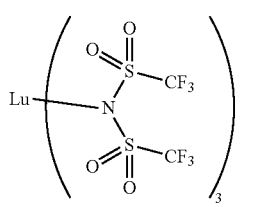
(D12)
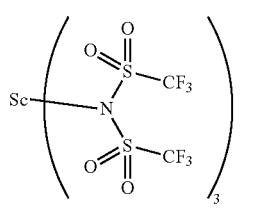
(D13)

(D14) 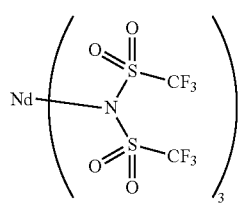
(D15) 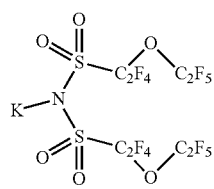
(D16) 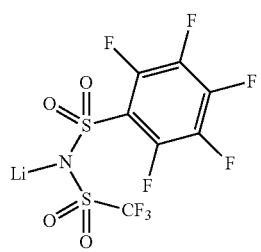
(D17) 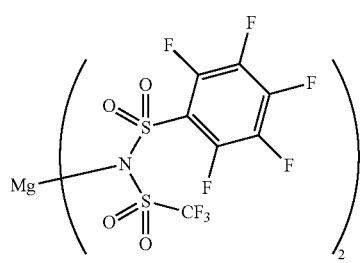
(D18) 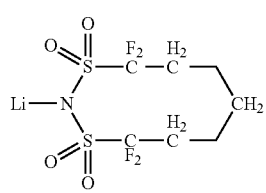
(D19) 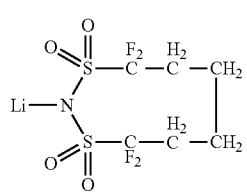
(D20) 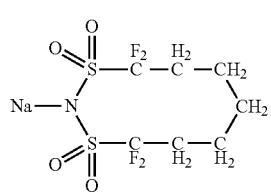
(D21) 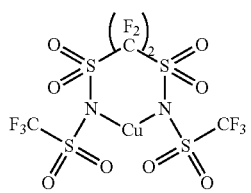
(D22) 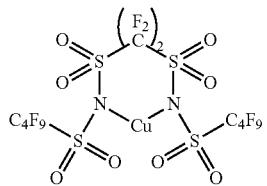
(D23) 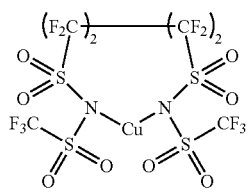
(D24) 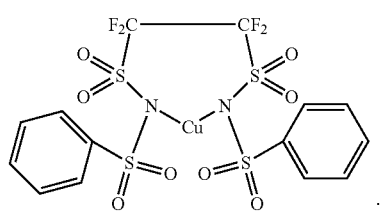
12. The OLED according to claim 1, wherein the charge neutral metal amide compound is selected from at least one fluorinated compound according to Formula F1 to F23:
wherein the charge neutral ligand L coordinates to the metal M:
(F1) 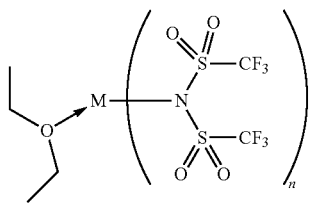
(F2) 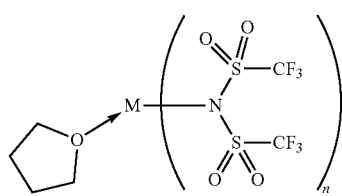
(F3) 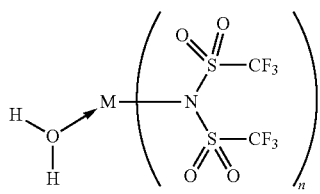

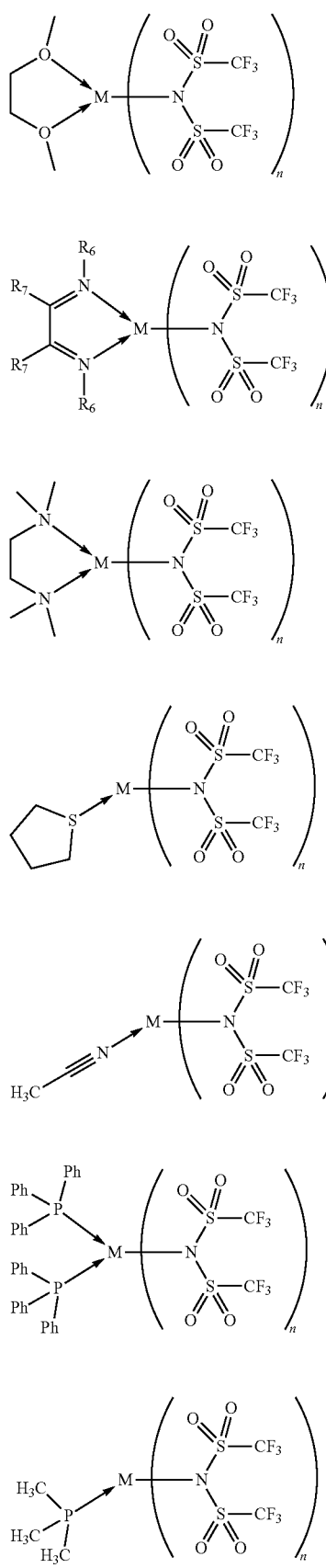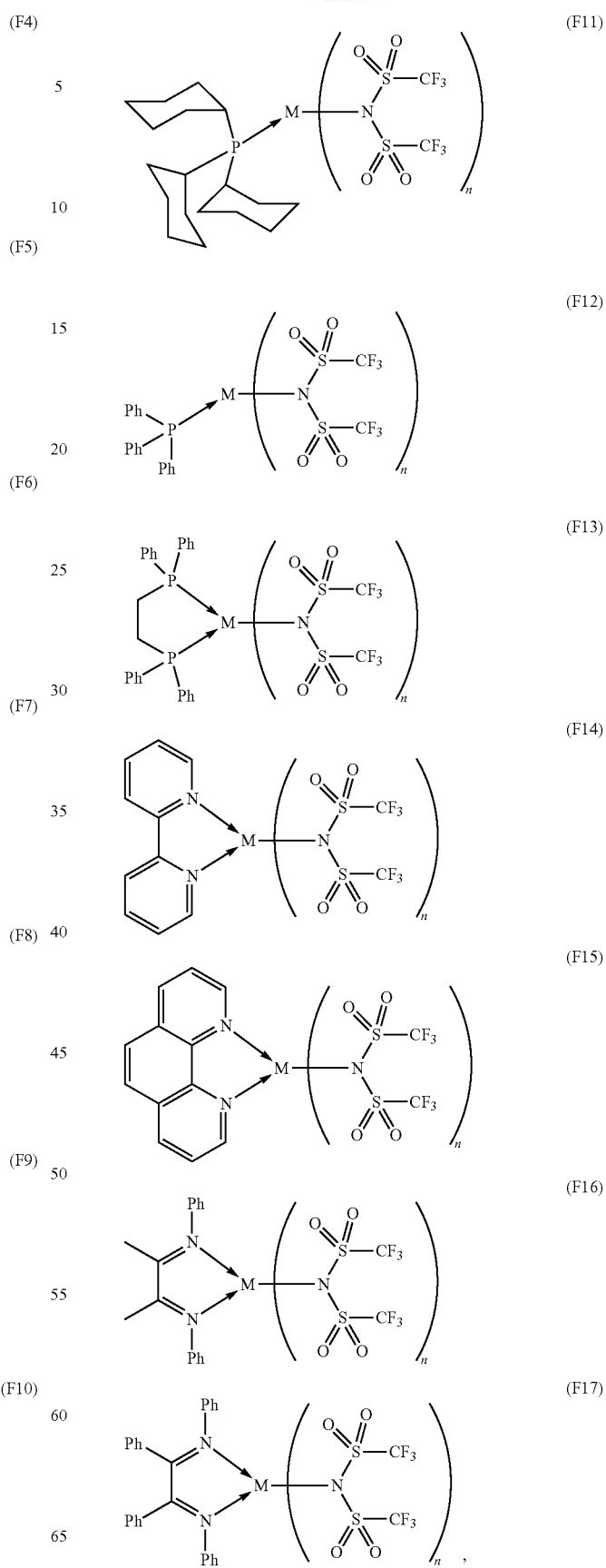

-continued

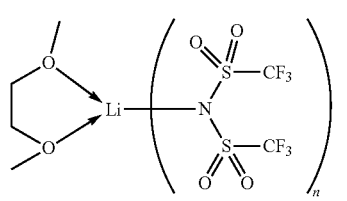 (F18)

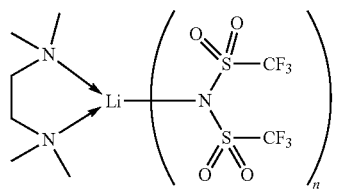 (F19)

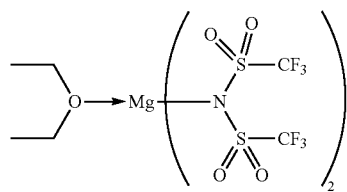 (F20)

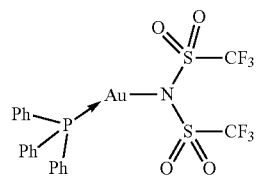 (F21)

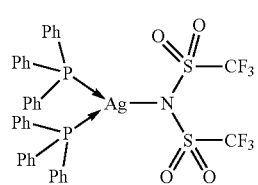 (F22)

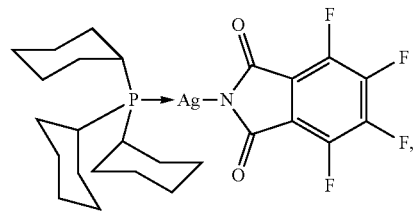 (F23)

wherein
$R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline.

13. The OLED according to claim 1, wherein the charge neutral metal amide compound is selected from at least one fluorinated compound according to Formula F24 to F46:
wherein a halide, O, alkoxylate or amine bonds to the metal M:

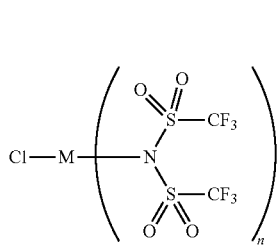 (F24)

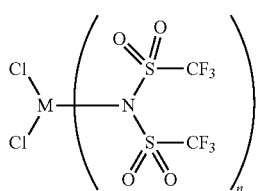 (F25)

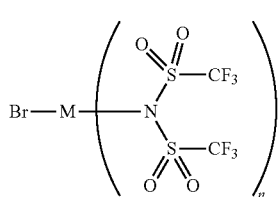 (F26)

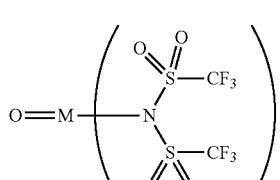 (F27)

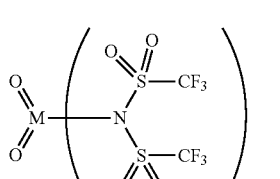 (F28)

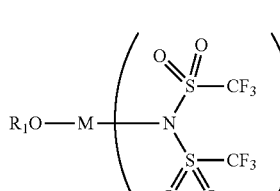 (F29)

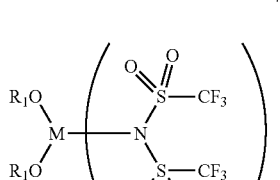 (F30)

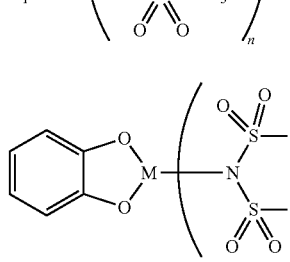 (F31)

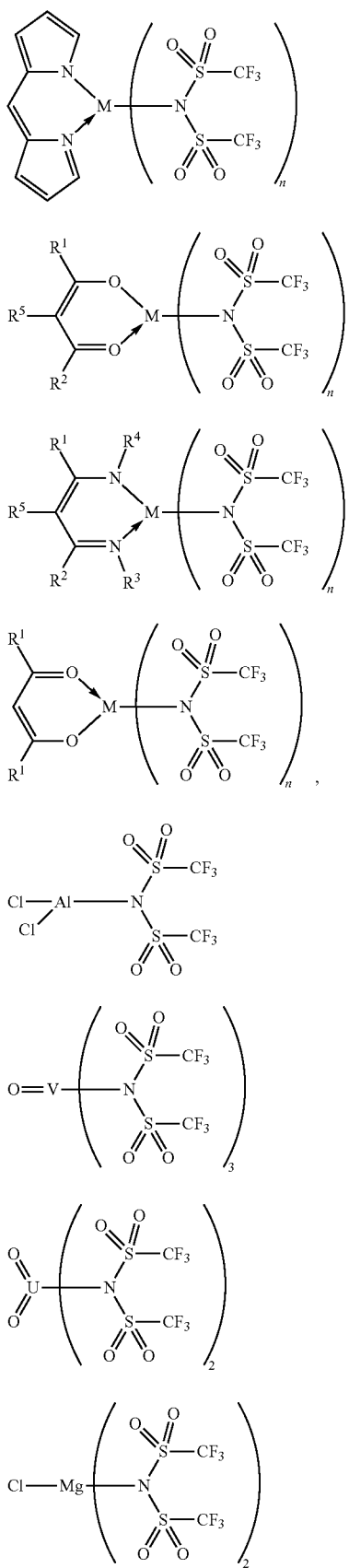
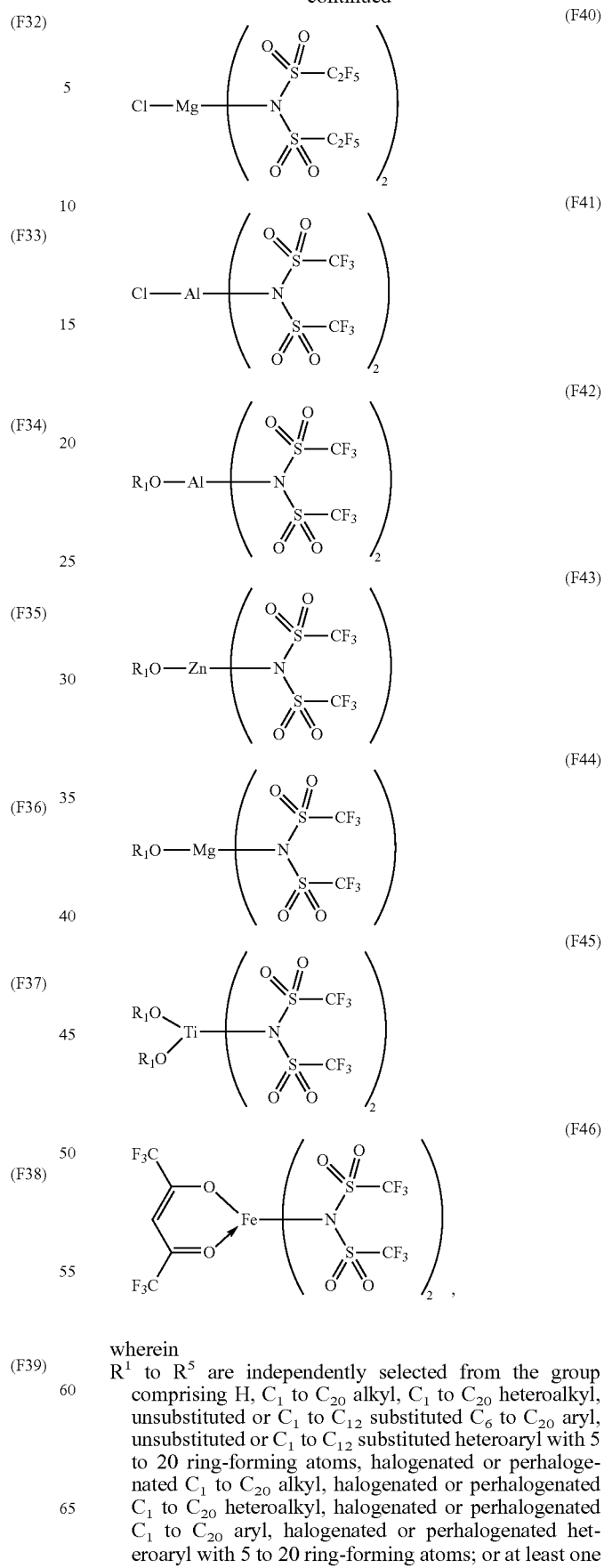

wherein
R$^1$ to R$^5$ are independently selected from the group comprising H, C$_1$ to C$_{20}$ alkyl, C$_1$ to C$_{20}$ heteroalkyl, unsubstituted or C$_1$ to C$_{12}$ substituted C$_6$ to C$_{20}$ aryl, unsubstituted or C$_1$ to C$_{12}$ substituted heteroaryl with 5 to 20 ring-forming atoms, halogenated or perhalogenated C$_1$ to C$_{20}$ alkyl, halogenated or perhalogenated C$_1$ to C$_{20}$ heteroalkyl, halogenated or perhalogenated C$_1$ to C$_{20}$ aryl, halogenated or perhalogenated heteroaryl with 5 to 20 ring-forming atoms; or at least one $R^1$ and $R^4$ or $R^2$ and $R^3$ and/or $R^1$ and $R^5$ are bridged and form a 5 to 20 member cyclic ring.

14. The OLED according to claim 1, wherein the $Ar^1$ and $Ar^2$ of Formula VIIa are independently selected from phenylene, biphenylene, naphthylene, anthranylene, carbazolylene, or fluorenylene.

15. The OLED according to claim 14, wherein the $Ar^1$ and $Ar^2$ of Formula VIIa are independently selected from phenylene or biphenylene.

16. The OLED according claim 1, wherein the $Ar^3$ to $Ar^6$ of Formula VIIa are independently selected from phenyl, biphenyl, terphenyl, quartphenyl, fluorenyl, napthyl, anthranyl, phenanthryl, thiophenyl, fluorenyl, or carbazolyl.

17. The OLED according to claim 1, wherein the hole transport layer comprises a triarylamine compound of Formula VIIa, wherein $Ar^1$ and $Ar^2$ are independently selected from phenyl or biphenyl; $Ar^3$ to $Ar^6$ are selected from phenyl, tolyl, xylyl, mesityl, biphenyl, 1-naphthyl, 2-napthyl, 2-(9,9-dialkyl-fluorenyl), 2-(9-alkyl-9'-aryl-fluorenyl) or 2-(9,9-diaryl-fluorenyl); $R^9$=single bond; r=1 and q=1.

18. The OLED according to claim 1, wherein the hole transport layer comprises a triarylamine compound of Formula VIIa, wherein $Ar^1$ is phenyl; $Ar^3$ to $Ar^6$ are selected from phenyl, tolyl, xylyl, mesityl, biphenyl, 1-naphthyl, 2-napthyl, 2-(9,9-dialkyl-fluorenyl), 2-(9-alkyl-9'-aryl-fluorenyl) or 2-(9,9-diaryl-fluorenyl); $R^9$=single bond; r=0 and q=1.

19. The OLED according to claim 1, wherein the hole transport layer comprises a triarylamine compound of Formula VIIa, wherein N, $Ar^1$ and $Ar^3$ form a carbazole ring; $Ar^2$ is phenyl or biphenyl; $Ar^3$ to $Ar^6$ are selected from phenyl, tolyl, xylyl, mesityl, biphenyl, 1-naphthyl, 2-napthyl, 2-(9,9-dialkyl-fluorenyl), 2-(9-alkyl-9'-aryl-fluorenyl) or 2-(9,9-diaryl-fluorenyl); $R^9$=single bond; r=1 and q=1.

20. The OLED according to claim 18, wherein a substituent on $Ar^1$ is selected from phenyl, biphenyl, 2-(9,9-dialkyl-fluorenyl), 2-(9-alkyl-9'-aryl-fluorenyl) and 2-(9,9-diaryl-fluorenyl).

* * * * *